(12) United States Patent
Suzuri et al.

(10) Patent No.: US 7,485,376 B2
(45) Date of Patent: Feb. 3, 2009

(54) ORGANIC ELECTROLUMINESCENT ELEMENT, ILLUMINATOR, AND DISPLAY

(75) Inventors: Yoshiyuki Suzuri, Musashino (JP); Hiroshi Kita, Hachioji (JP); Tomohiro Oshiyama, Hachioji (JP); Mitsuhiro Fukuda, Chofu (JP); Noriko Ueda, Hino (JP)

(73) Assignee: Konica Minolta Holdings, Inc. (JP)

( * ) Notice: Subject to any disclaimer, the term of this patent is extended or adjusted under 35 U.S.C. 154(b) by 687 days.

(21) Appl. No.: 10/804,788

(22) Filed: Mar. 19, 2004

(65) Prior Publication Data
US 2004/0189190 A1 Sep. 30, 2004

(30) Foreign Application Priority Data
Mar. 26, 2003 (JP) .............................. 2003-085023

(51) Int. Cl.
*H01L 51/50* (2006.01)
(52) U.S. Cl. ...................... 428/690; 428/917; 313/504; 313/506
(58) Field of Classification Search ................ 428/690, 428/917; 313/504, 506
See application file for complete search history.

(56) References Cited

U.S. PATENT DOCUMENTS

| | | | | |
|---|---|---|---|---|
| 5,891,587 A * | 4/1999 | Hu et al. ...................... 428/690 |
| 6,608,748 B1 * | 8/2003 | Ogo et al. .................... 361/681 |
| 6,855,438 B2 * | 2/2005 | Oshiyama et al. ........... 428/690 |
| 6,949,878 B2 * | 9/2005 | Suzuri et al. ................. 313/503 |
| 7,128,982 B2 * | 10/2006 | Oshiyama et al. ........... 428/690 |
| 2001/0053462 A1 * | 12/2001 | Mishima ...................... 428/690 |
| 2002/0094452 A1 * | 7/2002 | Ueda et al. ................... 428/690 |
| 2003/0205696 A1 * | 11/2003 | Thoms et al. .......... 252/301.16 |
| 2004/0005404 A1 * | 1/2004 | Suzuri et al. .................. 427/66 |

FOREIGN PATENT DOCUMENTS

| | | | |
|---|---|---|---|
| EP | 1215945 | | 6/2002 |
| EP | 1267428 A2 | * | 12/2002 |
| EP | 1371709 | * | 12/2003 |
| JP | 2000247932 A | * | 9/2000 |
| JP | 2001316338 A | * | 11/2001 |
| JP | 2002329577 A | * | 11/2002 |
| JP | 2003-317946 A | * | 11/2003 |
| JP | 2004-014335 A | * | 1/2004 |

OTHER PUBLICATIONS

European Search Report for European Patent Application No. 04006649.0-1218 dated May 23, 2008.

* cited by examiner

*Primary Examiner*—Dawn Garrett
(74) *Attorney, Agent, or Firm*—Cantor Colburn LLP

(57) ABSTRACT

Disclosed are an organic electroluminescent element comprising a light emission layer containing a phosphorescent compound and a hole transporting layer adjacent thereto containing a hole transporting material, wherein the hole transporting material has a 0-0 band of the phosphorescence spectra of from 300 to 450 nm and has a molecular weight of not less than 550, and an illuminator and a display each comprising the organic electroluminescent element.

48 Claims, 3 Drawing Sheets

ORGANIC ELECTROLUMINESCENT ELEMENT, ILLUMINATOR, AND DISPLAY

FIELD OF THE INVENTION

This invention relates to an organic electro-luminescent element, illuminator and a display, and particularly to an organic electroluminescent element with high emission luminance, high emission efficiency and high durability, an illuminator, and a display comprising them.

BACKGROUND OF THE INVENTION

As an emission type electronic displaying device, there is an electroluminescence device (ELD). As elements constituting the ELD, there is an inorganic electroluminescent element or an organic electroluminescent element (hereinafter referred to also as organic EL element).

The inorganic electroluminescent element has been used for a plane-shaped light source, but a high voltage alternating current has been required to drive the element.

An organic EL element has a structure in which a light emission layer containing a light emission compound is arranged between a cathode and an anode, and an electron and a hole were injected into the light emission layer and recombined to form an exciton. The element emits light, utilizing light (fluorescent light or phosphorescent light) generated by inactivation of the exciton, and the element can emit light by applying a relatively low voltage of from several volts to several decade volts. The element has a wide viewing angle and a high visuality since the element is of self light emission type. Further, the element is a thin, complete solid element, and therefore, the element is noted from the viewpoint of space saving and portability.

An organic EL element for practical use is required which efficiently emits light with high luminance at a lower power. For example, there are disclosed an element with long lifetime emitting light with high luminance in which stilbene derivatives, distyrylarylene derivatives or tristyrylarylene derivatives are doped with a slight amount of a fluorescent compound (see for example, Japanese Patent No. 3093796), an element which comprises an organic light emission layer containing an 8-hydroxyquinoline aluminum complex as a host compound doped with a slight amount of a fluorescent compound (see for example, Japanese Patent O.P.I. Publication No. 63-264692), and an element which comprises an organic light emission layer containing an 8-hydroxyquinoline aluminum complex as a host compound doped with a quinacridone type dye (see for example, Japanese Patent O.P.I. Publication No. 3-255190).

When light emitted through excited singlet state is used in the element disclosed in the above Patent documents, the upper limit of the external quantum efficiency ($\eta$ext) is considered to be at most 5%, as the generation ratio of singlet excited species to triplet excited species is 1:3, that is, the generation probability of excited species capable of emitting light is 25%, and further, external light emission efficiency is 20%.

Since an organic EL element, employing phosphorescence through the excited triplet, was reported by Prinston University (for example, see M. A. Baldo et al., Nature, 395, p. 151-154 (1998)), study on materials emitting phosphorescence at room temperature has been actively made (for example, see M. A. Baldo et al., Nature, 403, 17, p. 750-753 (2000) or U.S. Pat. No. 6,097,147).

As the upper limit of the internal quantum efficiency of the excited triplet is 100%, the light emission efficiency of the exited triplet is theoretically four times that of the excited singlet. Accordingly, light emission employing the excited triplet exhibits the same performance as a cold cathode tube, and can be applied to illumination.

For example, many kinds of heavy metal complexes such as iridium complexes has been synthesized and studied (for example, see S. Lamansky et al., J. Am. Chem. Soc., 123, 4304 (2001)).

An example employing tris(2-phenylpyridine)iridium as a dopant has been studied (for example, M. A. Baldo et al., Nature, 395, p. 151-154 (1998)).

Further, an example employing as a dopant $L_2$Ir (acac) (in which L represents a bidentate ligand, and "acac represents acetyl acetone) such as $(ppy)_2$Ir (acac) (for example, see M. E. Tompson et. al., The $10^{th}$ International Workshop on Inorganic and Organic Electroluminescence (EL' 00, Hamamatsu)), or employing as a dopant tris(2-p-tolylpyridine)iridium {Ir(ptpy)$_3$}, tris(benzo-[h]-quinoline)iridium {Ir(bzq)$_3$}, or Ir(bzq)$_2$ClP (Bu)$_3$ has been studied (for example, see Moon-Jae Youn. Og, Tetsuo Tsutsui et. al., The $10^{th}$ International Workshop on Inorganic and Organic Electroluminescence (EL' 00, Hamamatsu)).

A hole transporting material is used as a host of a phosphorescent compound in order to increase emission efficiency (for example, see Ikai et. al., The $10^{th}$ International Workshop on Inorganic and Organic Electroluminescence (EL' 00, Hamamatsu)).

Various kinds of electron transporting materials are used as a host of a phosphorescent compound, and further doped with a new iridium complex (for example, M. E. Tompson et. al., The $10^{th}$ International Workshop on Inorganic and Organic Electroluminescence (EL' 00, Hamamatsu)). High emission efficiency is obtained by incorporation of a hole blocking layer (for example, see Moon-Jae Youn. Og, Tetsuo Tsutsui et. al., The $10^{th}$ International Workshop on Inorganic and Organic Electroluminescence (EL' 00, Hamamatsu)).

At present, an organic electroluminescent element emitting phosphorescence with further higher emission efficiency and longer lifetime has been studied.

An external qauntum efficiency of around 20%, which is a theoretical threshold, is attained in green light emission, but in a low current region (a low luminance region), and the theoretical threshold is not attained in a high current region (a high luminance region). Further, a sufficient emission efficiency is not attained in another color emission, where there is room to be improved. An organic EL element for practical use is required which efficiently emits light with high luminance at a lower power. Particularly, an organic EL element is required which emits a blue phosphorescence with high efficiency.

As a hole transporting material used in a conventional organic EL element employing phosphorescence emission, $\alpha$-NPD, m-MTDATA, TPD, hm-TDP, or PEDOT or PVK as a polymer type is used.

$\alpha$-NPD, which is most generally used, easily injects holes to a light emission layer, however, its performance as a hole transporting material of an organic EL element emitting a green phosphorescence is not sufficient, since its exited triplet energy is low. Accordingly, its performance as an organic EL element emitting a blue phosphorescence is not satisfactory.

m-MTDATA easily injects holes to a light emission layer, and its exited triplet energy is relatively high, however, its performance as an organic EL element emitting a blue phosphorescene is not satisfactory.

TDP, hm-TDP (literature) is not suitable for an organic EL element emitting a blue phosphorescence, and has problem in view of lifetime.

The exited triplet energy of PEDOT is extremely low, and PEDOT does not have sufficient performance as a hole transporting material of an organic EL element emitting phosphorescene.

PVK is excellent in view of extremely high exited triplet energy of PEDOT, however, it has problem in view of transportability of holes, since its ionization potential is very high.

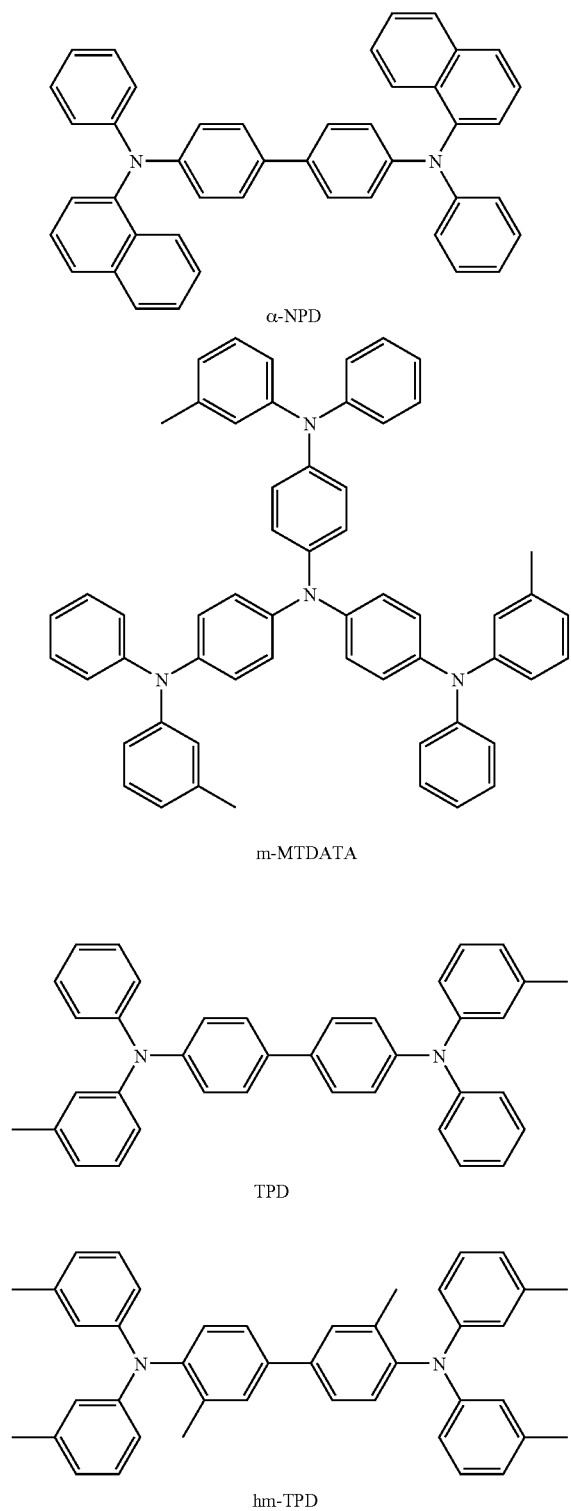

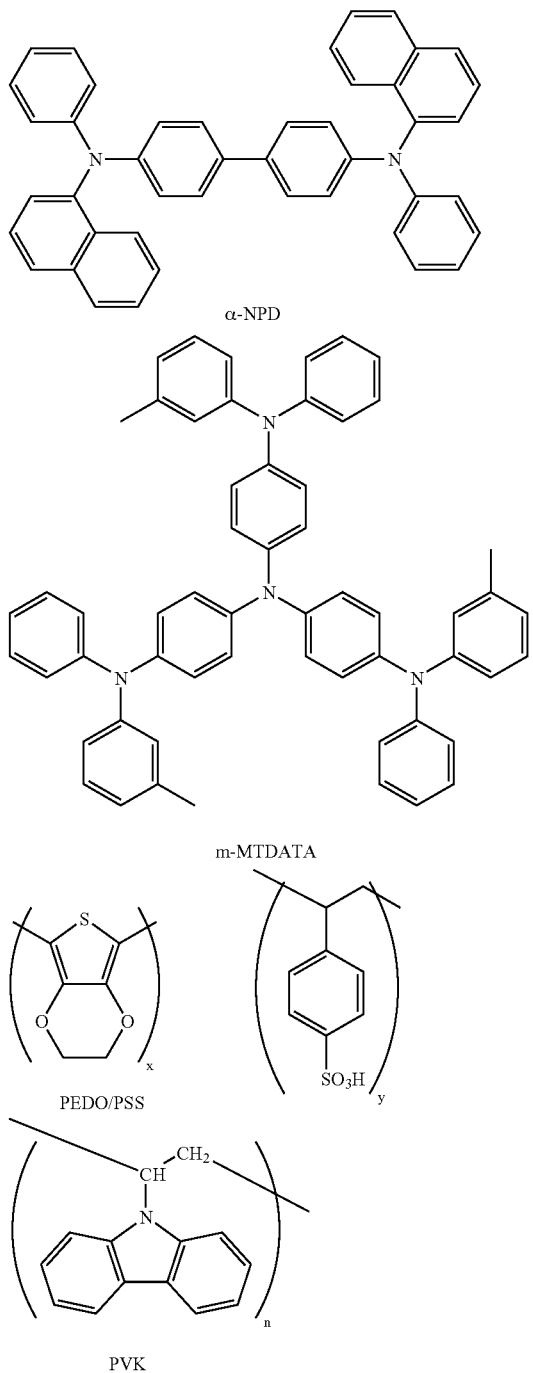

Even when the above compounds are used, layer constitution can be designed so that triplet excitons are not inactivated by a hole transporting layer, however, such a design is very difficult, and almost impossible particularly in a high current region (high luminance region).

SUMMARY OF THE INVENTION

The present invention has been made in view of the above. An object of the invention is to provide an organic electroluminescent element, an illuminator and a display each having high luminance.

DETAILED DESCRIPTION OF THE INVENTION

Figure 1:
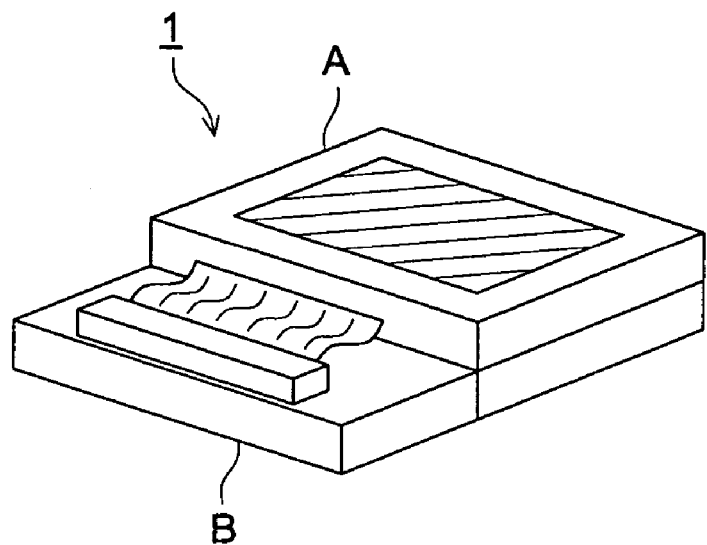
FIG. 1 is a schematic drawing of one example of a display comprising an organic EL element.

The above object of the invention can be attained by the following constitution:

1. An organic electroluminescent element comprising a light emission layer containing a phosphorescent compound and a hole transporting layer adjacent thereto containing a hole transporting material, wherein the hole transporting material has a 0-0 band of the phosphorescence spectra of from 300 to 450 nm and has a molecular weight of not less than 550.
2. The organic electroluminescent element of item 1 above, wherein the hole transporting material has an ionization potential Ip1 of from 5.00 to 5.70 eV.
3. The organic electroluminescent element of item 1 above, wherein $-0.1\ (eV) \leq Ip3 - Ip1 \leq 0.5\ (eV)$ where Ip1 (eV) represents the ionization potential of the hole transporting material, and Ip3 (eV) represents the ionization potential of the phosphorescent compound.
4. The organic electroluminescent element of item 1 above, wherein $0.5\ (eV) < T3 - Ea1 < 1.3 (eV)$ where T3 (eV) represents the excited triplet energy level of the phosphorescent compound and Ea1 (eV) represents the electron affinity of the hole transporting material.
5. The organic electroluminescent element of item 1 above, wherein the phosphorescent compound has a phosphorescence maximum in the wavelength regions of from 380 to 480 nm.
6. The organic electroluminescent element of item 1 above, further comprising a second hole transporting layer containing a second hole transporting material, the second hole transporting layer being provided on the surface of the hole transporting layer opposite the light emission layer, wherein $0.1\ (eV) < Ip1 - Ip4 < 0.7 (eV)$ where Ip1 (eV) represents the ionization potential of the hole transporting material, and Ip4 (eV) represents the ionization potential of the second hole transporting material.
7. The organic electroluminescent element of item 6 above, wherein the thickness of the hole transporting layer adjacent to the light emission layer is from 5 to 20 nm.
8. The organic electroluminescent element of item 1 above, wherein the light emission layer further contains a host compound.
9. The organic electroluminescent element of item 8 above, wherein $0.3\ (eV) < Ip2 - Ip1 < 1.0\ (eV)$ where Ip1 (eV) represents the ionization potential of the hole transporting material and Ip2 (eV) represents the ionization potential of the host compound.
10. The organic electroluminescent element of item 8 above, wherein $0.1\ (eV) < Ea2 - Ea1 < 0.8\ (eV)$ where Ea1 (eV) represents the electron affinity of the hole transporting material and Ea2 (eV) represents the electron affinity of the host compound.
11. The organic electroluminescent element of item 8 above, wherein the host compound has a 0-0 band of the phosphorescence spectra of from 300 to 450 nm.
12. The organic electroluminescent element of item 8 above, wherein the host compound is a carbazole derivative.
13. The organic electroluminescent element of item 12 above, wherein the carbazole derivative is a compound represented by the following formula 11,

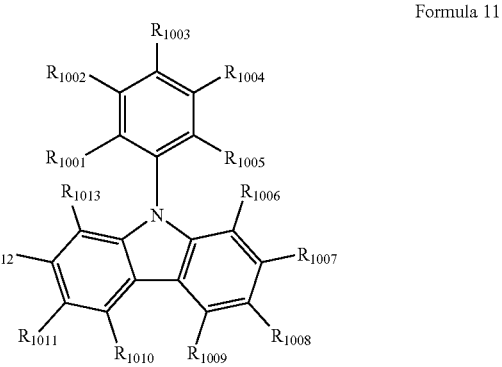

Formula 11 wherein $R_{1001}$ through $R_{1013}$ independently represent a hydrogen atom or a substituent, provided that at least one of $R_{1001}$ through $R_{1013}$ is a substituent.
14. The organic electroluminescent element of item 12 above, wherein the carbazole derivative is a compound represented by the following formula 12,

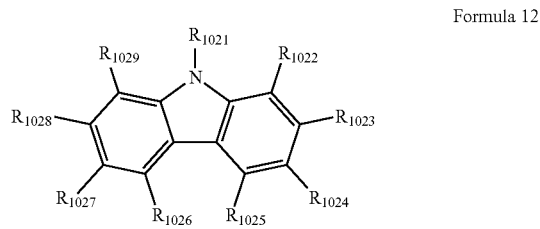

Formula 12 wherein $R_{1021}$, represents an alkyl group, a cycloalkyl group or a fluoroalkyl group; and $R_{1022}$ through $R_{1029}$ independently represent a hydrogen atom or a substituent, provided that at least one of $R_{1022}$ through $R_{1029}$ is a substituent.

15. The organic electroluminescent element of item 12 above, wherein the carbazole derivative is a compound represented by the following formula 13, Formula 13

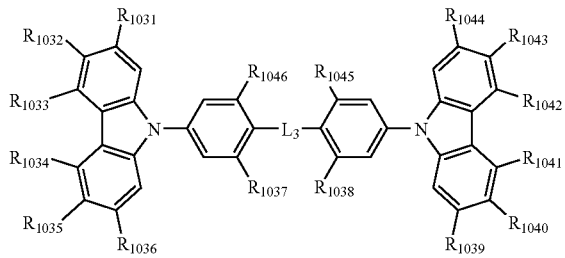

wherein $R_{1031}$ through $R_{1046}$ independently represent a hydrogen atom or a substituent; and $L_3$ represents a chemical bond or a divalent linkage group, provided that when $L_3$ represents a chemical bond, at least one of $R_{1037}$, $R_{1038}$, $R_{1045}$, and $R_{1046}$ is a substituent.

16. The organic electroluminescent element of item 12 above, wherein the carbazole derivative is a compound represented by the following formula 14, Formula 14

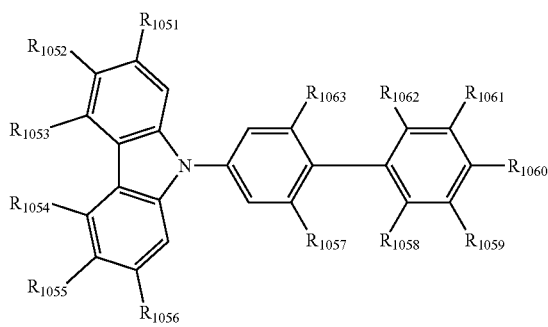

wherein $R_{1051}$ through $R_{1063}$ independently represent a hydrogen atom or a substituent, provided that at least one of $R_{1057}$, $R_{1058}$, $R_{1062}$, and $R_{1063}$ is a substituent.

17. The organic electroluminescent element of item 12 above, wherein the carbazole derivative is a compound represented by the following formula 15, Formula 15

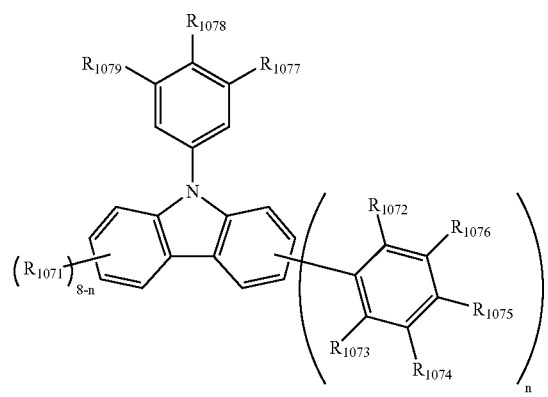

wherein $R_{1071}$ through $R_{1079}$ independently represent a hydrogen atom or a substituent, provided that at least one of $R_{1072}$ and $R_{1073}$ is a substituent; and n is an integer of from 1 to 8.

18. The organic electroluminescent element of item 1 above, wherein the hole transporting material is a triarylamine compound.

19. The organic electroluminescent element of item 18 above, wherein the triarylamine compound is a compound represented by the following formula 1, Formula 1

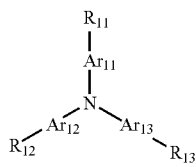

wherein $Ar_{11}$ through $Ar_{13}$ independently represent a substituted or unsubstituted aryl group or a substituted or unsubstituted heteroaryl group; and $R_{11}$ through $R_{13}$ independently represent a hydrogen atom or a substituent, provided that at least one of $R_{11}$ through $R_{13}$ is a substituent.

20. The organic electroluminescent element of item 18 above, wherein the triarylamine compound is a compound represented by the following formula 2, Formula 2

$$(Ar_{301})_{3-n}-N-(B)_n$$

wherein $Ar_{301}$ represents a substituted or unsubstituted aryl group or a substituted or unsubstituted heteroaryl group; n is an integer of from 1 to 3; and B represents the following formula 3, Formula 3

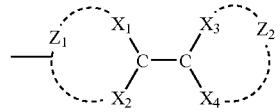

wherein $Z_1$ and $Z_2$ independently represent an atomic group necessary to form an aromatic hydrocarbon ring or an aromatic heterocyclic ring; and $X_1$ through $X_4$ independently represent N, O, S or C—$R_{301}$ in which $R_{301}$ represents a hydrogen atom or a substituent, provided that at least one of $X_1$ through $X_4$ represents C—$R_{301}$ in which $R_{301}$ represents a substituent.

21. The organic electroluminescent element of item 18 above, wherein the triarylamine compound is a compound represented by the following formula 4-1 or 4-2, Formula 4-1

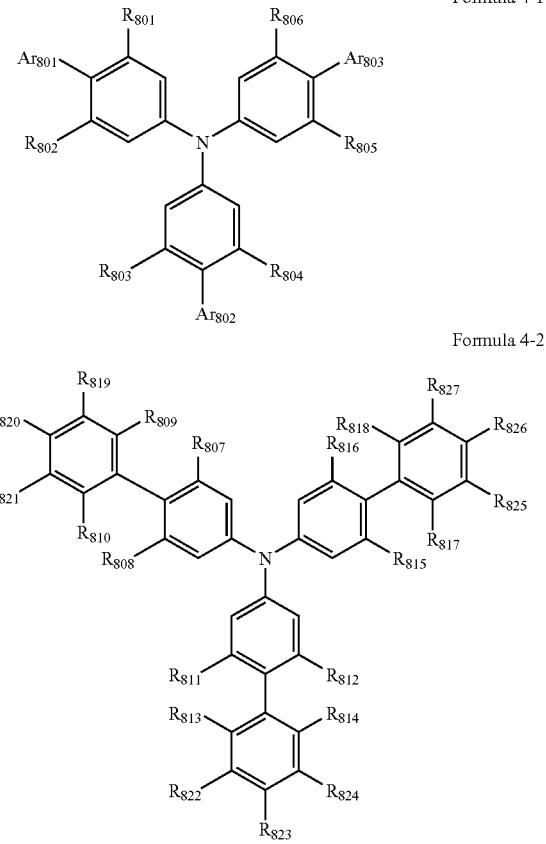

Formula 4-2 wherein Ar801 through Ar 803 independently represent a substituted or unsubstituted aryl group or a substituted or unsubstituted heteroaryl group; and $R_{801}$ through $R_{827}$ independently represent a hydrogen atom or a substituent, provided that at least one of $R_{801}$ and $R_{802}$ is a substituent, at least one of $R_{803}$ and $R_{804}$ is a substituent, at least one of $R_{805}$ and $R_{806}$ is a substituent, at least one of $R_{807}$ through $R_{810}$ is a substituent, at least one of $R_{811}$ through $R_{814}$ is a substituent, and at least one of $R_{815}$ through $R_{818}$ is a substituent.

22. The organic electroluminescent element of item 18 above, wherein the triarylamine compound is a compound represented by the following formula 5, Formula 5

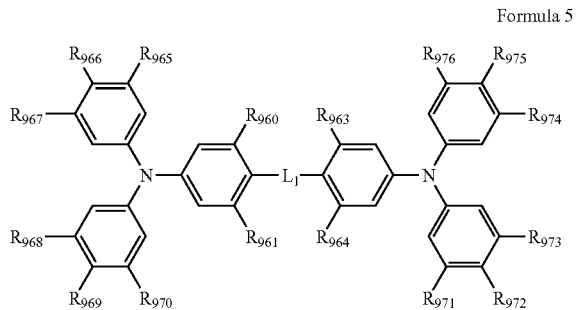

wherein $R_{960}$ through $R_{976}$ independently represent a hydrogen atom or a substituent, provided that at least one of $R_{960}$ and $R_{961}$ is a substituent and at least one of $R_{963}$ and $R_{964}$ is a substituent; and $L_1$ represents a chemical bond or a divalent linkage group.

23. The organic electroluminescent element of item 18 above, wherein the triarylamine compound is a compound represented by the following formula 6, Formula 6

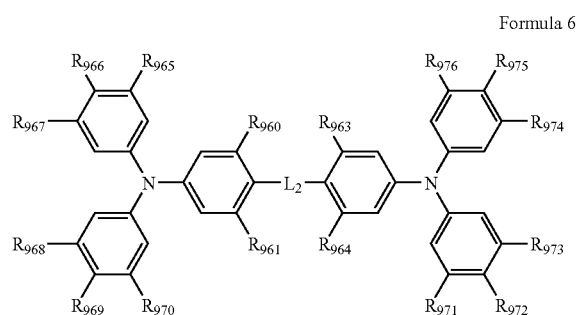

wherein $R_{960}$ through $R_{976}$ independently represent a hydrogen atom or a substituent; and $L_2$ represents an alkylene group, a cycloalkylene group or a fluoroalkylene group.

24. The organic electroluminescent element of item 18 above, wherein the triarylamine compound is a compound represented by the following formula 7, Formula 7

$$(Ar_{501})_{3-n}-N-(B_2-N-Ar_{502})_n$$
$$\overset{Ar_{503}}{|}$$

wherein $Ar_{501}$ through $Ar_{503}$ independently represent a substituted or unsubstituted aryl group or a substituted or unsubstituted heteroaryl group; n is an integer of from 1 to 3; and $B_2$ represents the following formula 8, Formula 8

$$-\underset{X_6=X_8}{\overset{X_5-X_7}{\bigcirc}}-$$

wherein $X_5$ and $X_8$ independently represent N or C—$R_{501}$ in which $R_{501}$ represents a hydrogen atom or a substituent, provided that at least one of $X_5$ and $X_6$ represents C—$R_{501}$ in which $R_{501}$ represents a substituent, and at least one of $X_7$ and $X_8$ represents C—$R_{501}$ in which $R_{501}$ represents a substituent.

25. The organic electroluminescent element of item 18 above, wherein the triarylamine compound is a compound represented by the following formula 9, Formula 9

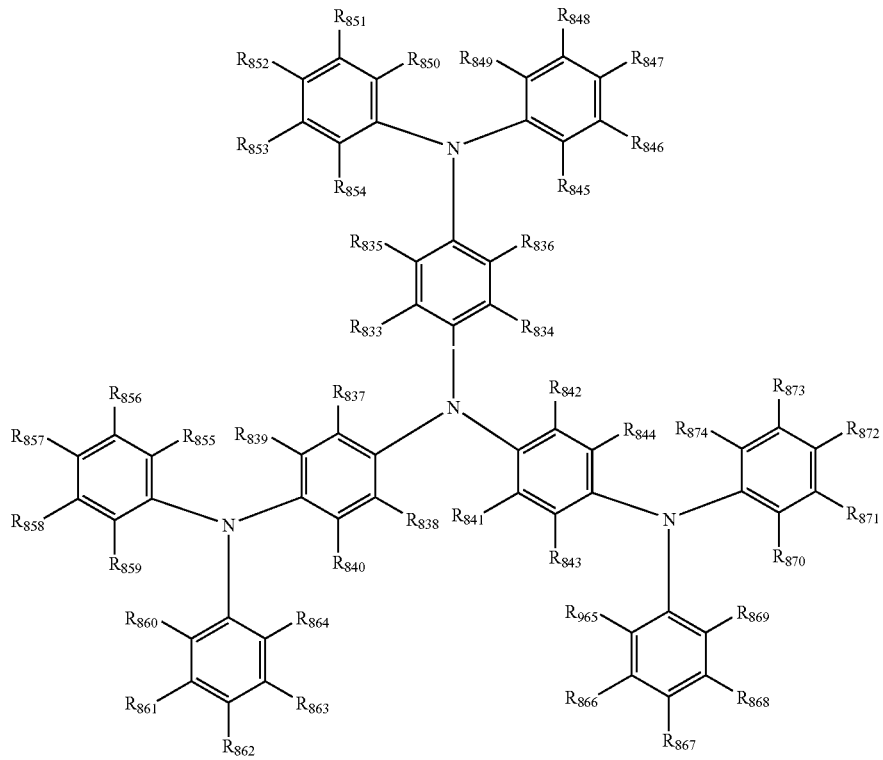

wherein $R_{833}$ through $R_{873}$ independently represent a hydrogen atom or a substituent, provided that at least one of $R_{833}$ and $R_{834}$ is a substituent, at least one of $R_{835}$ and $R_{836}$ is a substituent, at least one of $R_{837}$ and $R_{838}$ is a substituent, at least one of $R_{839}$ and $R_{840}$ is a substituent, at least one of $R_{841}$ and $R_{842}$ is a substituent, and at least one of $R_{843}$ and $R_{844}$ is a substituent.

26. The organic electroluminescent element of item 18 above, wherein the triarylamine compound comprises a terminal group represented by the following formula 10-1, 10-2, 10-3 or 10-4, Formula 10-1

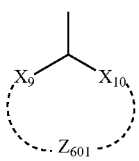

Formula 10-2

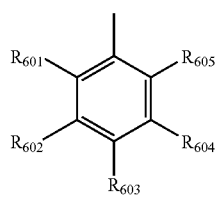

-continued

Formula 10-3

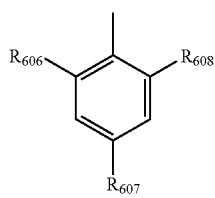

Formula 10-4

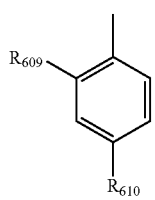

wherein $X_9$ and $X_{10}$ independently represent N, O S or $CR_{611}$ in which $R_{611}$ represents a hydrogen atom or a substituent, provided that at least one of $X_9$ and $X_{10}$ represents $CR_{611}$ in which $R_{611}$ represents a substituent; $Z_{601}$ represents an atomic group necessary to form an aromatic hydrocarbon ring or an aromatic heterocyclic ring; $R_{601}$ through $R_{605}$ independently represent a hydrogen atom or a substituent, provided that at least one of $R_{601}$ and $R_{605}$ is a substituent; and $R_{606}$ through $R_{610}$ independently represent a substituent.

27. An organic electroluminescent element comprising a light emission layer containing a phosphorescent compound and a hole transporting layer adjacent thereto containing a hole transporting material, wherein the hole transporting material is a triarylamine compound represented by the following formula 1,

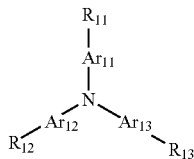

Formula 1 wherein $Ar_{11}$ through $Ar_{13}$ independently represent a substituted or unsubstituted aryl group or a substituted or unsubstituted heteroaryl group; $R_{11}$ through $R_{13}$ independently represent a hydrogen atom or a substituent, provided that at least one of $R_{11}$ through $R_{13}$ is a substituent.

28. The organic electroluminescent element of item 27 above, wherein the triarylamine compound is a compound represented by the following formula 2,

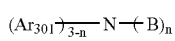

Formula 2 wherein $Ar_{301}$ represents a substituted or unsubstituted aryl group or a substituted or unsubstituted heteroaryl group; n is an integer of from 1 to 3; and B represents the following formula 3,

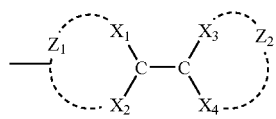

Formula 3 wherein $Z_1$ and $Z_2$ independently represent an atomic group necessary to form an aromatic hydrocarbon ring or an aromatic heterocyclic ring; and $X_1$ through $X_4$ independently represent N, O, S or C—$R_{301}$ in which $R_{301}$ represents a hydrogen atom or a substituent, provided that at least one of $X_1$ through $X_4$ represents C—$R_{301}$ in which $R_{301}$ represents a substituent.

29. The organic electroluminescent element of item 27 above, wherein the triarylamine compound is a compound represented by the following formula 4-1 or 4-2,

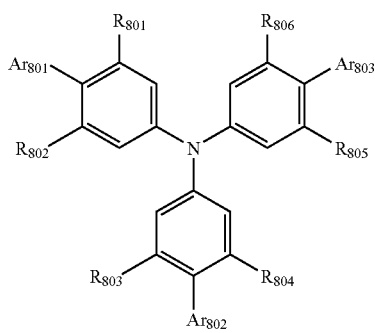

Formula 4-1

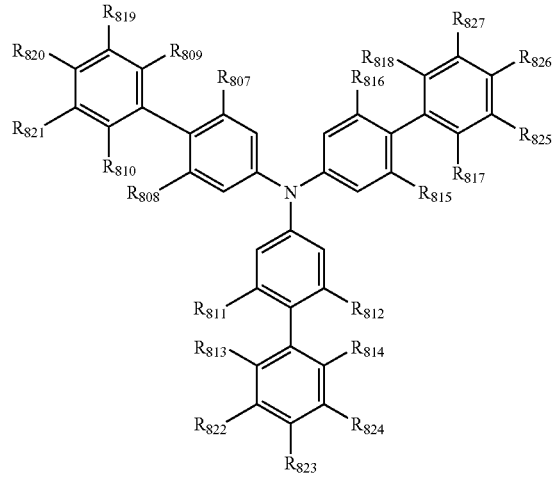

Formula 4-2 wherein $R_{801}$ through $R_{827}$ independently represent a hydrogen atom or a substituent, provided that at least one of $R_{801}$ and $R_{802}$ is a substituent, at least one of $R_{803}$ and $R_{804}$ is a substituent, at least one of $R_{805}$ and $R_{806}$ is a substituent, at least one of $R_{807}$ through $R_{810}$ is a substituent, at least one of $R_{811}$ through $R_{814}$ is a substituent, and at least one of $R_{815}$ through $R_{818}$ is a substituent.

30. The organic electroluminescent element of item 27 above, wherein the triarylamine compound is a compound represented by the following formula 5,

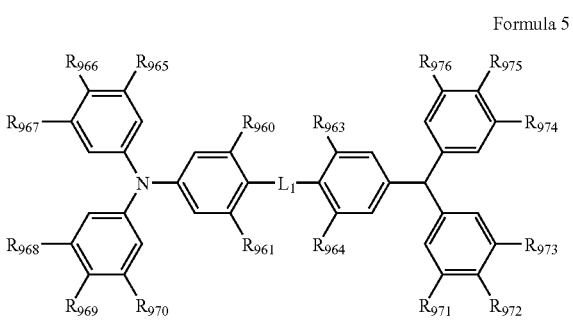

Formula 5 wherein $R_{960}$ through $R_{976}$ independently represent a hydrogen atom or a substituent, provided that at least one of $R_{960}$ and $R_{961}$ is a substituent, and at least one of $R_{963}$ and $R_{964}$ is a substituent; and $L_1$ represents a chemical bond or a divalent linkage group.

31. The organic electroluminescent element of item 27 above, wherein the triarylamine compound is a compound represented by the following formula 6, Formula 6

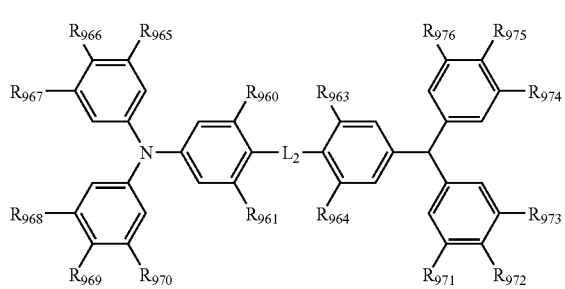

wherein $R_{960}$ through $R_{976}$ independently represent a hydrogen atom or a substituent; and $L_2$ represents an alkylene group, a cycloalkylene group or a fluoroalkylene group.

stituted heteroaryl group; n is an integer of from 1 to 3; and $B_2$ represents the following formula 8, Formula 8

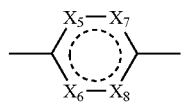

wherein $X_5$ and $X_8$ independently represent N or C—$R_{501}$ in which $R_{501}$ represents a hydrogen atom or a substituent, provided that at least one of $X_5$ and $X_6$ represents C—$R_{501}$ in which $R_{501}$ represents a substituent, and at least one of $X_7$ and $X_8$ represents C—$R_{501}$ in which $R_{501}$ represents a substituent.

33. The organic electroluminescent element of item 27 above, wherein the triarylamine compound is a compound represented by the following formula 9, Formula 9

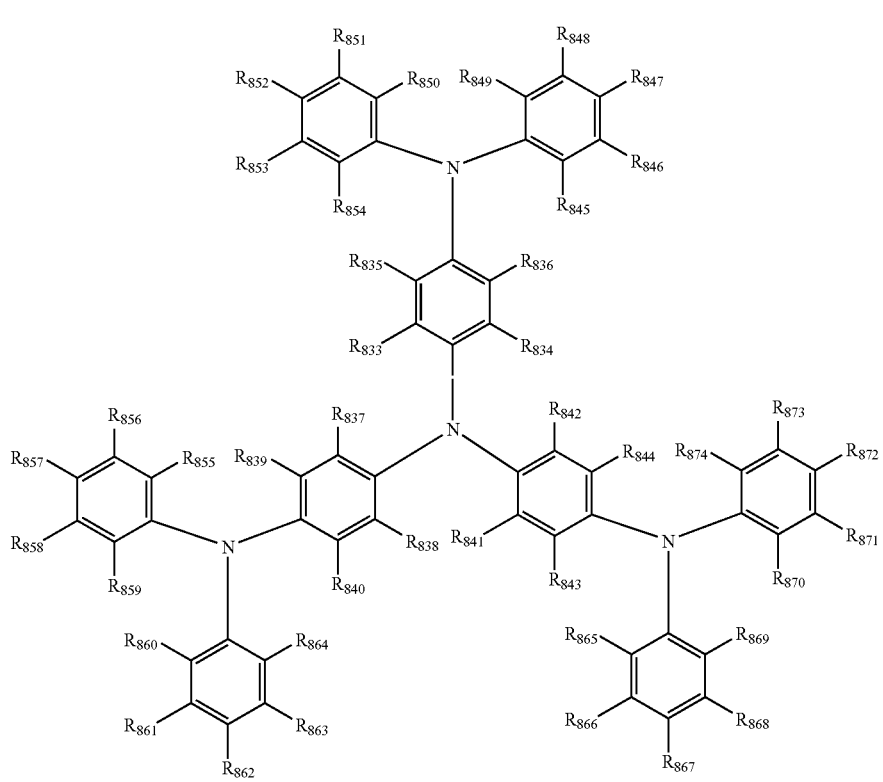

32. The organic electroluminescent element of item 27 above, wherein the triarylamine compound is a compound represented by the following formula 7, Formula 7

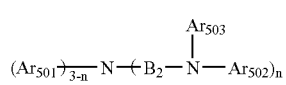

wherein $Ar_{501}$ through $Ar_{503}$ independently represent a substituted or unsubstituted aryl group or a substituted or unsubwherein $R_{833}$ through $R_{873}$ independently represent a hydrogen atom or a substituent, provided that at least one of $R_{833}$ and $R_{834}$ is a substituent, at least one of $R_{835}$ and $R_{836}$ is a substituent, at least one of $R_{837}$ and $R_{838}$ is a substituent, at least one of $R_{839}$ and $R_{840}$ is a substituent, at least one of $R_{841}$ and $R_{842}$ is a substituent, and at least one of $R_{843}$ and $R_{844}$ is a substituent.

34. The organic electroluminescent element of item 27 above, wherein the triarylamine compound is a compound having a terminal group represented by the following formula 10-1, 10-2, 10-3 or 10-4, Formula 10-1

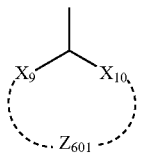

Formula 10-2

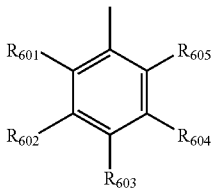

Formula 10-3

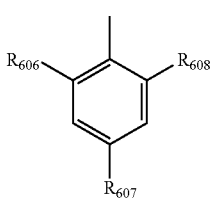

Formula 10-4

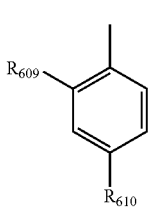

wherein $X_9$ and $X_{10}$ independently represent N, O, S or $CR_{611}$ in which $R_{611}$ represents a hydrogen atom or a substituent, provided that at least one of $X_9$ and $X_{10}$ represents $CR_{611}$ in which $R_{611}$ represents a substituent; Z601 represents an atomic group necessary to form an aromatic hydrocarbon ring or an aromatic heterocyclic ring; $R_{601}$ through $R_{605}$ independently represent a hydrogen atom or a substituent, provided that at least one of $R_{601}$ and $R_{605}$ is a substituent; and $R_{606}$ through $R_{610}$ independently represent a substituent.

35. The organic electroluminescent element of item 27 above, wherein the hole transporting material has a molecular weight of not less than 550.

36. The organic electroluminescent element of item 27 above, wherein the hole transporting material has an ionization potential Ip1 of from 5.00 to 5.70 eV.

37. The organic electroluminescent element of item 27 above, wherein

−0.1 (eV)<$Ip3-Ip1$≦0.5 (eV)

where Ip1 (eV) represents the ionization potential of the hole transporting material, and Ip3 (eV) represents the ionization potential of the phosphorescent compound.

38. The organic electroluminescent element of item 27 above, wherein 0.5 (eV)<$T3-Ea1$<1.3 (eV)

where T3 represents the excited triplet energy level of the phosphorescent compound and Ea1 represents the electron affinity of the hole transporting material.

39. The organic electroluminescent element of item 27 above, wherein the phosphorescent compound has a phosphorescence maximum in the wavelength regions of from 380 to 480 nm.

40. The organic electroluminescent element of item 27 above, further comprising a second hole transporting layer containing a second hole transporting material, the second hole transporting layer being provided on the surface of the hole transporting layer opposite the light emission layer, wherein 0.1 (eV)<$Ip1-Ip4$<0.7 (eV)

where Ip1 represents the ionization potential of the hole transporting material, and Ip4 represents the ionization potential of the second hole transporting material.

41. The organic electroluminescent element of item 40 above, wherein the thickness of the hole transporting layer adjacent to the light emission layer is from 5 to 20 nm.

42. The organic electroluminescent element of item 27 above, wherein the light emission layer further contains a host compound.

43. The organic electroluminescent element of item 27 above, wherein 0.3 (eV)<$Ip2-Ip1$<1.0 (eV)

where Ip1 (eV) represents the ionization potential of the hole transporting material and Ip2 (eV) represents the ionization potential of the host compound.

44. The organic electroluminescent element of item 27 above, wherein 0.1 (eV)<$Ea2-Ea1$<0.8 (eV)

where Ea1 (eV) represents the electron affinity of the hole transporting material and Ea2 (eV) represents the electron affinity of the host compound.

45. The organic electroluminescent element of item 27 above, wherein the host compound has a 0-0 band of the phosphorescence spectra of from 300 to 450 nm.

46. The organic electroluminescent element of item 27 above, wherein the host compound is a carbazole derivative.

47. The organic electroluminescent element of item 46 above, wherein the carbazole derivative is a compound represented by the following formula 11, Formula 11

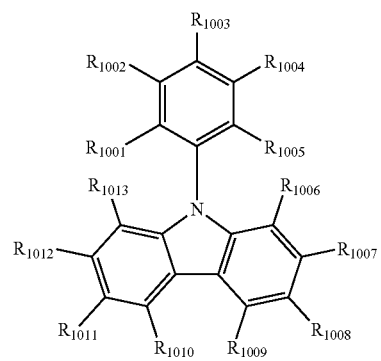

wherein $R_{1001}$ through $R_{1013}$ independently represent a hydrogen atom or a substituent, provided that at least one of $R_{1001}$ through $R_{1013}$ is a substituent.

48. The organic electroluminescent element of item 46 above, wherein the carbazole derivative is a compound represented by the following formula 12, Formula 12

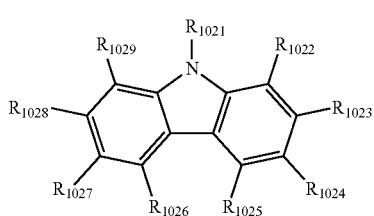

wherein $R_{1021}$ represents an alkyl group, a cycloalkyl group or a fluoroalkyl group; and $R_{1022}$ through $R_{1029}$ independently represent a hydrogen atom or a substituent, provided that at least one of $R_{1022}$ through $R_{1029}$ is a substituent.

49. The organic electroluminescent element of item 46 above, wherein the carbazole derivative is a compound represented by the following formula 13, Formula 13

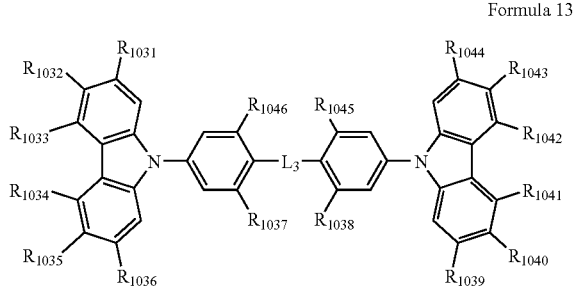

wherein $R_{1031}$ through $R_{1046}$ independently represent a hydrogen atom or a substituent; and $L_3$ represents a chemical bond or a divalent linkage group, provided that when $L_3$ represents a chemical bond, at least one of $R_{1037}$, $R_{1038}$, $R_{1045}$, and $R_{1046}$ is a substituent.

50. The organic electroluminescent element of item 46 above, wherein the carbazole derivative is a compound represented by the following formula 14, Formula 14

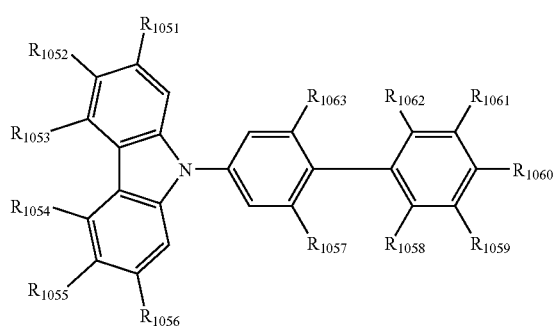

wherein $R_{1051}$ through $R_{1063}$ independently represent a hydrogen atom or a substituent, provided that at least one of $R_{1057}$, $R_{1058}$, $R_{1062}$, and $R_{1063}$ is a substituent.

51. The organic electroluminescent element of item 46 above, wherein the carbazole derivative is a compound represented by the following formula 15, Formula 15

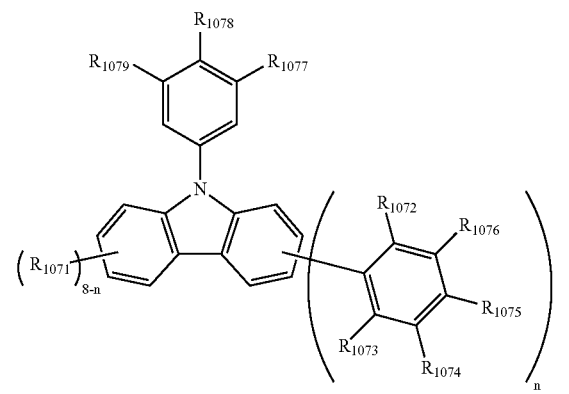

wherein $R_{1071}$ through $R_{1079}$ independently represent a hydrogen atom or a substituent, provided that at least one of $R_{1072}$ and $R_{1073}$ is a substituent; and n is an integer of from 1 to 8.

52. The organic electroluminescent element of item 1 above, wherein the hole transporting layer is formed according to a vacuum deposition process.

53. The organic electroluminescent element of item 1 above, wherein the hole transporting layer is formed according to a wet process.

54. A display comprising the organic electroluminescent element of item 1 above.

55. An illuminator comprising the organic electroluminescent element of item 1 above.

56. A display comprising the illuminator of item 55 above, and a liquid crystal element as a displaying means.

1-1. An organic electroluminescent element comprising a light emission layer containing a phosphorescent compound and a hole transporting layer adjacent thereto containing a hole transporting material, wherein the hole transporting material has a 0-0 band of the phosphorescence spectra of from 300 to 450 nm and has a molecular weight of not less than 550.

1-2. The organic electroluminescent element of item 1-1 above, wherein the hole transporting material has an ionization potential Ip1 of from 5.00 to 5.70 eV.

1-3. The organic electroluminescent element of item 1-1 or 1-2 above, wherein $$-0.1 \leq Ip3 - Ip1 \leq 0.5$$

where Ip1 represents the ionization potential of the hole transporting material, and Ip3 represents the ionization potential of the phosphorescent compound.

1-4. The organic electroluminescent element of any one of items 1-1 through 1-3 above, wherein $$0.5 < T3 - Ea1 < 1.3$$

where T3 represents the excited triplet energy level of the phosphorescent compound and Ea1 represents the electron affinity of the hole transporting material.

1-5. The organic electroluminescent element of any one of items 1-1 through 1-4 above, wherein the phosphorescent compound has a phosphorescence maximum in the wavelength regions of from 380 to 480 nm.

1-6. The organic electroluminescent element of any one of items 1-1 through 1-5 above, further comprising a second hole transporting layer containing a second hole transporting material, the second hole transporting layer being provided on the surface of the hole transporting layer opposite the light emission layer, wherein $$0.1 < Ip1 - Ip4 < 0.7$$

where Ip1 represents the ionization potential of the hole transporting material, and Ip4 represents the ionization potential of the second hole transporting material.

1-7. The organic electroluminescent element of item 1-6 above, wherein the thickness of the hole transporting layer adjacent to the light emission layer is from 5 to 20 nm.

1-8. The organic electroluminescent element of any one of items 1-1 through 1-6 above, wherein the light emission layer further contains a host compound.

1-9. The organic electroluminescent element of item 1-8 above, wherein $$0.3 < Ip2 - Ip1 < 1.0$$

where Ip1 represents the ionization potential of the hole transporting material and Ip2 represents the ionization potential of the host compound.

1-10. The organic electroluminescent element of item 1-8 or 1-9 above, wherein $$0.1 < Ea2 - Ea1 < 0.8$$

where Ea1 represents the electron affinity of the hole transporting material and Ea2 represents the electron affinity of the host compound.

1-11. The organic electroluminescent element of any one of items 1-8 through 1-10 above, wherein the phosphorescence emission wavelength of the host compound is from 300 to 450 nm.

1-12. The organic electroluminescent element of any one of items 1-8 through 1-11 above, wherein the host compound is a carbazole derivative.

1-13. The organic electroluminescent element of item 1-12 above, wherein the carbazole derivative is a compound represented by formula 11 above.

1-14. The organic electroluminescent element of item 1-12 above, wherein the carbazole derivative is a compound represented by formula 12 above.

1-15. The organic electroluminescent element of item 1-12 above, wherein the carbazole derivative is a compound represented by formula 13 above.

1-16. The organic electroluminescent element of item 1-12 above, wherein the carbazole derivative is a compound represented by formula 14 above.

1-17. The organic electroluminescent element of item 1-12 above, wherein the carbazole derivative is a compound represented by formula 15 above.

1-18. The organic electroluminescent element of any one of items 1-1 through 1-17 above, wherein the hole transporting material is a triarylamine compound.

1-19. The organic electroluminescent element of item 1-18 above, wherein the triarylamine compound is a compound represented by formula 1 above.

1-20. The organic electroluminescent element of item 1-18 above, wherein the triarylamine compound is a compound represented by formula 2 above.

1-21. The organic electroluminescent element of item 1-18 above, wherein the triarylamine compound is a compound represented by formula 4-1 or 4-2 above.

1-22. The organic electroluminescent element of item 1-18 above, wherein the triarylamine compound is a compound represented by formula 5 above.

1-23. The organic electroluminescent element of item 1-18 above, wherein the triarylamine compound is a compound represented by formula 6 above.

1-24. The organic electroluminescent element of item 1-18 above, wherein the triarylamine compound is a compound represented by formula 7 above.

1-25. The organic electroluminescent element of item 1-18 above, wherein the triarylamine compound is a compound represented by formula 9 above.

1-26. The organic electroluminescent element of item 1-18 above, wherein the triarylamine compound comprises a terminal group represented by formula 10-1, 10-2, 10-3 or 10-4 above.

1-27. An organic electroluminescent element comprising a light emission layer containing a phosphorescent compound and a hole transporting layer adjacent thereto containing a hole transporting material, wherein the hole transporting material is a triarylamine compound represented by formula 1 above.

1-28. An organic electroluminescent element comprising a light emission layer containing a phosphorescent compound and a hole transporting layer adjacent thereto containing a hole transporting material, wherein the hole transporting material is a triarylamine compound represented by formula 2 above.

1-29. An organic electroluminescent element comprising a light emission layer containing a phosphorescent compound and a hole transporting layer adjacent thereto containing a hole transporting material, wherein the hole transporting material is a triarylamine compound represented by formula 4-1 or 4-2 above.

1-30. An organic electroluminescent element comprising a light emission layer containing a phosphorescent compound and a hole transporting layer adjacent thereto containing a hole transporting material, wherein the hole transporting material is a triarylamine compound represented by formula 5 above.

1-31. An organic electroluminescent element comprising a light emission layer containing a phosphorescent compound and a hole transporting layer adjacent thereto containing a hole transporting material, wherein the hole transporting material is a triarylamine compound represented by formula 6 above.

1-32. An organic electroluminescent element comprising a light emission layer containing a phosphorescent compound and a hole transporting layer adjacent thereto containing a hole transporting material, wherein the hole transporting material is a triarylamine compound represented by formula 7 above.

1-33. An organic electroluminescent element comprising a light emission layer containing a phosphorescent compound and a hole transporting layer adjacent thereto containing a hole transporting material, wherein the hole transporting material is a triarylamine compound represented by formula 9 above.

1-34. An organic electroluminescent element comprising a light emission layer containing a phosphorescent compound and a hole transporting layer adjacent thereto containing a hole transporting material, wherein the hole transporting material is a triarylamine compound comprising a terminal group represented by formula 10-1, 10-2, 10-3 or 10-4 above.

1-35. The organic electroluminescent element of any one of items 1-27 through 1-34 above, wherein the hole transporting material has a molecular weight of not less than 550.

1-36. The organic electroluminescent element of any one of items 1-27 through 1-35 above, wherein the hole transporting material has an ionization potential Ip1 of from 5.00 to 5.70 eV.

1-37. The organic electroluminescent element of any one of items 1-27 through 1-36 above, wherein $$-0.1 \leq Ip3 - Ip1 \leq 0.5$$

where Ip1 represents the ionization potential of the hole transporting material, and Ip3 represents the ionization potential of the phosphorescent compound.

1-38. The organic electroluminescent element of any one of items 1-27 through 1-37 above, wherein $$0.5 < T3 - Ea1 < 1.3$$

where T3 represents the excited triplet energy level of the phosphorescent compound and Ea1 represents the electron affinity of the hole transporting material.

1-39. The organic electroluminescent element of any one of items 1-27 through 1-38 above, wherein the phosphorescent compound has a phosphorescence maximum in the wavelength regions of from 380 to 480 nm.

1-40. The organic electroluminescent element of any one of items 1-27 through 1-39 above, further comprising a second hole transporting layer containing a second hole transporting material, the second hole transporting layer being provided on the surface of the hole transporting layer opposite the light emission layer, wherein $$0.1 < Ip1 - Ip4 < 0.7$$

where Ip1 represents the ionization potential of the hole transporting material, and Ip4 represents the ionization potential of the second hole transporting material.

1-41. The organic electroluminescent element of item 1-40 above, wherein the thickness of the hole transporting layer adjacent to the light emission layer is from 5 to 20 nm.

1-42. The organic electroluminescent element of any one of items 1-27 through 1-41 above, wherein the light emission layer further contains a host compound.

1-43. The organic electroluminescent element of any one of items 1-27 through 1-42 above, wherein $$0.3 < Ip2 - Ip1 < 1.0$$

where Ip1 represents the ionization potential of the hole transporting material and Ip2 represents the ionization potential of the host compound.

1-44. The organic electroluminescent element of any one of items 1-27 through 1-43 above, wherein $$0.1 < Ea2 - Ea1 < 0.8$$

where Ea1 represents the electron affinity of the hole transporting material and Ea2 represents the electron affinity of the host compound.

1-45. The organic electroluminescent element of any one of items 1-27 through 1-44 above, wherein the phosphorescence emission wavelength of the host compound is from 300 to 450 nm.

1-46. The organic electroluminescent element of any one of any one of items 1-27 through 1-45 above, wherein the host compound is a carbazole derivative.

1-47. The organic electroluminescent element of item 1-46 above, wherein the carbazole derivative is a compound represented by formula 11 above.

1-48. The organic electroluminescent element of item 1-46 above, wherein the carbazole derivative is a compound represented by formula 12 above.

1-49. The organic electroluminescent element of item 1-46 above, wherein the carbazole derivative is a compound represented by formula 13 above.

1-50. The organic electroluminescent element of item 1-46 above, wherein the carbazole derivative is a compound represented by formula 14 above.

1-51. The organic electroluminescent element of item 1-46 above, wherein the carbazole derivative is a compound represented by formula 15 above.

1-52. The organic electroluminescent element of any one of items 1-1 through 1-51 above, wherein the hole transporting layer is formed according to a vacuum deposition process.

1-53. The organic electroluminescent element of any one of items 1-1 through 1-51 above, wherein the hole transporting layer is formed according to a wet process.

1-54. A display comprising the organic electroluminescent element of any one of items 1-1 through 1-53 above.

1-55. An illuminator comprising the organic electroluminescent element of any one of items 1-1 through 1-53 above.

56. A display comprising the illuminator of item 1-55 above and a liquid crystal element as a displaying means.

The present invention will be detailed below.

The present inventors have found an organic electroluminescent element with improved thermal stability and increased emission efficiency, which comprises a light emission layer containing a phosphorescent compound and a hole transporting layer adjacent thereto containing a hole transporting material, wherein the hole transporting material has a 0-0 band of the phosphorescence spectra of from 300 to 450 nm and has a molecular weight of not less than 550. The present inventors have found that recombination of electrons and holes is carried out in the light emission layer portions on the cathode side, whereby light-is emitted, however, the recombination can be carried out in the light emission layer portions on the hole transporting layer side, and that in an organic electroluminescent element comprising a hole transporting layer containing a hole transporting material having a 0-0 band of the phosphorescence spectra of from 300 to 450 nm and having a molecular weight of not less than 550, the recombination of electrons and holes is efficiently carried out in the light emission layer portions on the hole transporting layer side, and emission efficiency and thermal stability of the organic electroluminescent element are increased.

When a hole transporting material, having a 0-0 band of the phosphorescence spectra of from 300 to 450 nm and having a molecular weight of not less than 550, is used in the hole transporting layer adjacent to the light emission layer, excited triplet energy is increased and triplet excitons can be enclosed in the layer, whereby emission efficiency can be increased and thermal stability can be improved. Markedly advantageous effect can be obtained particularly in phosphorescence in high electric current regions or in a blue phosphorescence emitting element.

A 0-0 band in the phosphorescence spectra can be obtained according to the following measuring method.

A compound to be measured-is dissolved in a mixture solvent of ethanol and methanol (=4:1 by volume) which is deoxygenated, placed in a cell for phosphorescence measurement, and exposed to exited light at a liquid nitrogen temperature of 77 K. Spectra of emission light are measured 100 ms after the excited light exposure. As emission life of phosphorescence is longer than that of fluorescence, emission observed 100 ms after the excited light exposure is considered to be phosphorescence. A compound having a phosphorescence life of less than 100 ms may be measured less than 100 ms after the exposure. However, when time after the exposure is too short, problem is caused that phosphorescence cannot be distinguished from fluorescence. It is necessary to select time which can distinguish phosphorescence from fluorescence.

In a compound, which is insoluble in the above solvent mixture, any solvent capable of dissolving the compound can be used. (In the above-described measuring method, solvent effect upon phosphorescence wavelength is substantially extremely small and does not cause problem.)

In the invention, the shortest wavelength which gives emission maximum in the phosphorescence spectra measured according to the method described above is defined as a 0-0 band.

Intensity of the phosphorescence spectra is ordinarily weak, and in the magnified spectra, there are some cases in which the peaks are difficult to be distinguished from noises. In such cases, stationary light spectra are magnified, and emission spectra (for convenience, referred to as phosphorescence spectra) 100 ms after light irradiation for excitation are superposed on the magnified spectra. Thereafter, wavelengths giving peaks are determined from portions of the stationary light spectra which are derived from the phosphorescence spectra, whereby the peaks can be distinguished from noises. Further, wavelengths giving peaks can be also read separating peaks from noises by subjecting the phosphorescence spectra to smoothing treatment. As the smoothing treatment, a smoothing method of Savitzky and Golay can be applied.

In the hole transporting material in the invention, this 0-0 band of the phosphorescence spectra is from 300 to 450 nm, and preferably from 350 to 430 nm, whereby emission efficiency is more increased. Such a hole transporting material is preferably a triarylamine compound.

The triarylamine compound is more preferably a triarylamine compound as described below, which provides further higher emission efficiency.

Examples of the triarylamine compound include a triarylamine compound represented by formula 1 above.

Examples of the substituent include an alkyl group (for example, a methyl group, an ethyl group, a propyl group, an isopropyl group, a t-butyl group, a pentyl group, a hexyl group, an octyl group, a dodecyl group, a tridecyl group, a tetradecyl group, or a pentadecyl group), a cycloalkyl group (for example, a cyclopentyl group or a cyclohexyl group), an alkenyl group (for example, a vinyl group or a allyl group), an alkinyl group (for example, a propargyl group), a substituted or unsubstituted aryl group (for example, a phenyl group), a substituted or unsubstituted heteroaryl group (for example, a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolyl group, or a phthalazinyl group), a substituted or unsubstituted saturated heterocyclic group (for example, a porrolidinyl group, an imidazolidinyl group, a morpholinyl group or an oxazolidinyl group), an alkoxy group (for example, a methoxy group, an ethoxy group, a propoxy group, a pentyloxy group, a hexyloxy group, an octyloxy group, or a dodecyloxy group), a cycloalkoxy group (for example, a cyclopentyloxy group, or a cyclohexyloxy group), an aryloxy group (for example, a phenoxy group or a naphthyloxy group), an alkylthio group (for example, a methylthio group, an ethylthio group, a propylthio group, a pentylthio group, a hexylthio group, an octylthio group, or a dodecylthio group), a cycloalkylthio group (for example, a cyclopentylthio group or a cyclohexylthio group), an arylthio group (for example, a phenylthio group, or a naphthylthio group), an alkoxycarbonyl group (for example, a methyloxycarbonyl group, an ethyloxycarbonyl group, a butyloxycarbonyl group, an octyloxycarbonyl group, or a dodecyloxycarbonyl group), an aryloxycarbonyl group (for example, a phenyloxycarbonyl group, or a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, or a 2-pyridylaminosulfonyl group), an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecycarbonyl group, a phenylcarbonyl group, a naphthylcarbonyl group, or a pyridylcarbonyl group), an acyloxy group (for example, an acetyloxy group, an ethylcarbonyloxy group, a butylcarbonyloxy group, an octylcarbonyloxy group, a dodecycarbonyloxy group, or a phenylcarbonyloxy group), an amido group (for example, a methylcarbonylamino group, an ethylcarbonylamino group, a dimethylcarbonylamino group, a propylcarbonylamino group, a pentylcarbonylamino group, a cyclohexylcarbonylamino group, 2-ethylhexylcarbonylamino group, an octylcarbonylamino group, a a dodecycarbonylamino group, a phenylcarbonylamino group, a naphthylcarbonylamino group, or a pyridylcarbonyl group), a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecyaminocarbonyl group, a phenylaminocarbonyl group, a naphthylaminocarbonyl group, or a 2-pyridylaminocarbonyl group), a ureido group (for example, a methylureido group, an ethylureido group, a pentylureido group, a cyclohexylureido group, an octylureido group, a dodecylureido group, a phenylureido group, a naphthylureido group, or a 2-pyridylureido group), a sulfinyl group (for example, a methylsulfinyl group, an ethylsulfinyl group, a butylsulfinyl group, a cyclohexylsulfinyl group, a 2-ethylhexylsulfinyl group, a dodecysulfinyl group, a phenylsulfinyl group, a naphthylsulfinyl group, or a 2-pyridylsulfinyl group), an alkylsulfonyl or arylsulfonyl group (for example, a methylsulfonyl group, an ethylsulfonyl group, a butylsulfonyl group, a cyclohexylsulfonyl group, a 2-ethylhexylsulfonyl group, a dodecysulfonyl group, a phenylsulfonyl group, a naphthylsulfonyl group, or a 2-pyridylsulfonyl group), an amino group (for example, an amino group, an ethylamino group, a dimethylamino group, a butylaminocarbonyl group, a cyclopentylamino group, a 2-ethylhexylamino group, a dodecyamino group, an anilino group, a naphthylamino group, or a 2-pyridylamino group), a halogen atom (for example, fluorine, chlorine, or bromine), a fluorinated hydrocarbon group (for example, a fluoromethyl group, a trifluoromethyl group, a pentafluoroethyl group, or a pentafluorophenyl group), a cyano group, a nitro group, a hydroxyl group, a mercapto group, or a silyl group (for example, a trimethylsilyl group, a triisopropylsilyl group, a triphenylsilyl group or a phenyldiethylsilyl group).

These substituents may further have the same substituent as described above. Further, plural substituents of the above substituent may combine with each other to form a ring. However, a substituent is not applicable which provides a low excited triplet energy such that the 0-0 band of the phosphorescence spectra exceeds 450 nm. For example, the 0-0 band of the phosphorescence spectra of naphthalene is 471 nm, and accordingly, a naphthyl group is not suitable as a substituent.

The preferred substituent is an alkyl group, a cycloalkyl group, a fluorinated hydrocarbon group, an aryl group or a heteroaryl group.

The substituted or unsubstituted aryl group represented by $R_{11}$ through $R_{13}$ is preferably a phenyl group, and the substituted or unsubstituted heteroaryl group represented by $R_{11}$ through $R_{13}$ is preferably a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolyl group, or a phthalazinyl group. However, of these, those providing a 0-0 band of the phosphorescence spectra exceeding 450 nm are not suitable.

$Ar_{11}$ through $Ar_{13}$ independently represent a substituted or unsubstituted aryl group (for example, phenyl) or a substituted or unsubstituted heteroaryl group (for example, a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolyl group, or a phthalazinyl group). In Arl, through $Ar_{13}$, those providing a 0-0 band.of the phosphorescence spectra exceeding 450 nm are not also suitable.

The dihedral angle between the ring plane of the aryl or heteroaryl group of $R_{11}$ through $R_{13}$ and that of $Ar_{11}$ through $Ar_{13}$ bonding the $R_{11}$ through $R_{13}$ is preferably not less than 50 degrees. The steric structure of a molecule can be controlled by incorporation of a substituent to $R_{11}$ through $R_{13}$ or $Ar_{11}$ through $Ar_{13}$. When the steric control due to such a substituent incorporation is not carried out, the dihedral angle is generally less than 50 degrees. In this case, the conjugation length extends whereby the 0-0 band of the phosphorescence spectra shifts to a longer wavelength, resulting in lowering of the excited triplet energy.

The dihedral angle herein referred to means an angle formed between two aromatic ring planes combining with each other in the optimized structure in the ground state of a compound computed according to molecular orbital calculation (for example, MOPAC, gaussian).

Examples of the triarylamine compound include a triarylamine compound represented by formula 2 above.

In formula 2, $Ar_{301}$ represents a substituted or unsubstituted aryl group or a substituted or unsubstituted heteroaryl group; n is an integer of from 1 to 3; and B represents formula 3 above.

In formula 3, $Z_1$ and $Z_2$ independently represent an atomic group necessary to form an aromatic hydrocarbon ring or an aromatic heterocyclic ring; and $X_1$ through $X_4$ independently represent N, O, S, or $C—R_{301}$ in which $R_{301}$ represents a hydrogen atom or a substituent, provided that at least one of $X_1$ through $X_4$ represents $C—R_{301}$ in which $R_{301}$ represents a substituent. The condition that that at least one of $X_1$ through $X_4$ represents $C—R_{301}$ in which $R_{301}$ represents a substituent provides steric hindrance, resulting in a dihedral angle of not less than 50 degrees.

Examples of the triarylamine compound include a triarylamine compound represented by formula 4-1 or 4-2 above.

In formula 4-1 above, $Ar_{801}$ through $Ar_{803}$ independently represent a substituted or unsubstituted aryl group or a substituted or unsubstituted heteroaryl group; and $R_{801}$ through $R_{827}$ independently represent a hydrogen atom or a substituent, provided that at least one of $R_{801}$ and $R_{802}$ is a substituent, at least one of $R_{803}$ and $R_{804}$ is a substituent, at least one of $R_{805}$ and $R_{806}$ is a substituent, at least one of $R_{807}$ through $R_{810}$ is a substituent, at least one of $R_{811}$ through $R_{814}$ is a substituent, and at least one of $R_{815}$ through $R_{818}$ is a substituent. Such a substituent can provide a dihedral angle of not less than 50 degrees. A triphenylamine skeleton is especially preferred as a center skeleton, and an aryl group on the triphenylamine is preferably a substituted or unsubstituted phenyl group. Herein, the phenyl group preferably has a substituent on the meta or para position. The substituent on the meta or para position of the phenyl group provides high excited triplet energy, and contributes to stabilization of the molecule.

Examples of the triarylamine compound include a triarylamine compound represented by formula 5 above.

In formula 5, $R_{960}$ through $R_{976}$ independently represent a hydrogen atom or a substituent, provided that at least one of $R_{960}$ and $R_{961}$ is a substituent, and at least one of $R_{963}$ and $R_{964}$ is a substituent; and $L_1$ represents a chemical bond or a divalent linkage group. $L_1$ is preferably alkylene (for example, ethylene, propylene or butylene), cycloalkylene (for example, cyclopentylene, cyclohexylidene or cyclohexylene), fluoroalkylene (for example, fluoroethylene, fluoropropylene or fluorobutylene), arylene (for example, phenylene) or heteroarylene (for example, furanediyl or pyridinediyl).

In formula 5, a substituent is not required at the o-position of the phenyl group of the triphenylamine. Further, when $L_1$ is arylene or heteroarylene, which extends the conjugation length, at least one of $R_{960}$ through $R_{964}$ is preferably a substituent for providing steric limitation to the molecular structure.

Examples of the triarylamine compound include a triarylamine compound represented by formula 6 above.

In formula 6, $R_{960}$ through $R_{976}$ independently represent a hydrogen atom or a substituent; and $L_2$ represents a divalent linkage group such as an alkylene group (for example, ethylene, propylene or butylene), a cycloalkylene group (for example, cyclopentylene, cyclohexylidene or cyclohexylene), or a fluoroalkylene group (for example, fluoroethylene, fluoropropylene or fluorobutylene).

The presence of the non-conjugate divalent linkage group eliminates incorporation of a substituent for steric limitation. In the invention, the non-conjugate divalent linkage group provides the same effects as denoted above. In this case, a substituent is not required at the 2- or 6-position of the phenyl group of the triphenylamine, as described above.

Examples of the triarylamine compound include a triarylamine compound represented by formula 7 above.

In formula 7, $Ar_{501}$ through $Ar_{503}$ independently represent a substituted or unsubstituted aryl group or a substituted or unsubstituted heteroaryl group; n is an integer of from 1 to 3; and $B_2$ represents formula 8 above.

In formula 8, $X_5$ through $X_8$ independently represent N or C—$R_{501}$ in which $R_{501}$ represents a hydrogen atom or a substituent, provided that at least one of $X_5$ and $X_6$ is C—$R_{501}$ in which $R_{501}$ represents a substituent, and at least one of $X_7$ and $X_8$ is C—$R_{501}$ in which $R_{501}$ represents a substituent. The triarylamine compound having this structure increases stability and durability of the organic electroluminescent element.

Examples of the triarylamine compound include a triarylamine compound represented by formula 9 above.

In formula 9, $R_{833}$ through $R_{874}$ independently represent a hydrogen atom or a substituent, provided that any one of $R_{833}$ and $R_{834}$ is a substituent, any one of $R_{835}$ and $R_{836}$ is a substituent, any one of $R_{837}$ and $R_{838}$ is a substituent, any one of $R_{839}$ and $R840$ is a substituent, any one of $R_{841}$ and $R_{842}$ is a substituent, or any one of $R_{843}$ and $R_{844}$ is a substituent.

In the phenylenediamine skeleton of formula 9, incorporation of a steric hindrance-providing group to the phenylenediamine can shift a 0-0 band of the phosphorescence spectra to a shorter wavelength (increase excited triplet energy). As described above, it is preferred in the triphenylamine skeleton that a substituent is incorporated at the position other than the 2- or 6-posision of the phenyl group of the triphenylamine skeleton. Incorporation of a substituent to the phenylenediamine skeleton improves stability of the molecule.

Examples of the triarylamine compound include a triarylamine compound comprising a terminal group represented by the formula 10-1, 10-2, 10-3 or 10-4 above.

In formula 10-1, 10-2, 10-3 or 10-4, $X_9$ and $X_{10}$ independently represent N, O, S or $CR_{611}$ in which $R_{611}$ represents a hydrogen atom or a substituent, provided that at least one of $X_9$ and $X_{10}$ represents $CR_{611}$ in which $R_{611}$ represents a substituent; $Z_{601}$ represents an atomic group necessary to form an aromatic hydrocarbon ring or an aromatic heterocyclic ring; $R_{601}$ through $R_{605}$ independently represent a hydrogen atom or a substituent, provided that at least one of $R_{601}$ and $R_{605}$ is a substituent; and $R_{606}$ through $R_{610}$ independently represent a substituent.

Examples of the substituent recited in formulae 3, 4-1, 4-2, 5, 6, 8, 9, 10-1, 10-2, 10-3 and 10-4 are the same as those denoted in $R_{11}$ through $R_{13}$ in formula 1.

Examples of $Ar_{301}$ in formula 2, $Ar_{801}$ through $Ar_{803}$ in formula 4-1, and $Ar_{501}$ through $Ar_{503}$ in formula 7 are the same as those denoted in $Ar_{11}$ through $Ar_{13}$ in formula 1 above.

The ortho or para position of the end group of a compound, particularly of triphenylamine derivatives or phenylenediamine derivatives is likely to be deteriorated. Accordingly, incorporation of a substituent to such a position can effectively increase stability of the compound. The present invention is characterized in that a hole transporting material having a high excited triplet energy is used, but such a hole transporting material has a wide band gap, and is not necessarily a compound with high stability. Accordingly, such an incorporation of a substituent described above effectively is extremely effective in view of high durability of an organic electroluminescent element. An unsubstituted triphenylamine is considered to be suitably used, however, it is easily crystallized and good results cannot be obtained.

Examples of the triarylamine compound include a triarylamine compound represented by the following formula 16-1 or 16-2.

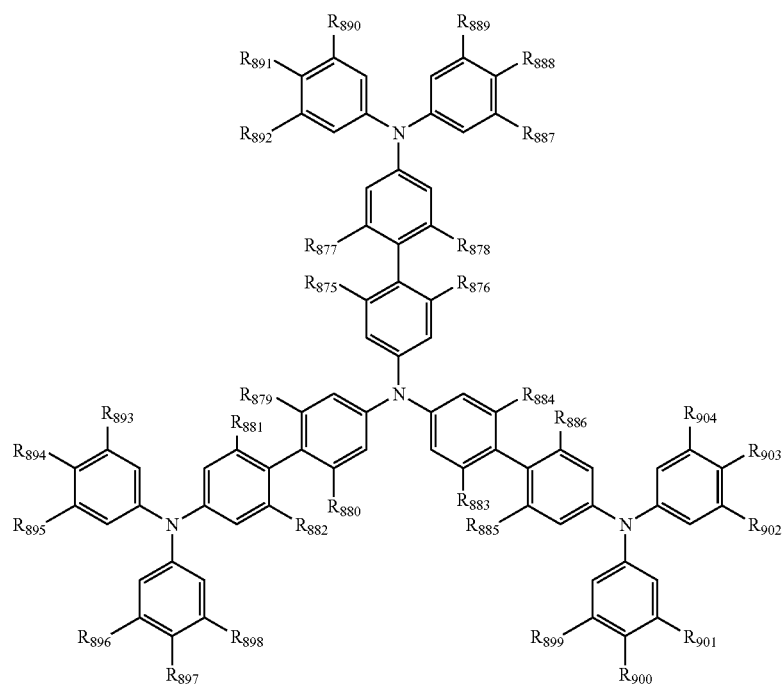

Formula 16-1

-continued

Formula 16-2

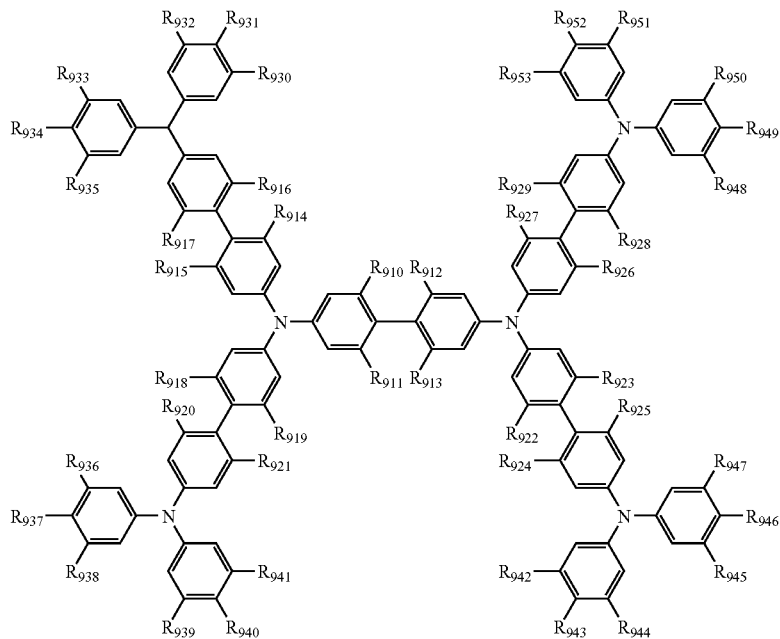

In formula 16-1 or 16-2, $R_{875}$ through $R_{953}$ independently represent a hydrogen atom or a substituent, provided that at least one of $R_{875}$ and $R_{878}$ is a substituent, at least one of $R_{879}$ and $R_{882}$ is a substituent, and at least one of $R_{883}$ and $R_{886}$ is a substituent; and $R_{910}$ through $R_{953}$ independently represent a hydrogen atom or a substituent, provided that at least one of $R_{910}$ and $R_{913}$ is a substituent, at least one of $R_{914}$ and $R_{917}$ is a substituent, at least one of $R_{918}$ and $R_{921}$ is a substituent, at least one of $R_{922}$ and $R_{922}$ is a substituent, and at least one of $R_{926}$ and $R_{929}$ is a substituent.

Exemplified compounds of the triarylamine compound will be listed below, but the invention is not specifically limited thereto.

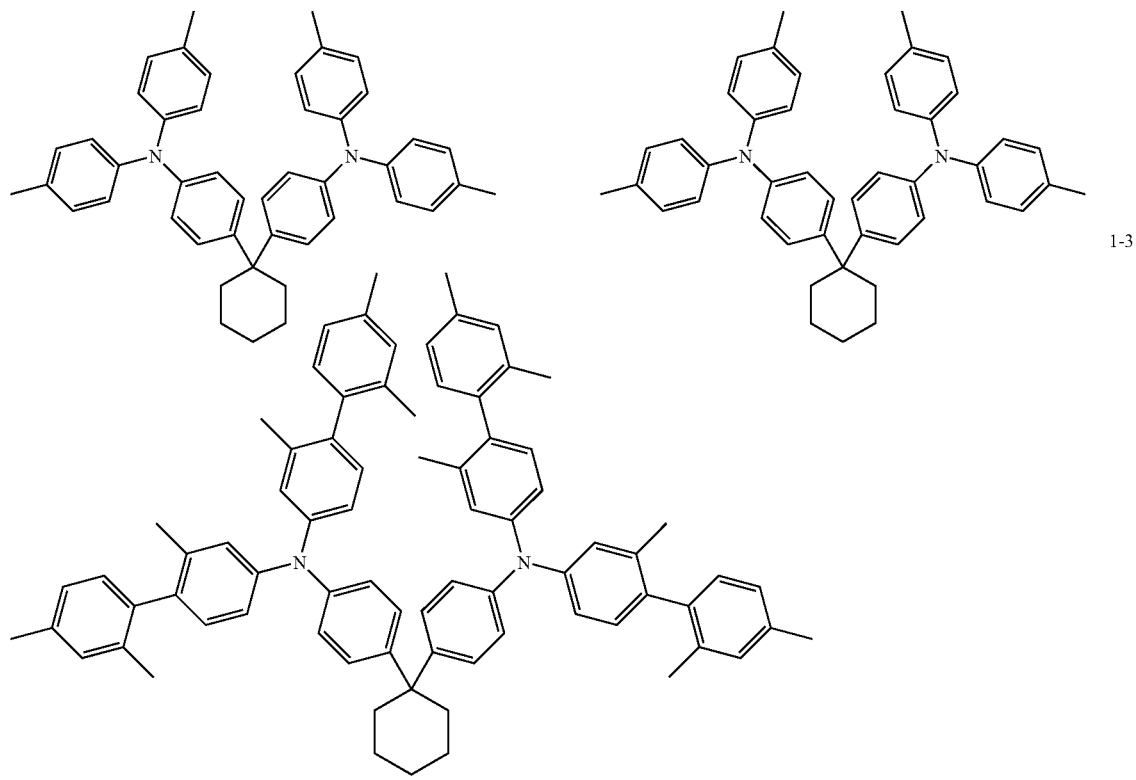

-continued
1-4
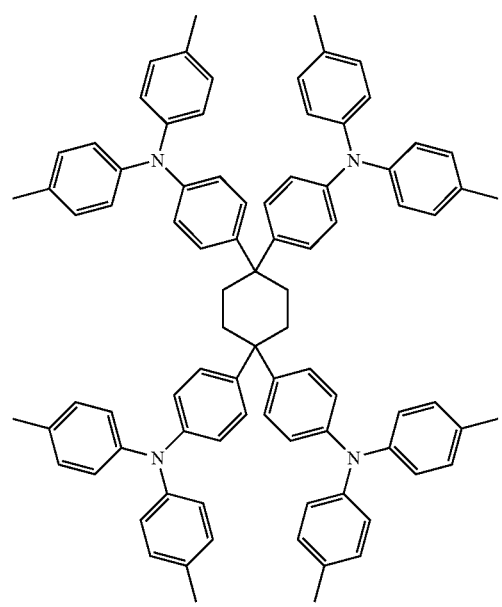
1-5
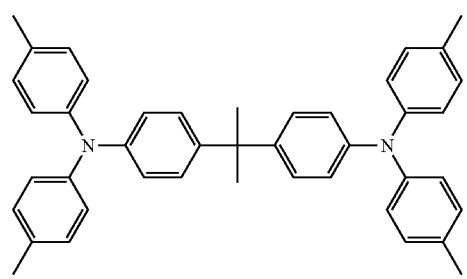
1-6
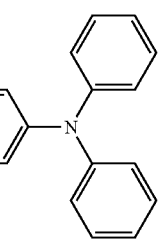
1-7
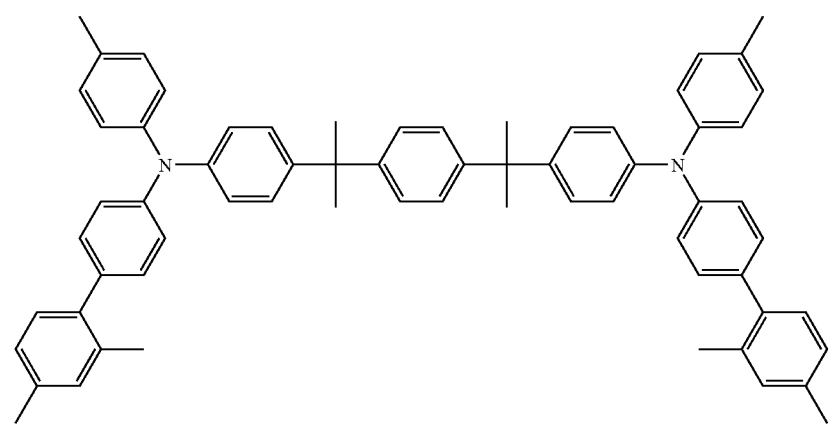

1-8
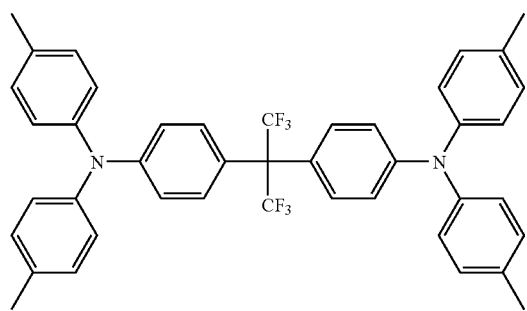
1-9
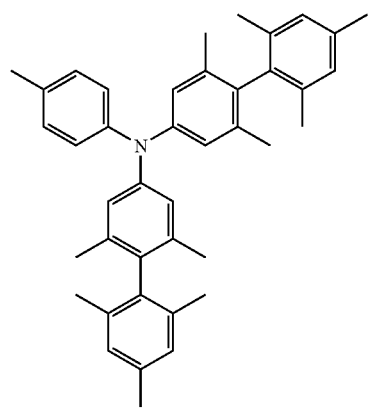
1-10
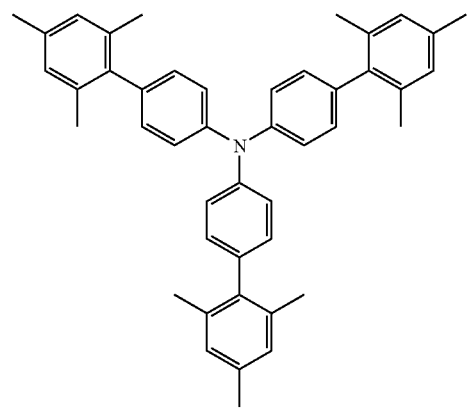
1-11
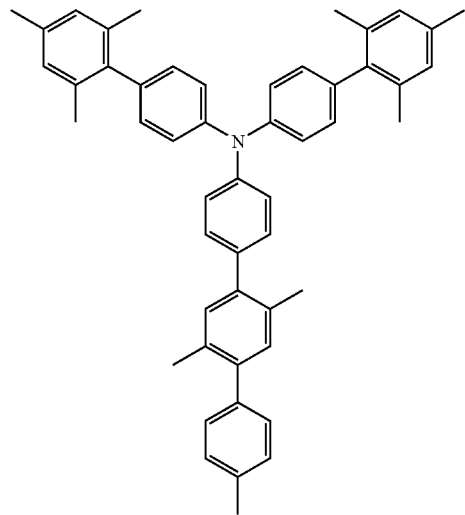

1-12
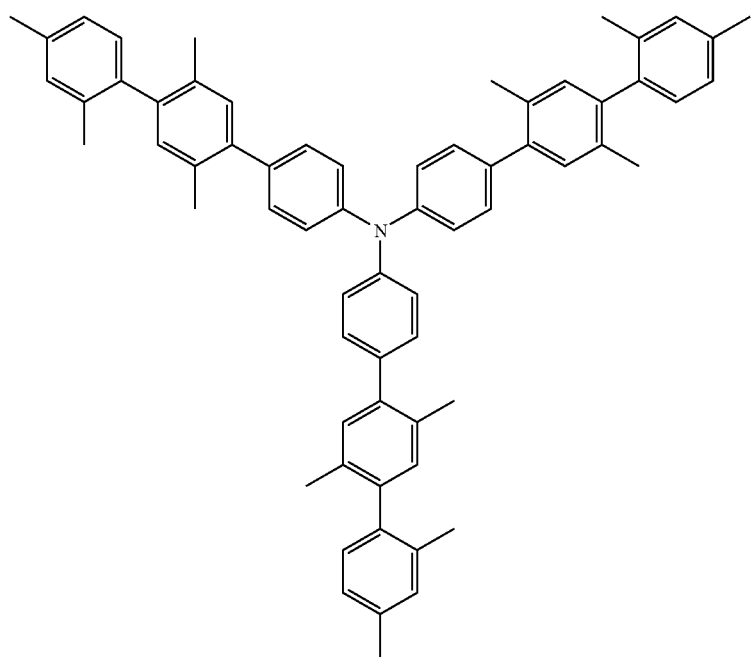
1-13
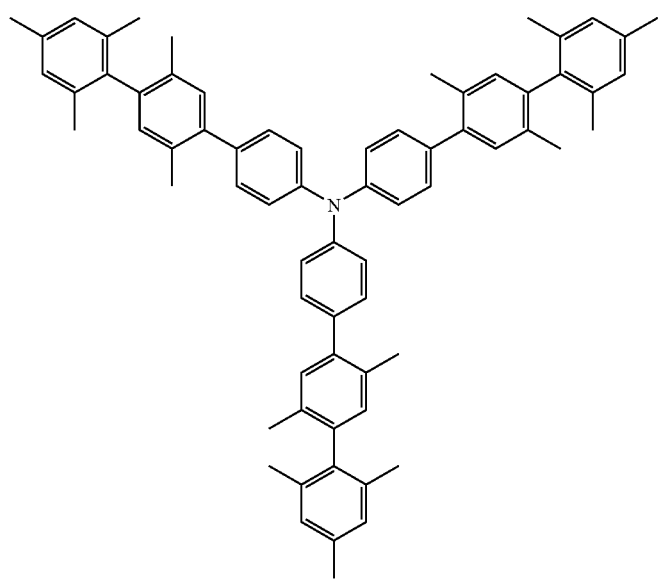

-continued
1-14
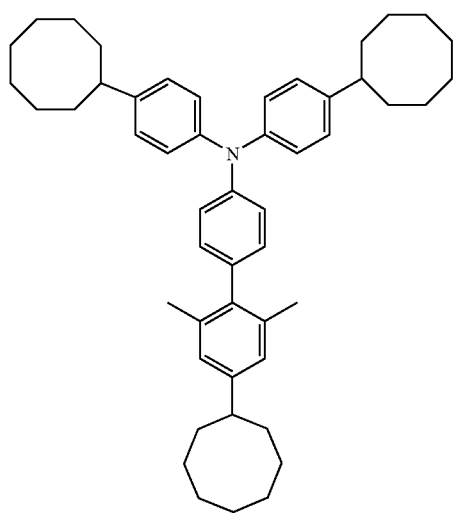
1-15
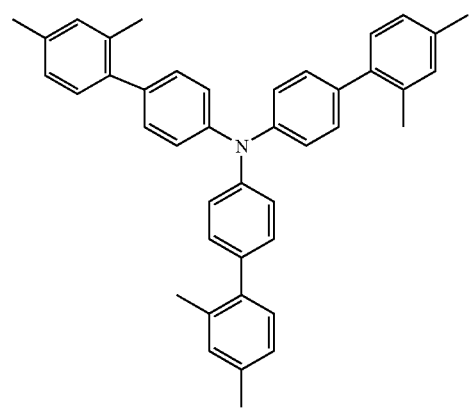
1-16
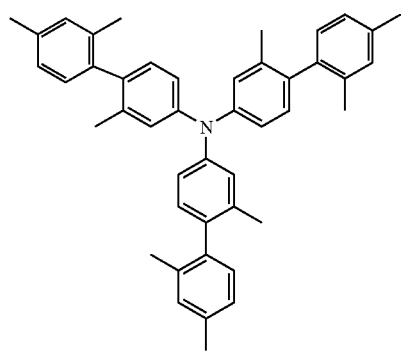
1-17
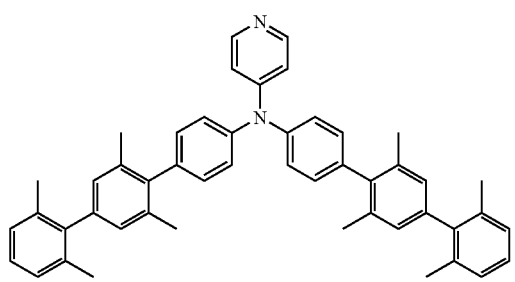
1-18
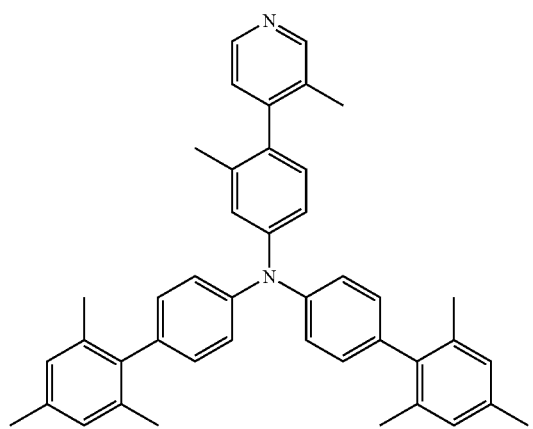
1-19
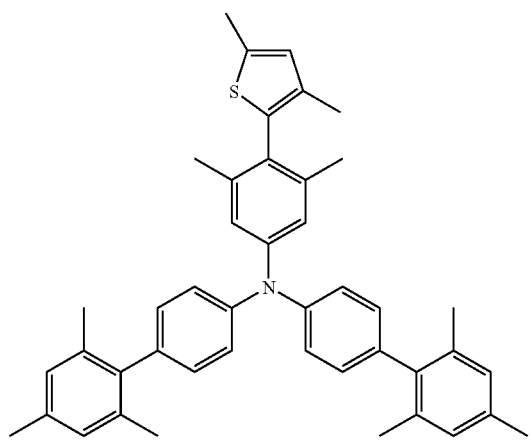

-continued
1-20
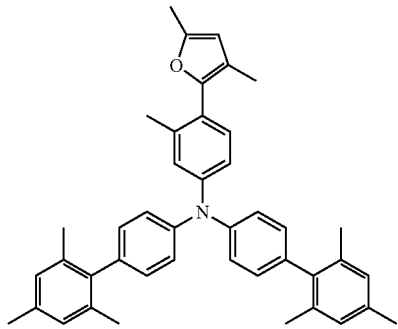
1-21
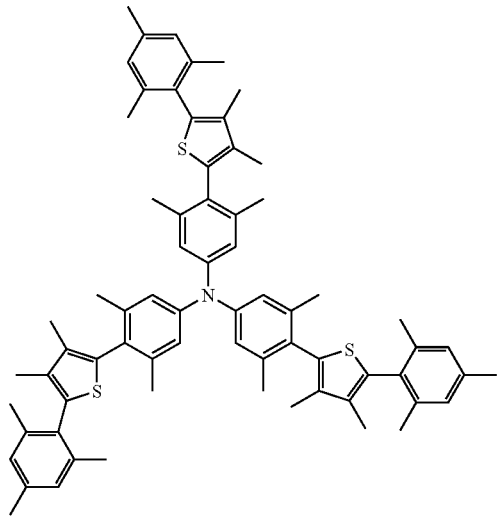
1-22
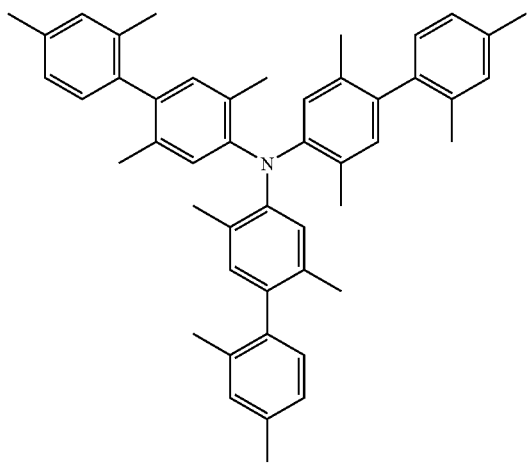
1-23
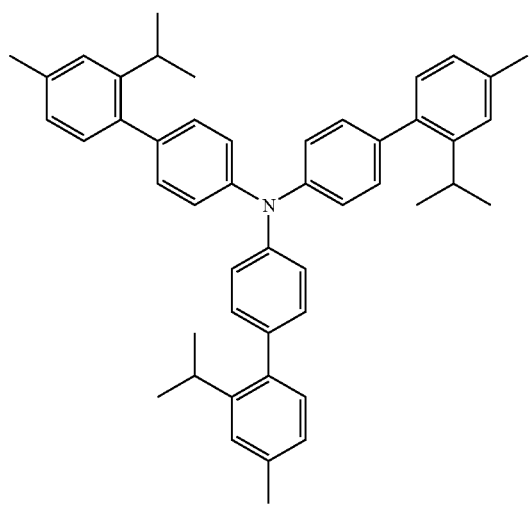
1-24
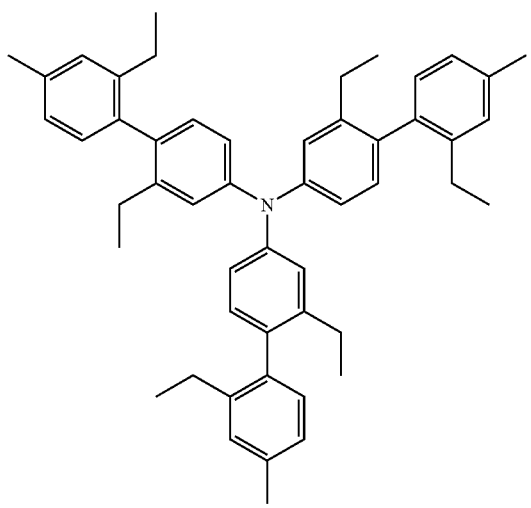
1-25
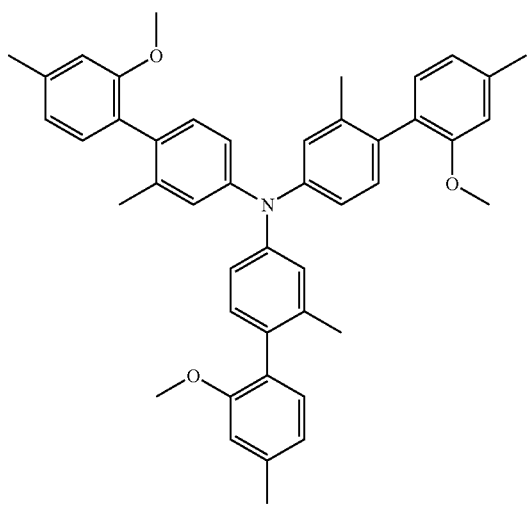

-continued
1-26
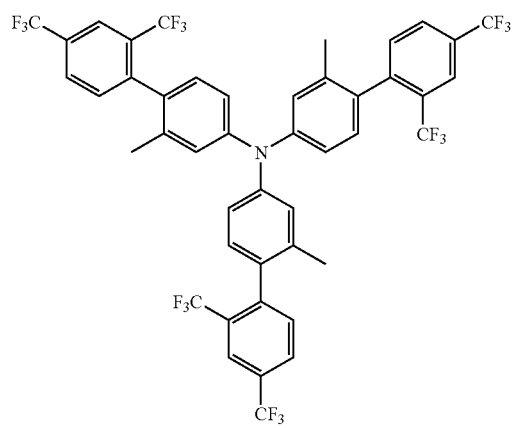
1-27
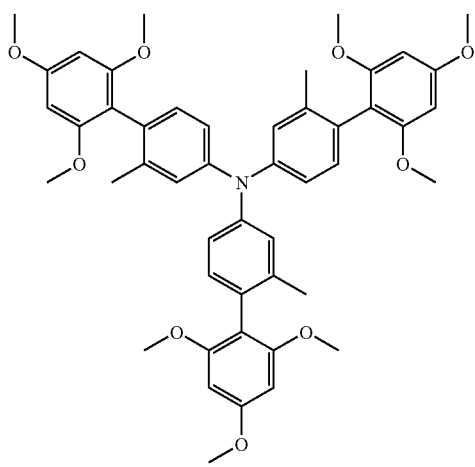
1-28
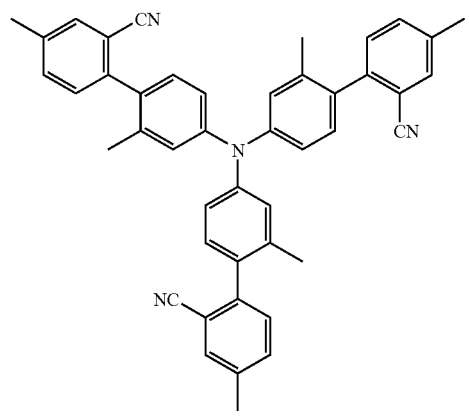
1-29
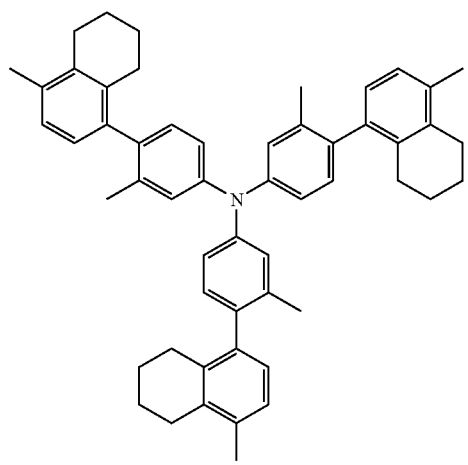
1-30
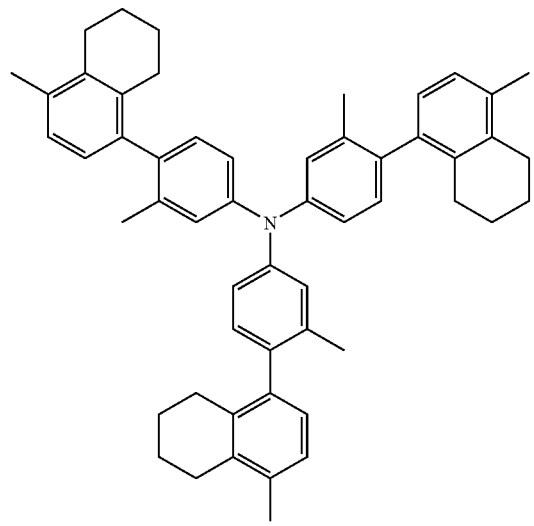
1-31
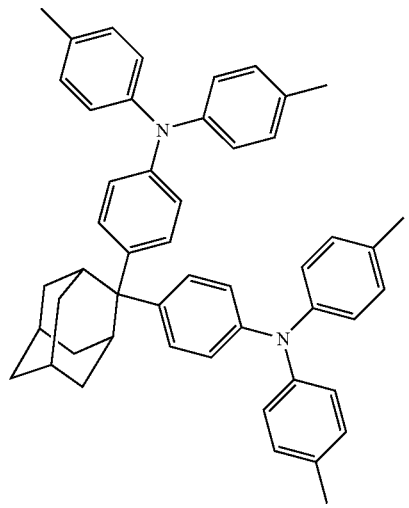

-continued
1-32
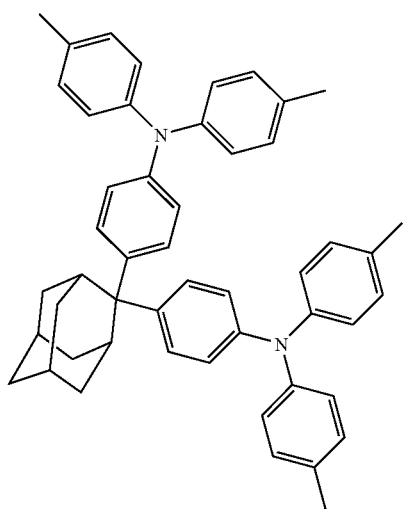
1-33
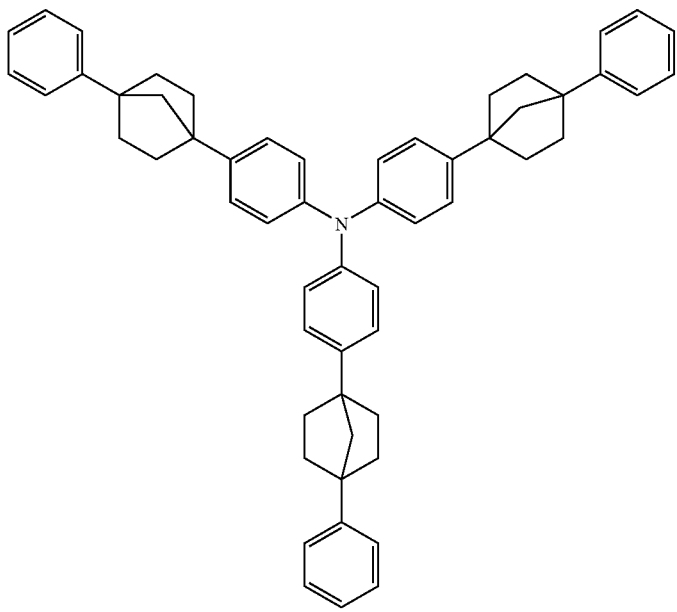
1-34
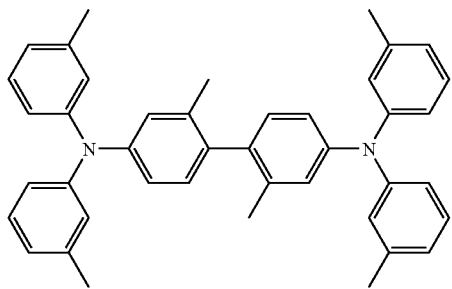
1-35
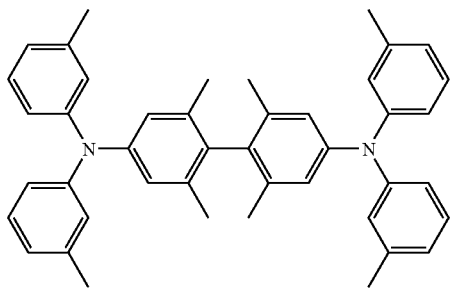

-continued
1-36
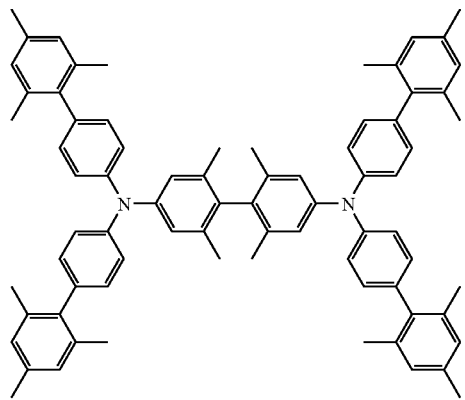
1-37
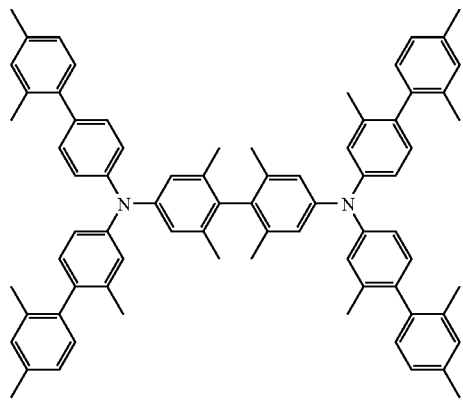
1-38
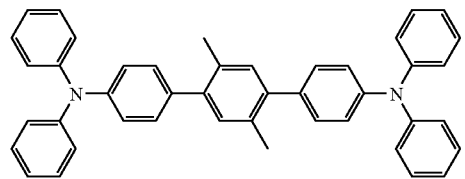
1-39
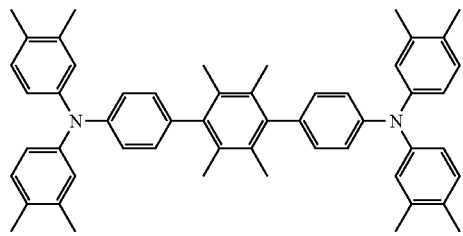
1-40
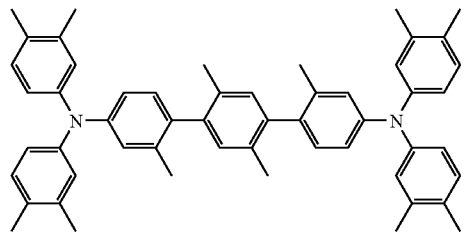
1-41
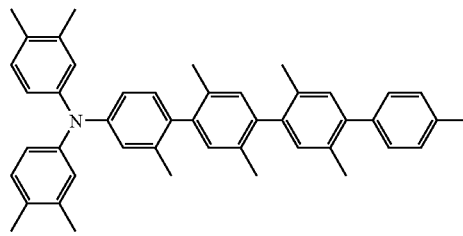
1-42
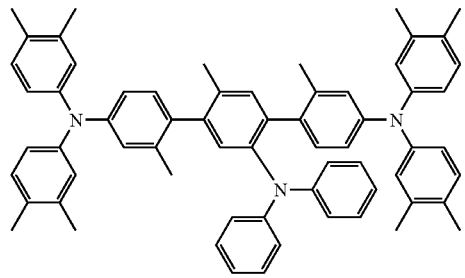
1-43
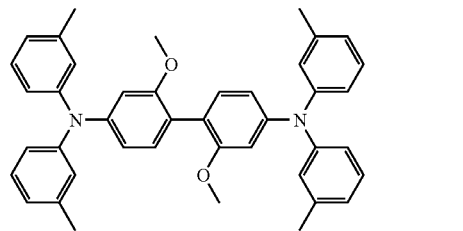
1-44
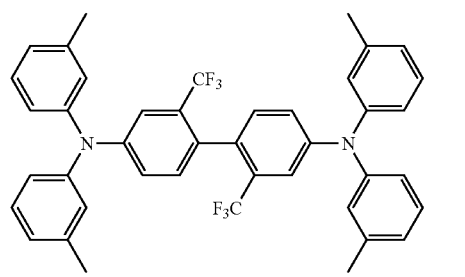
1-45
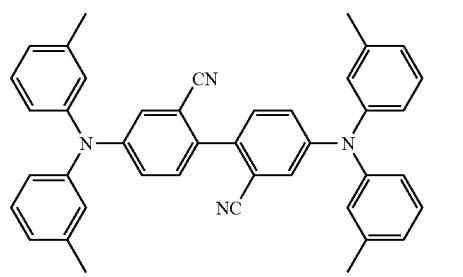

-continued
1-46
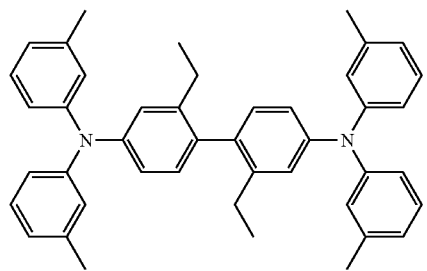
1-47
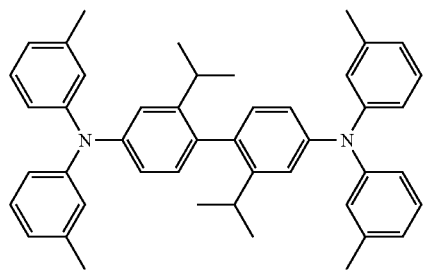
1-48
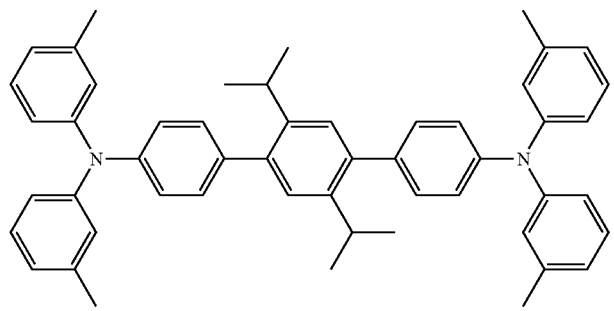
1-49
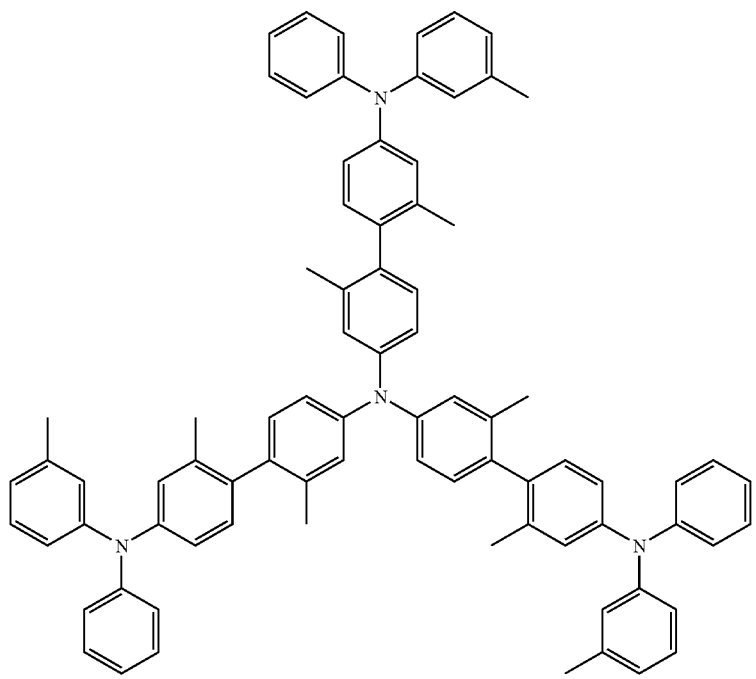

-continued
1-50
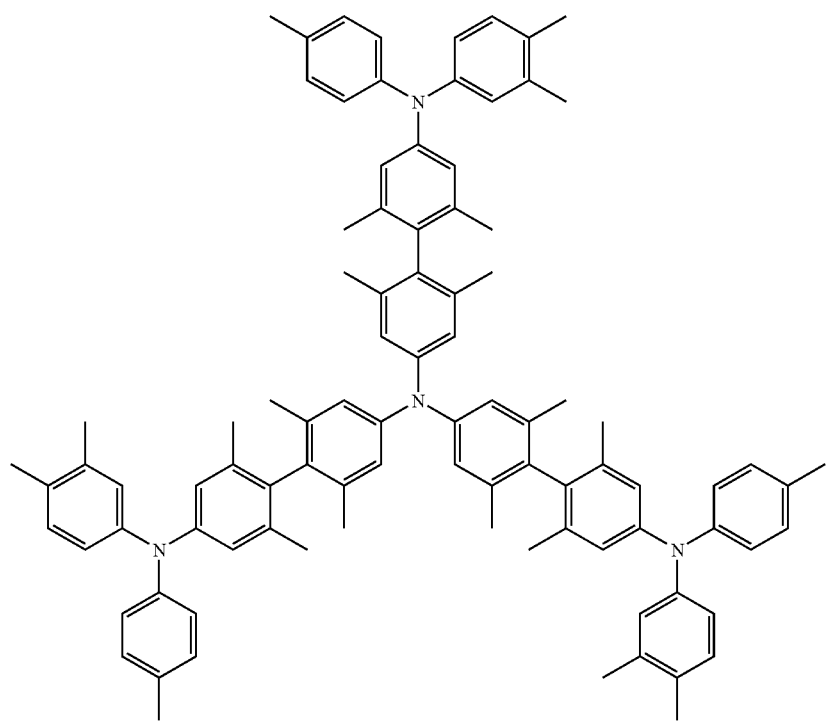
1-51
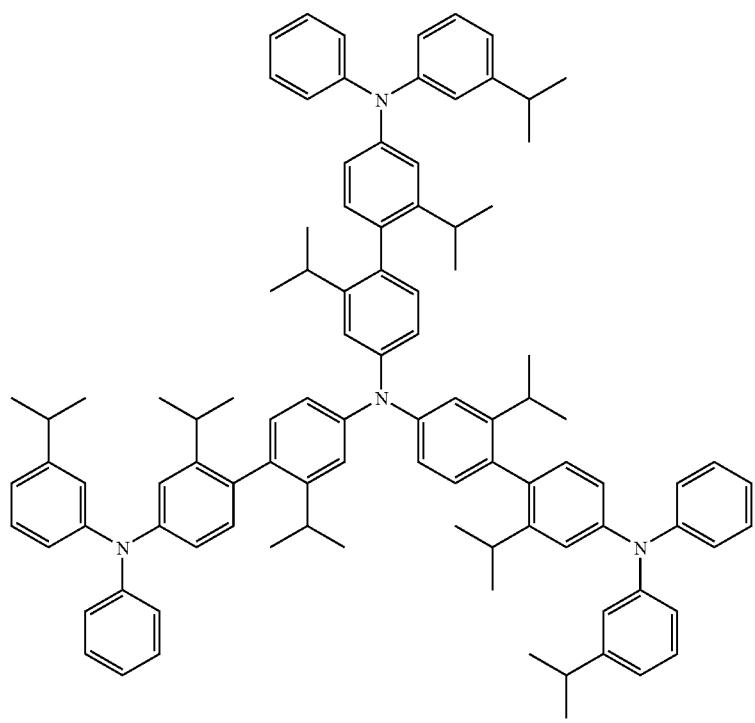

1-52
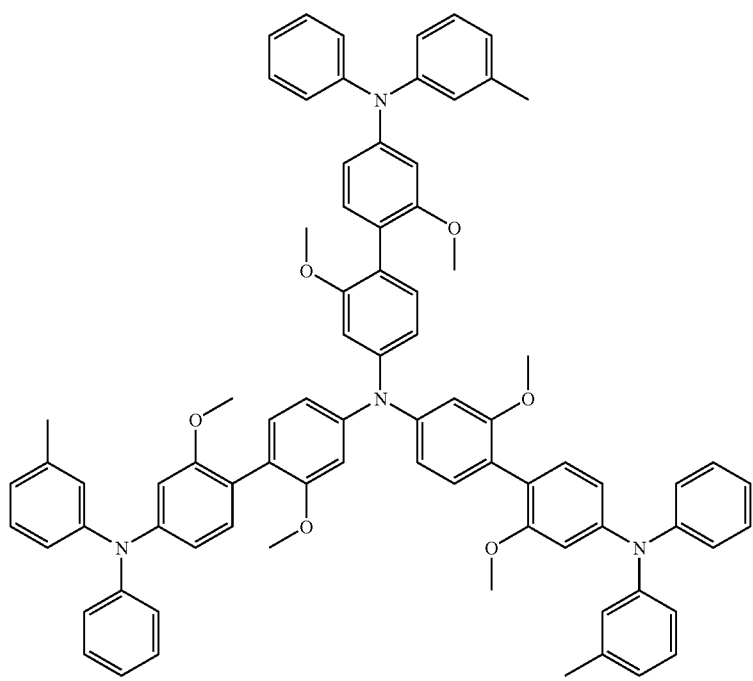
1-53
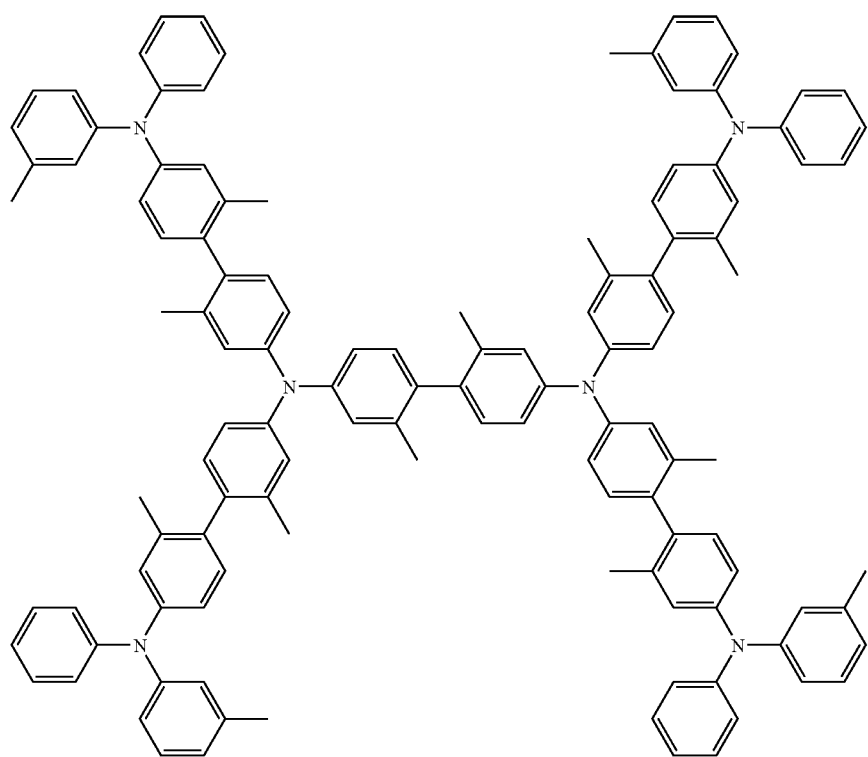

1-54
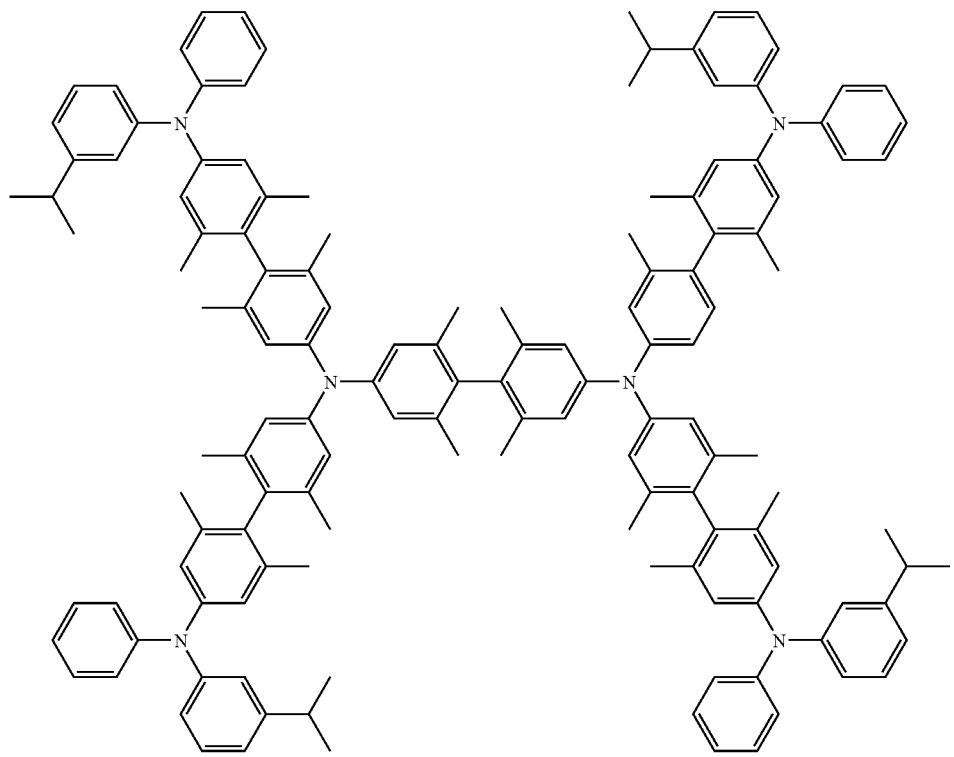
1-55
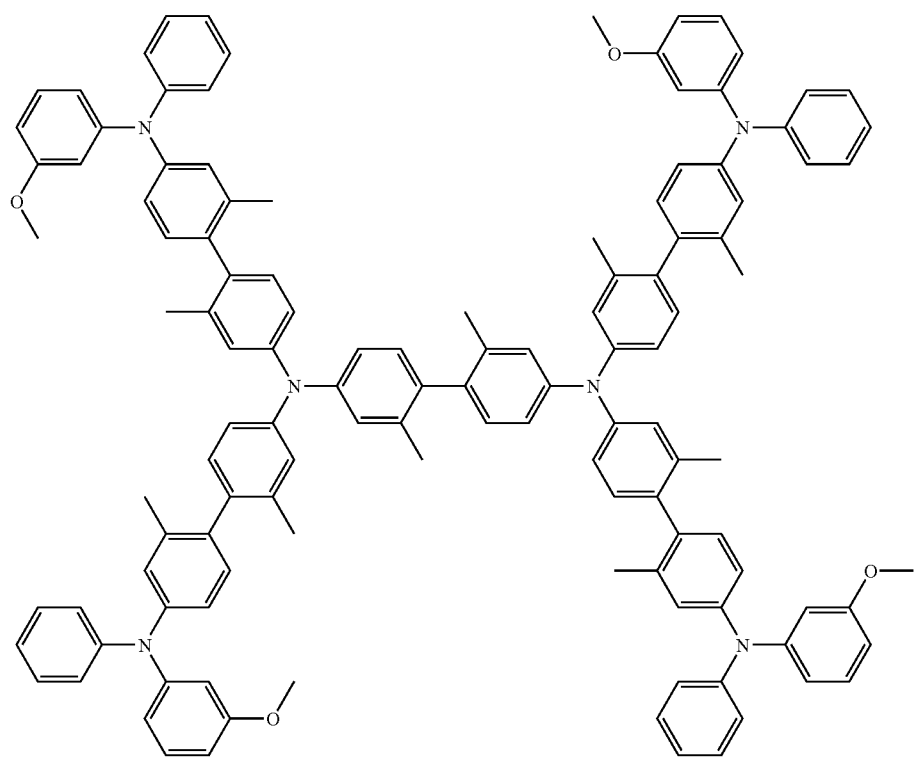

1-56
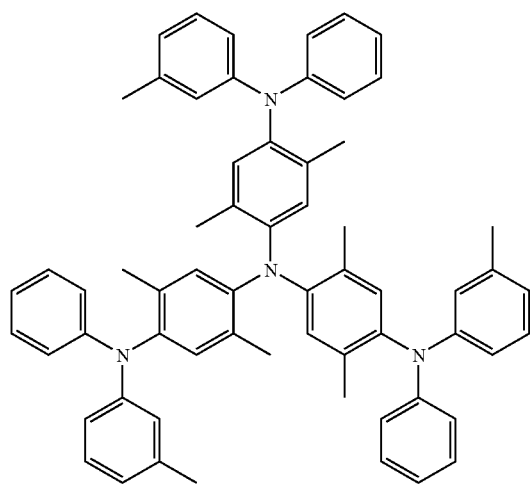
1-57
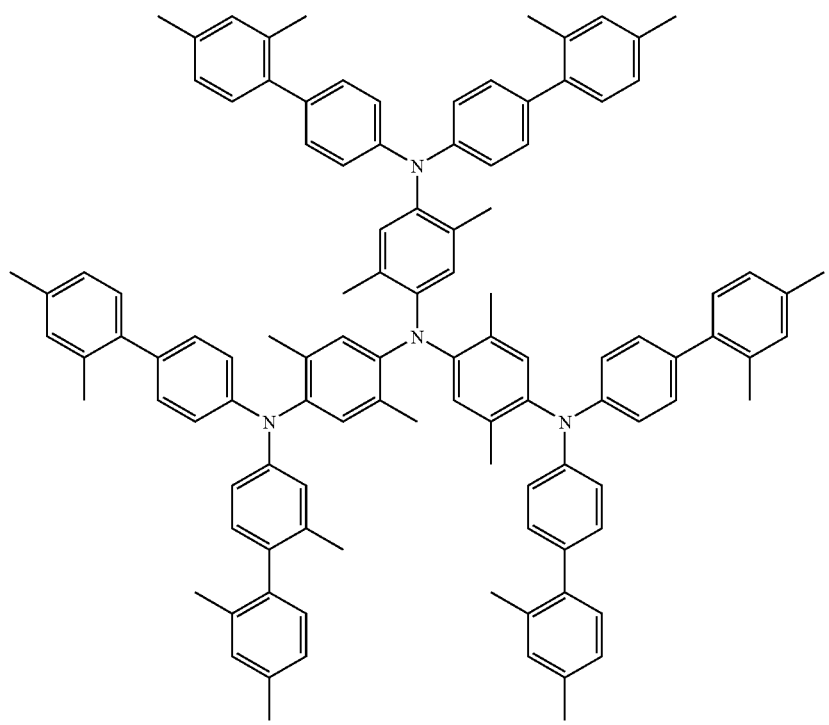

-continued
1-58
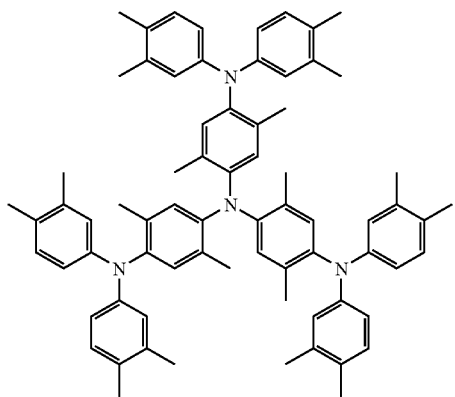
1-59
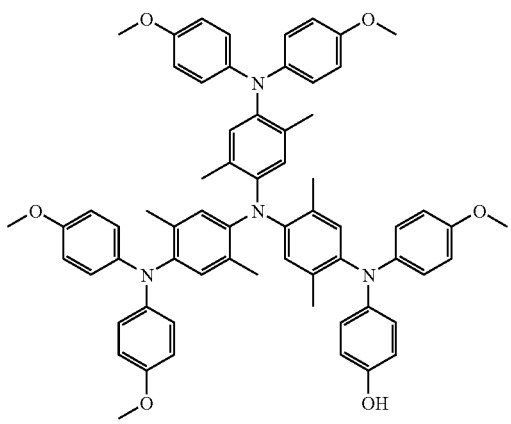
1-60
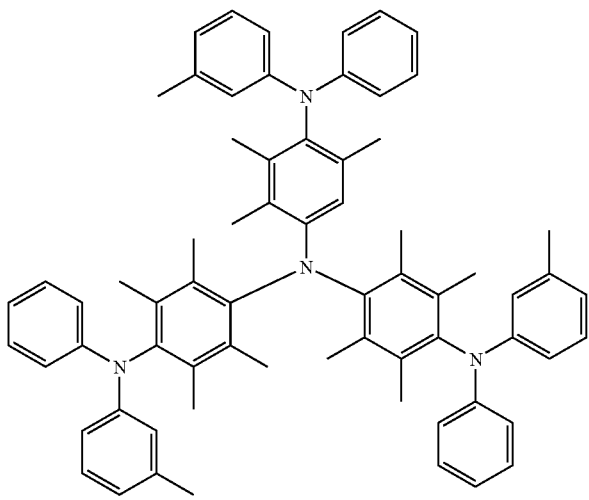
1-61
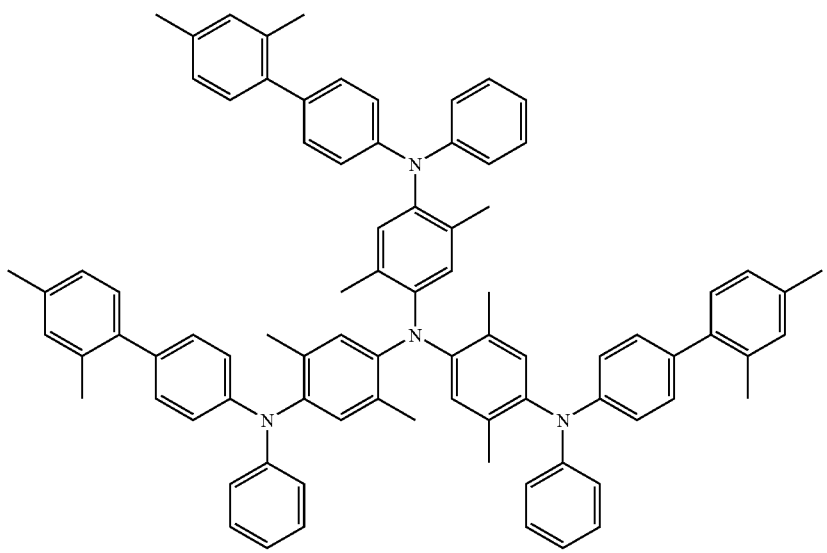

The triphenylamine compound has a phosphorescence emission wavelength of preferably from 300 to 450 nm, and more preferably from 350 to 430 nm, whereby emission efficiency is further increased.

The triphenylamine compound has a molecular weight of preferably from 550 to 2000. The triphenylamine compound with a molecular weight of from 550 to 2000 increases Tg (glass transition temperature), increases thermal stability, and lengthens lifetime. The molecular weight of the triphenylamine compound is more preferably from 800 to 2000.

In the invention, the hole transporting material is preferably a triarylamine compound. Besides the triarylamine compound, in a compound having a phenylenediamine skeleton incorporation of a substituent to the phenylenediamine skeleton can provide a 0-0 band of the phosphorescence spectra of from 300 to 450 nm. The hole transporting material in the invention is not limited to the above described compound, as long as it provides a 0-0 band of the phosphorescence spectra of from 300 to 450 nm.

<<Component Layer of Organic EL Element>>

The component layer of the organic EL element of the invention will be explained below.

In the invention, preferred examples of the component layer of the organic EL element of the invention will be shown below, but the invention is not limited thereto.

(i): Anode/Light emission layer/Electron transporting layer/Cathode (ii): Anode/Hole transporting layer/Light emission layer/Electron transporting layer/Cathode (iii): Anode/Hole transporting layer/Light emission layer/Hole blocking layer/Electron transporting layer/Cathode (iv): Anode/Hole transporting layer/Light emission layer/Hole blocking layer/Electron transporting layer/Cathode buffering layer/Cathode (v): Anode/Anode buffering layer/Hole transporting layer/Light emission layer/Hole blocking layer/Electron transporting layer/Cathode buffering layer/Cathode <<Anode>>

For the anode of the organic EL element, a metal, an alloy, or an electroconductive compound each having a high working function (not less than 4 eV), and mixture thereof are preferably used as the electrode material. Concrete examples of such an electrode material include a metal such as Au, and a transparent electroconductive material such as CuI, indium tin oxide (ITO), $SnO_2$, or ZnO, and a material capable of forming an amorphous and transparent conductive layer such as IDIXO ($In_2O_3$—ZnO). The anode may be prepared by forming a thin layer of the electrode material according to a depositing or spattering method, and by forming the layer into a desired pattern according to a photolithographic method. When required precision of the pattern is not so high (not less than 100 μm), the pattern may be formed by depositing or spattering of the electrode material through a mask having a desired form. When light is emitted through the anode, the transmittance of the anode is preferably 10% or more, and the sheet resistance of the anode is preferably not more than several hundred $\Omega/\square$. The thickness of the layer is ordinarily within the range of from 10 nm to 1 μm, and preferably from 10 to 200 nm, although it may vary due to kinds of materials used.

<<Cathode>>

On the other hand, for the cathode, a metal (also referred to as an electron injecting metal), an alloy, and an electroconductive compound each having a low working function (not more than 4 eV), and a mixture thereof is used as the electrode material. Concrete examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal. Among them, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture, lithium/aluminum mixture, or aluminum is suitable from the view point of the electron injecting ability and resistance to oxidation. The cathode can be prepared forming a thin layer of such an electrode material by a method such as a deposition or spattering method. The sheet resistance as the cathode is preferably not more than several hundred $\Omega/\square$, and the thickness of the layer is ordinarily from 10 nm to 1 μm, and preferably from 50 to 200 nm. It is preferable in increasing the light emission efficiency that either the anode or the cathode of the organic EL element is transparent or semi-transparent.

After a layer of the metal described above as a cathode is formed to give a thickness of from 1 to 20 nm, a layer of the transparent electroconductive material as described in the anode is formed on the resulting metal layer, whereby a transparent or semi-transparent cathode can be prepared. Employing the cathode, an element can be manufactured in which both anode and cathode are transparent.

Next, an injecting layer, a blocking layer, and an electron transporting layer used in the component layer of the organic EL element of the invention will be explained.

<<Injecting Layer>>: Electron Injecting Layer, Hole Injecting Layer

The injecting layer is optionally provided, for example, an electron injecting layer or a hole injecting layer, and may be provided between the anode and the light emission layer or hole transporting layer, and between the cathode and the light emission layer or electron transporting layer as described above.

The injecting layer herein referred to is a layer provided between the electrode and an organic layer in order to reduce the driving voltage or to improve of light emission efficiency. As the buffer layer there are a hole injecting layer (an anode buffer layer) and an electron injecting layer (a cathode buffer layer), which are described in "Electrode Material" page 123, Div. 2 Chapter 2 of "Organic EL element and its frontier of industrialization" (published by NTS Corporation, Nov. 30, 1998) in detail.

The anode buffer layer (hole injecting layer) is described in Japanese Patent O.P.I. Publication Nos. 9-45479, 9-260062, and 8-288069 etc., and its examples include a phthalocyanine buffer layer represented by a copper phthalocyanine layer, an oxide buffer layer represented by a vanadium oxide layer, an amorphous carbon buffer layer, a polymer buffer layer employing an electroconductive polymer such as polyaniline (emeraldine), and polythiophene, etc.

The cathode buffer layer (electron injecting layer) is described in Japanese Patent O.P.I. Publication Nos. 6-325871, 9-17574, and 9-74586, etc. in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide. The buffer layer (injecting layer) is preferably very thin and has a thickness of preferably from 0.1 to 100 nm depending on kinds of the material used.

<<Blocking Layer>>: Hole Blocking Layer, Electron Blocking Layer

The blocking layer is a layer provided if necessary in addition to the fundamental configuration layers as described above, and is for example a hole blocking layer as described in Japanese Patent O.P.I. Publication Nos. 11-204258, and 11-204359, and on page 237 of "Organic EL element and its frontier of industrialization" (published by NTS Corporation, Nov. 30, 1998).

The hole blocking layer is an electron transporting layer in a broad sense, and is comprised of material having an ability of transporting electrons but an extremely poor ability of holes, which can increase a recombination probability of electrons and holes by transporting electrons and blocking holes.

On the other hand, the electron blocking layer is an hole transporting layer in a broad sense, and is comprised of material having an ability of transporting holes but an extremely poor ability of electrons, which can increase a recombination probability of electrons and holes by transporting holes and blocking electrons.

<<Light Emission Layer>>

The light emission layer in the invention is a layer where electrons and holes, injected from electrodes, an electron transporting layer or a hole transporting layer, are recombined to emit light. The portions where light emits may be in the light emission layer or at the interface between the light emission layer and the layer adjacent thereto.

A material (hereinafter also referred to as light emission material) used in the light emission layer is a phosphorescent compound, and the phosphorescent compound in the invention is a compound which emits light from the excited triplet, can emit phosphorescence at room temperature (25° C.), and has a phosphorescent quantum yield at 25° C. of not less than 0.01. The phosphorescent quantum yield at 25° C. is preferably not less than 0.1.

The phosphorescent quantum yield can be measured according to a method described in the fourth edition "Jikken Kagaku Koza 7", Bunko II, page 398 (1992) published by Maruzen. The phosphorescent quantum yield can be measured in a solution employing various kinds of solvents. The phosphorescent compound used in the invention is a compound, in which the phosphorescent quantum yield measured employing any one of the solvents falls within the above-described range.

The light emission of the phosphorescent compound is divided in two types in principle, one is an energy transfer type in which recombination of a carrier occurs on the host to which the carrier is transported to excite the host, the resulting energy is transferred to the phosphorescent compound, and light is emitted from the phosphorescent compound, and the other is a carrier trap type in which recombination of a carrier occurs on the phosphorescent compound, a carrier trap material, and light is emitted from the phosphorescent compound. However, in each type, energy level of the phosphorescent compound in excited state is lower than that of the host in excited state.

The phosphorescent compound is suitably selected from those used in the light emission layer of an organic EL element.

The phosphorescent compound used in the invention is preferably a metal complex containing a metal belonging to a group VIII of the periodic table as a center metal, and is more preferably an iridium compound, an osmium compound, a platinum compound (a platinum complex) or a rare earth compound, and most preferably an iridium compound.

Examples of the phosphorescent compound used in the invention will be listed below, but the invention is not limited thereto. These compounds can be synthesized according to a method described in Inorg. Chem., 40, 1704-1711.

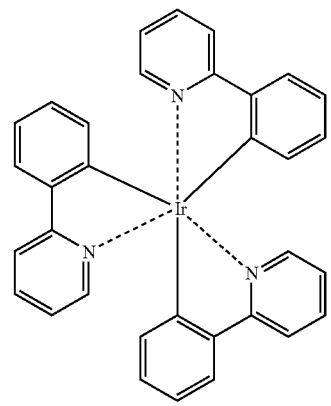

Ir-1

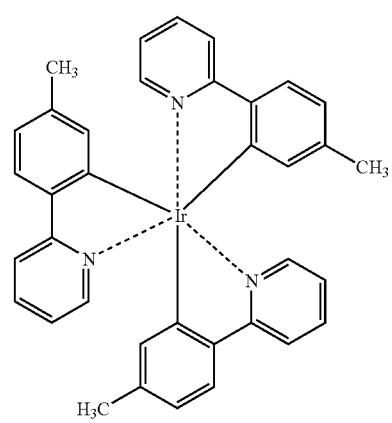

Ir-2

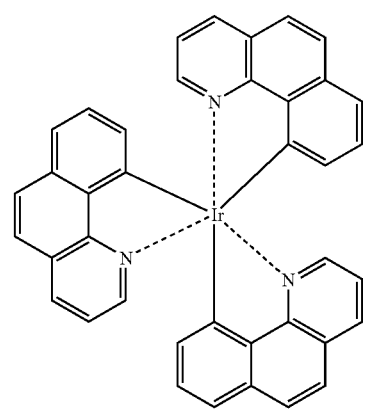

Ir-3

-continued
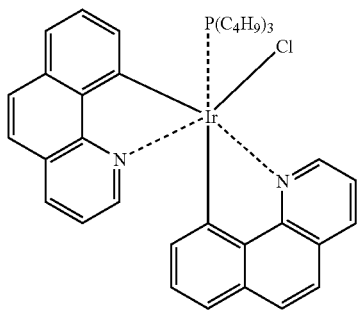
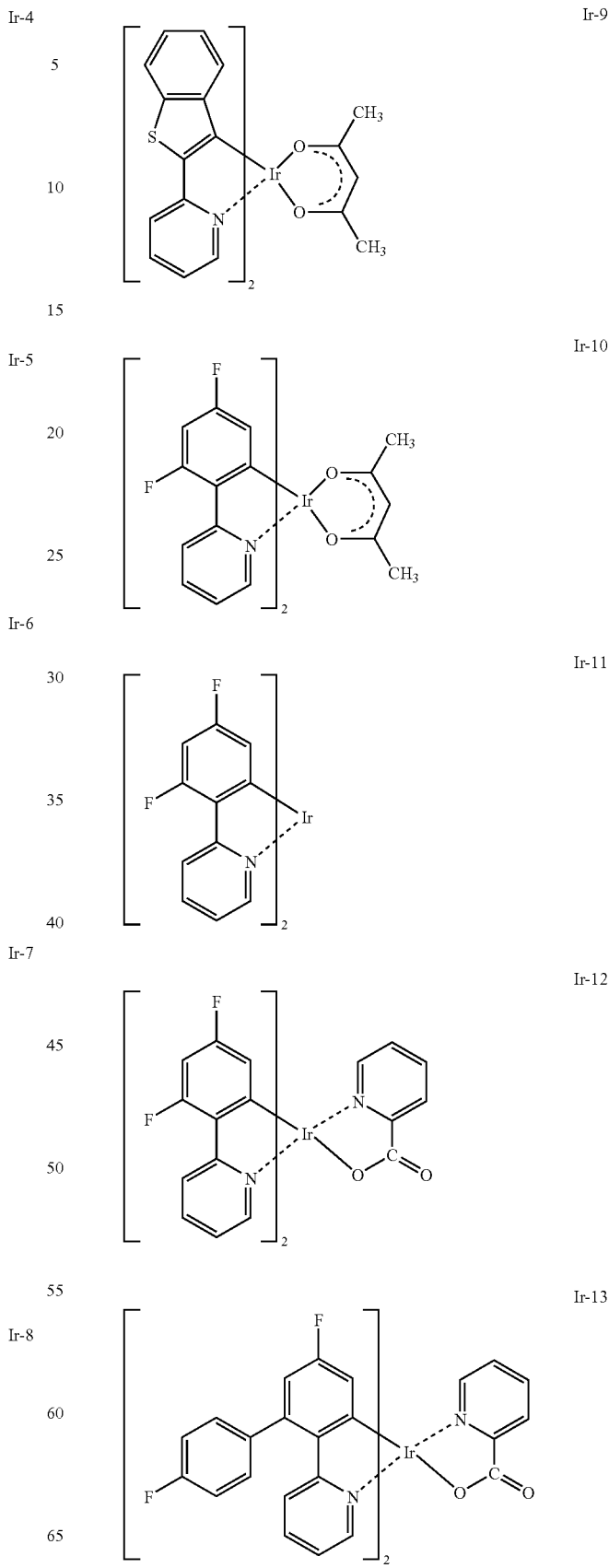

-continued
Pt-1 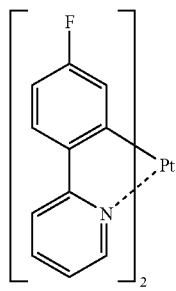
Pt-2 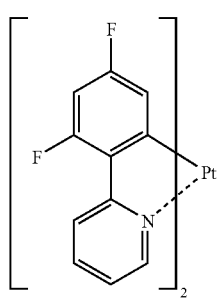
Pt-3 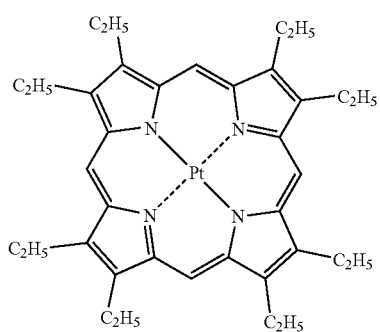
Pd-1 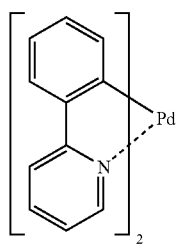
Pd-2 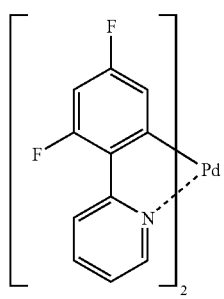
-continued
Pd-3 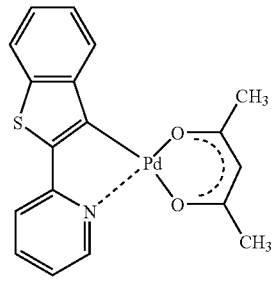
Rh-1 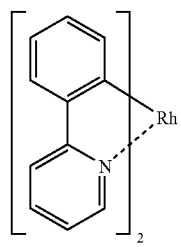
Rh-2 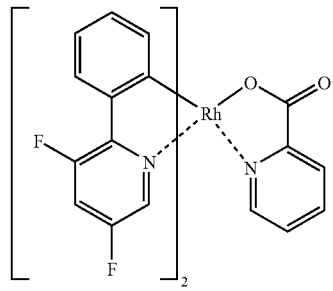
Rh-3 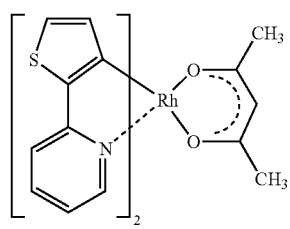
A-1 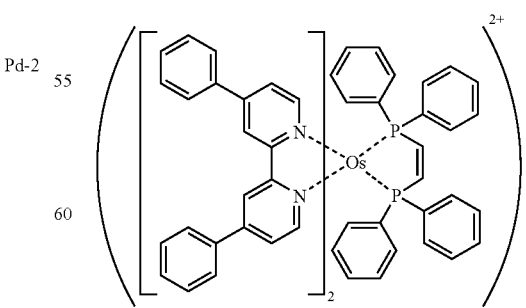

-continued

D-1

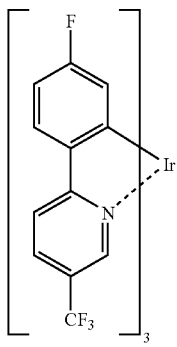

D-2

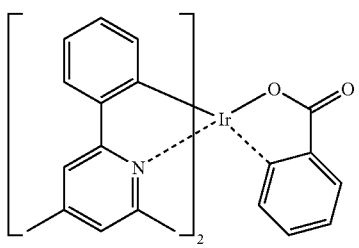

D-3

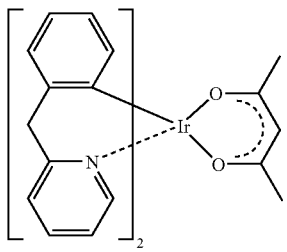

D-4

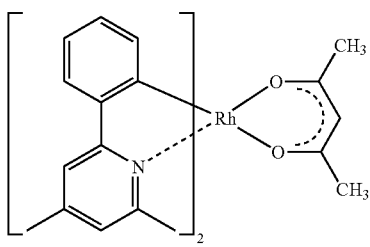

D-5

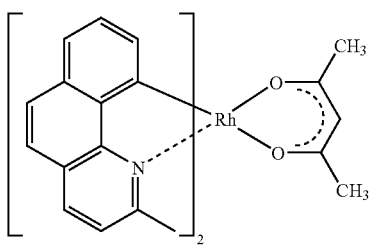

-continued

D-6

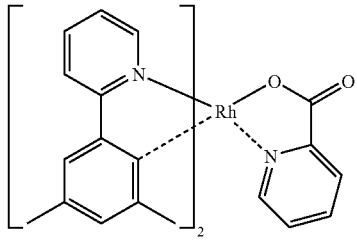

In the invention, the maximum phosphorescence wavelength of the phosphorescent compound is not specifically limited. Theoretically, the phosphorescence wavelength can be varied by selecting a center metal, a ligand, or a substituent of the ligand of complexes used. The phosphorescent compound is preferably a phosphorescent compound having a wavelength providing a phosphorescence maximum in the wavelength regions of from 380 to 430 nm. Such an organic electroluminescent element emitting a blue or white light phosphorescence can provide higher emission efficiency.

The light emission layer can contain a phosphorescent compound besides the host compound. The host compound in the light emission layer has a phosphorescence quantum yield at room temperature (25° C.) of less than 0.01.

The host compound is preferably an organic compound or a complex. In the invention, it is preferred that energy level at excited triplet state of the host compound is greater than that of the phosphorescent compound.

In the invention, the 0-0 band of the phosphorescence spectra of the host compound is preferably from 300 to 450 nm, which increases a visible light emission efficiency, and enables particularly a BGR emission.

Phosphorescence emission of energy transfer type, in which energy is transferred from the host compound to the phosphorescent compound can be carried out under the condition that energy level at excited triplet state of the host compound is greater than that of the phosphorescent compound. The host compound having a 0-0 band in the phosphorescence spectra of not more than 450 nm provides a wide energy gap (ionization potential-electron affinity, HOMO-LUMO), and advantageously works as the carrier trap type.

Such a host compound can be used optionally selecting from known materials used in the organic EL element, and many of the hole transporting materials or electron transporting materials as described above can be used as the host of the light emission layer.

A polymer such as polyvinyl carbazole or polyfluorenone can be used, and a polymer in which the host compound mentioned above is introduced in the polymer chain or a polymer having the host compound as the polymer main chain can be also used.

Plural host compounds or plural phosphorescent compounds may be used. Usage of the plurality of the host compounds can adjust charge transfer, and obtain an organic EL element with high efficiency. Usage of the plurality of the phosphorescent compounds can mix light with a different color, and can emit light with any color. A white light emission can be emitted by selecting kinds of the phosphorescent compound or a doping amount of the phosphorescent compounds, which can be applied for an illuminating lamp or a back light.

The host compound is preferably a compound with high Tg (glass transition temperature), which has a hole and electron transporting ability, and prevents the emission wavelength shifting to longer wavelength.

The host compound is preferably a carbazole derivative. As the host compound, a compound having nature of carbazole, N-phenylcarbazole or N-alkylcarbazole is effective. The carbazole, N-phenylcarbazole and N-alkylcarbazole themselves have a low glass transition temperature and are problematic in lifetime. They are formed in a polymer in order to increase thermal stability, in which the selection of the linkage group for the polymer requires great care in order to maintain the original nature of the carbazole, N-phenylcarbazole and N-alkylcarbazole themselves.

Hitherto, regarding materials for an organic electroluminescent element, a simple phenyl ring (phenylene) or a simple naphthyl ring (naphthylene) has been used as the linkage group. However, such a linkage group extends conjugation length, resulting in lowering of excited triplet energy. Accordingly, performance of the organic electroluminescent element can be maintained using, as the linkage group, an alkyl group or aromatic rings with a substituent, which is incorporated to twist the aromatic rings so that a dihedral angle between the ring planes is not less than 50 degrees.

In the invention, a carbazole derivative described below is preferred. Examples of the carbazole derivative include a compound represented by represented by formula 11 above. In formula 11, $R_{1001}$ through $R_{1013}$ independently represent a hydrogen atom or a substituent, provided that at least one of $R_{1001}$ through $R_{1013}$ is a substituent.

Examples of the substituent in $R_{1001}$ through $R_{1013}$ are the same as those denoted in $R_{11}$ through $R_{13}$ in formula 1.

When $R_{1001}$ through $R_{1005}$ independently represent an aryl group or a heteroaryl group, the dihedral angle between the ring plane of the aryl or heteroaryl group of $R_{1001}$ through $R_{1005}$ and that of the phenyl group of phenylcarbazole is preferably not less than 50 degrees. When $R_{1006}$ through $R_{1013}$ represent an aryl group or a heteroaryl group, the dihedral angle between the ring plane of the aryl or heteroaryl group and that of the phenylcarbazole moiety is preferably not less than 50 degrees. The steric structure of the molecule can be controlled by incorporation of a substituent.

As is explained above in the hole transporting material, a substituent, an aryl or heteroaryl group providing a 0-0 band of the phosphorescence spectra exceeding 450 nm is not suitable.

When the steric control due to incorporation of a substituent is not carried out, the dihedral angle is generally less than 50 degrees. In this case, the conjugation length extends and may lower the excited triplet energy (the 0-0 band of the phosphorescence spectra shifts to a longer wavelength).

Examples of the carbazole derivative include a compound represented by represented by formula 12 above.

In formula 12, $R_{1021}$ represents an alkyl group, a cycloalkyl group or a fluoroalkyl group; and $R_{1022}$ through $R_{1029}$ independently represent a hydrogen atom or a substituent, provided that at least one of $R_{1022}$ through $R_{1029}$ is a substituent.

Examples of the substituent in $R_{1022}$ through $R_{1029}$ are the same as those denoted in $R_{11}$ through $R_{13}$ in formula 1.

When $R_{1022}$ through $R_{1029}$ represent an aryl group or a heteroaryl group, the dihedral angle between the ring plane of the aryl or heteroaryl group and that of the phenylcarbazole is preferably not less than 50 degrees.

Examples of the carbazole derivative include a compound represented by represented by formula 13 above. In formula 13, $R_{1031}$ through $R_{1046}$ independently represent a hydrogen atom or a substituent; and $L_3$ represents a chemical bond or a divalent linkage group, provided that when $L_3$ represents a chemical bond, at least one of $R_{1037}$, $R_{1038}$, $R_{1045}$, and $R_{1046}$ is a substituent.

Examples of the substituent in $R_{1031}$ through $R_{1046}$ are the same as those denoted in $R_{11}$ through $R_{13}$ in formula 1.

Examples of the carbazole derivative include a compound represented by represented by formula 14 above. In formula 14, $R_{1051}$ through $R_{1063}$ independently represent a hydrogen atom or a substituent, provided that at least one of $R_{1057}$, $R_{1058}$, $R_{1062}$, and $R_{1063}$ is a substituent.

Examples of the substituent in $R_{1051}$ through $R_{1063}$ are the same as those denoted in $R_{11}$ through $R_{13}$ in formula 1.

Examples of the carbazole derivative include a compound represented by represented by formula 15 above. In formula 15, $R_{1071}$ through $R_{1079}$ independently represent a hydrogen atom or a substituent, provided that least one of $R_{1072}$ and $R_{1073}$ is a substituent; and n is an integer of from 1 to 8.

Examples of the substituent in $R_{1071}$ through $R_{1079}$ are the same as those denoted in $R_{11}$ through $R_{13}$ in formula 1.

Examples of the carbazole derivatives will be listed below, but the invention is not specifically limited thereto.

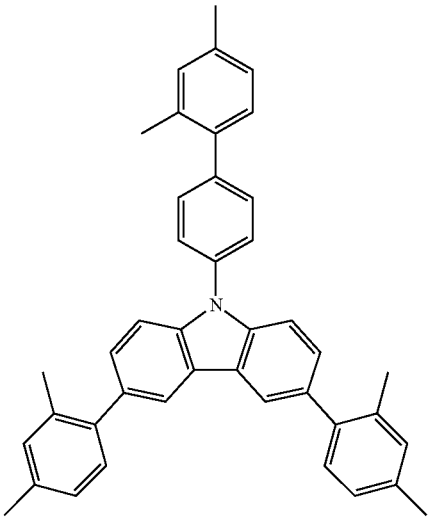

2-1

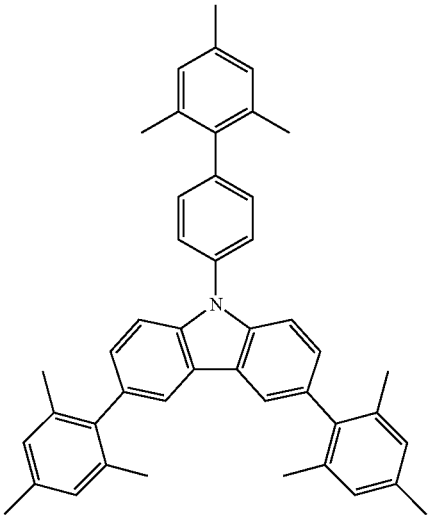

2-2

-continued
2-3
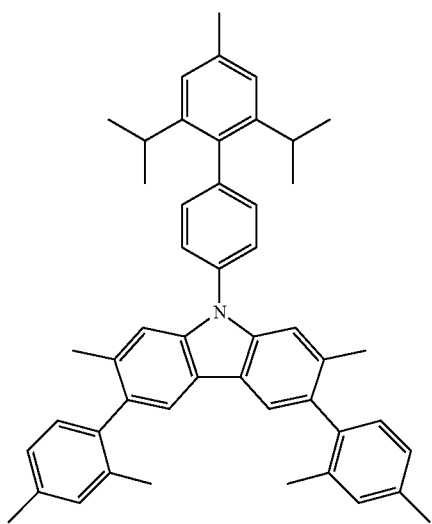
2-4
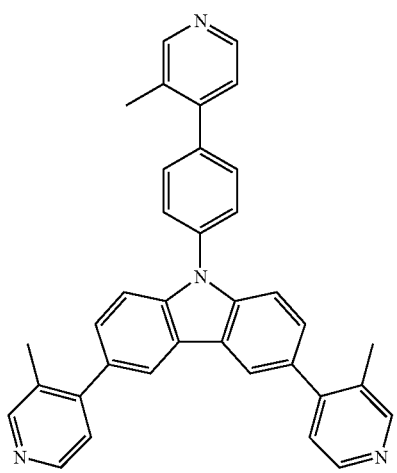
2-5
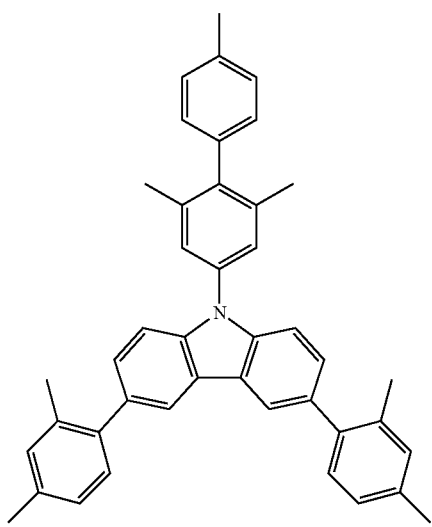
-continued
2-6
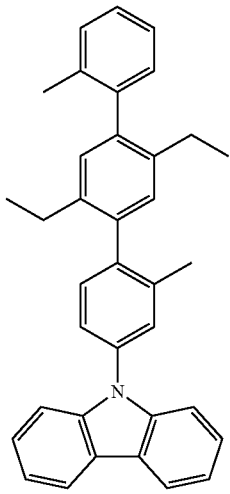
2-7
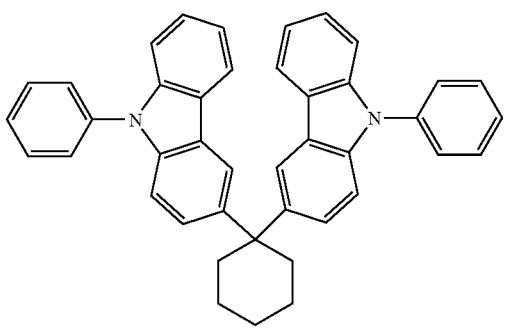
2-8
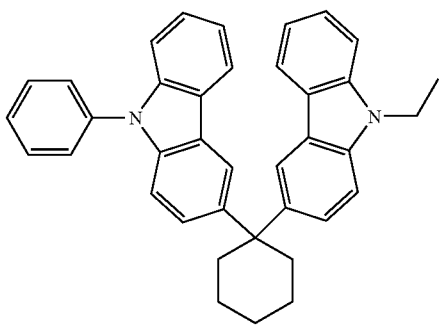
2-9
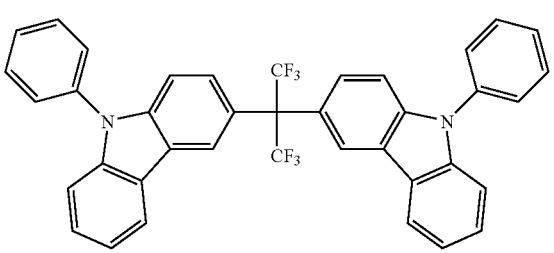

-continued
2-10
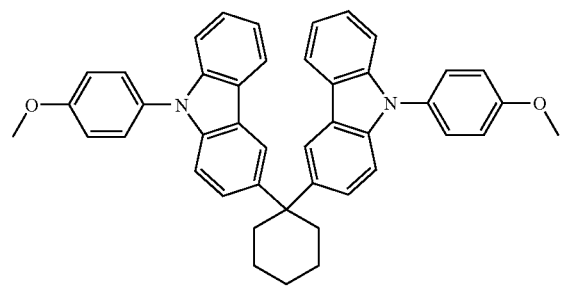
2-11
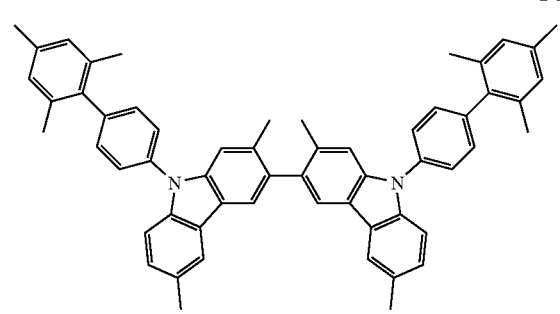
2-12
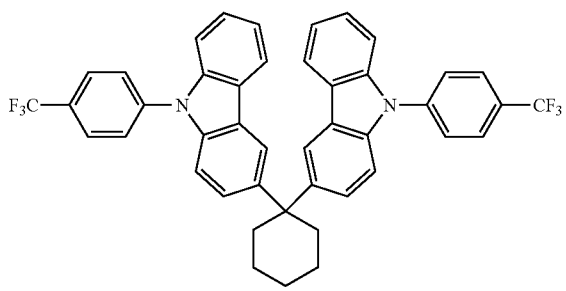
2-13
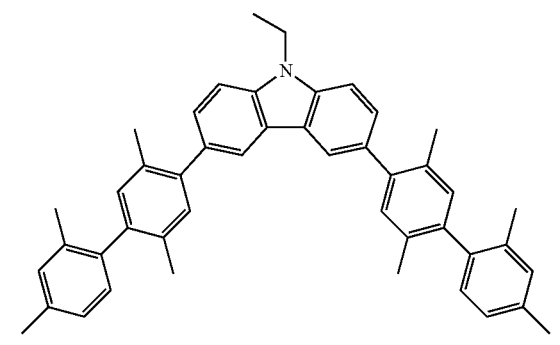
2-14
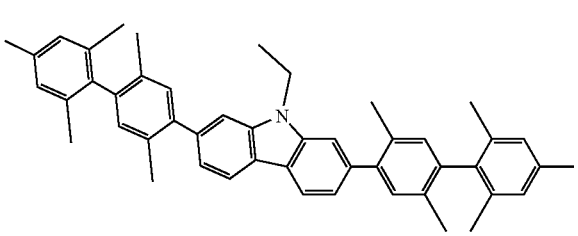
-continued
2-15
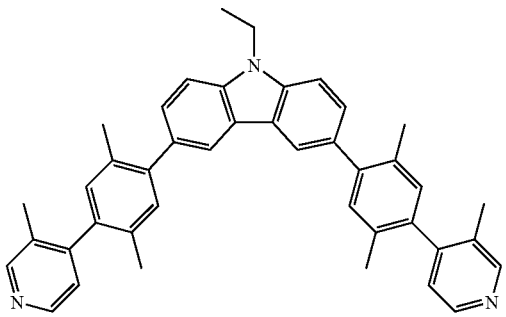
2-16
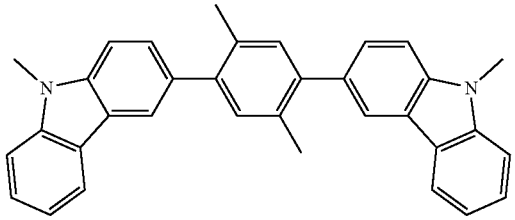
2-17
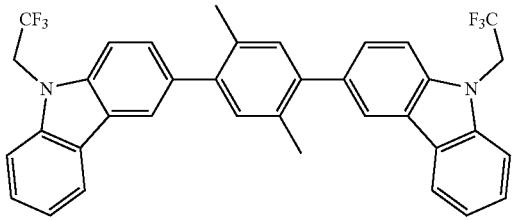
2-18
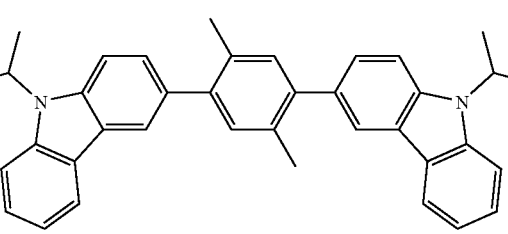
2-19
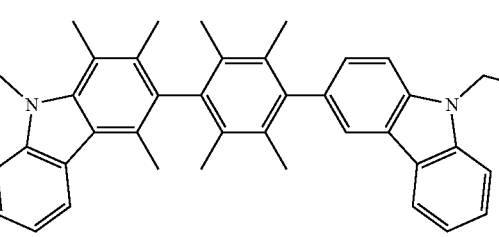
2-20
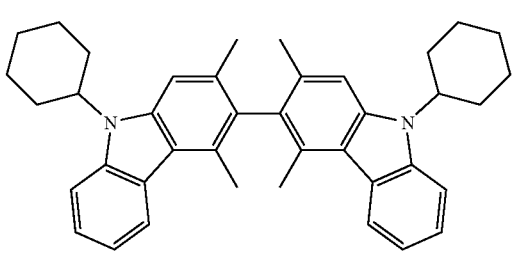

-continued
2-21
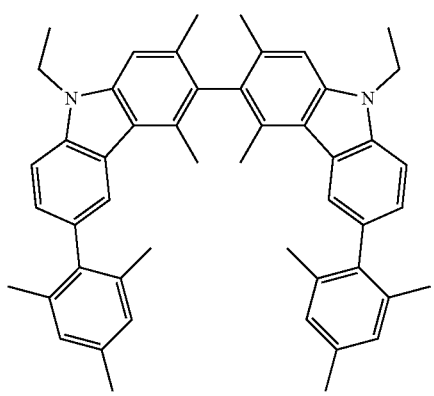
2-26
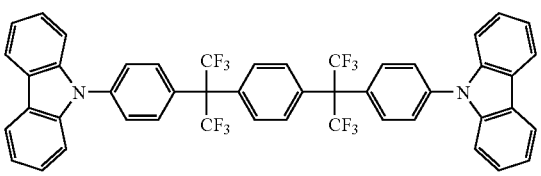
2-27
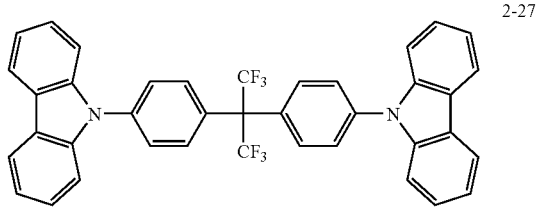
2-22
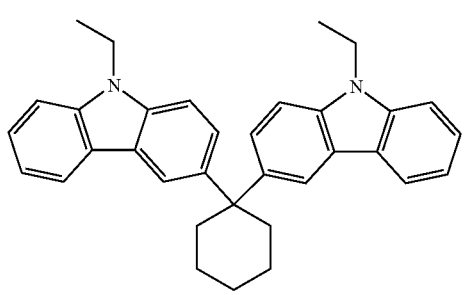
2-28
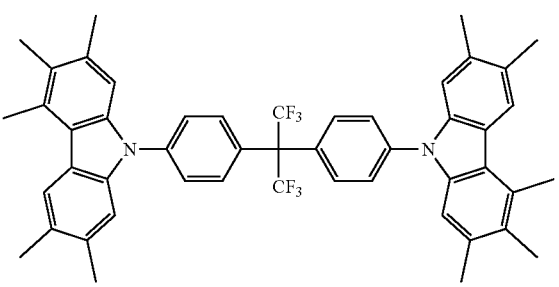
2-23
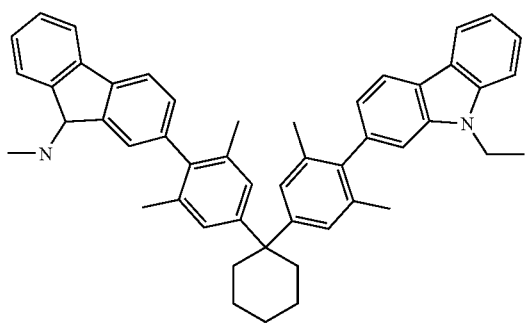
2-29
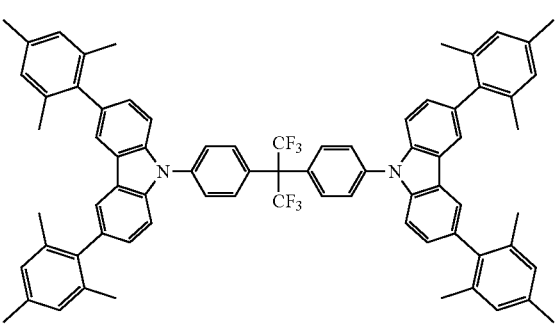
2-24
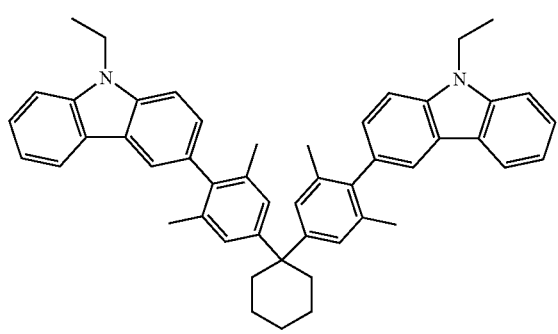
2-30
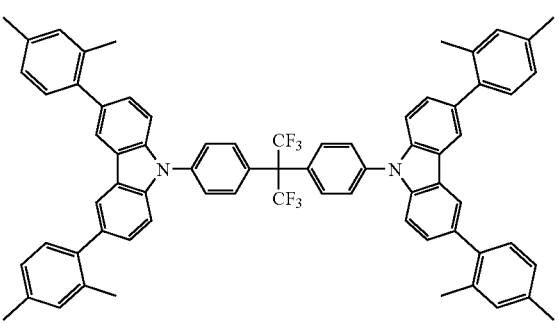
2-25
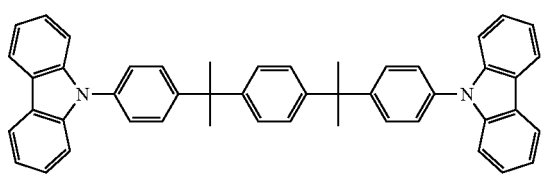
2-31
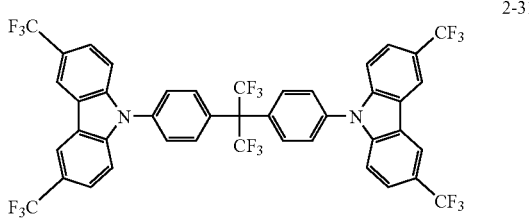

-continued
2-32
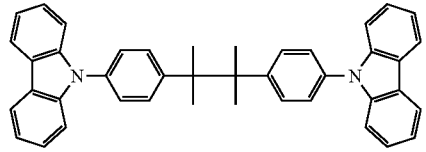
2-33
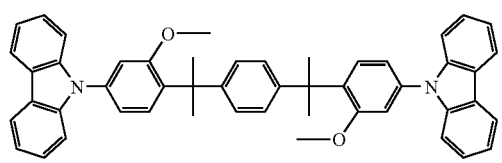
2-34
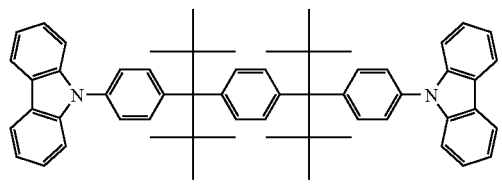
2-35
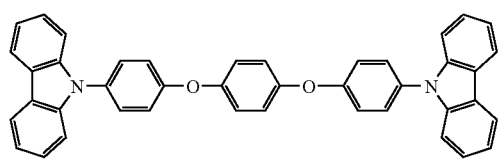
2-36
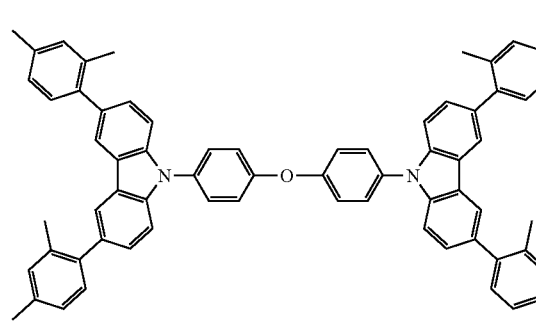
2-37
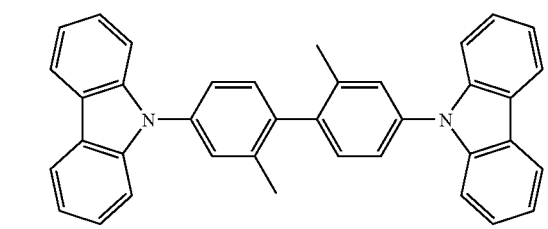
2-38
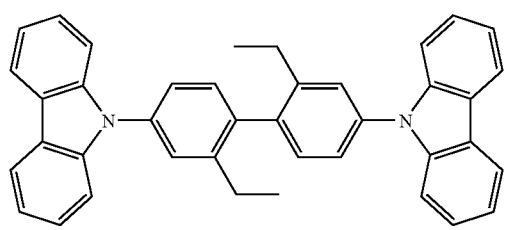
-continued
2-39
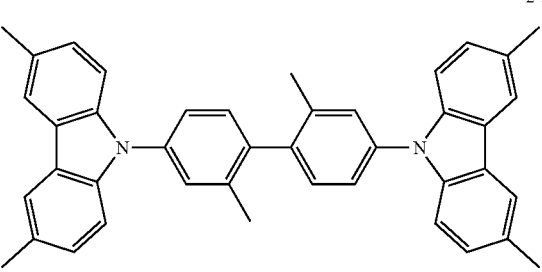
2-40
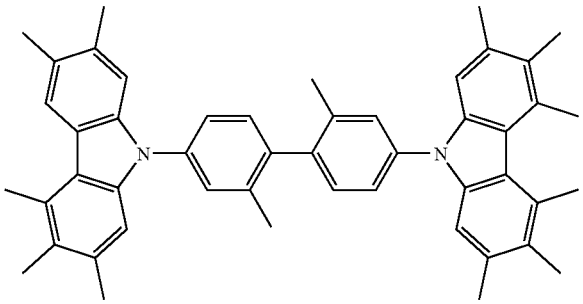
2-41
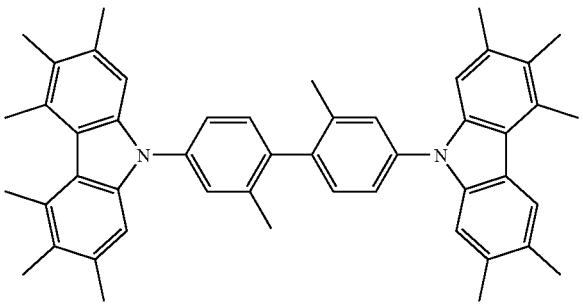
2-42
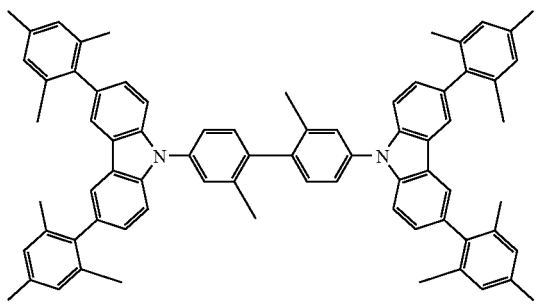
2-43
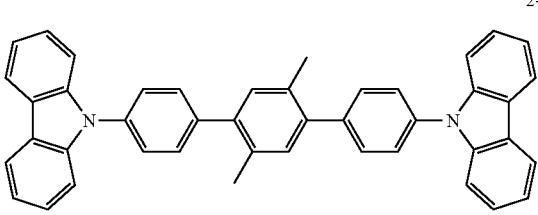

-continued
2-44
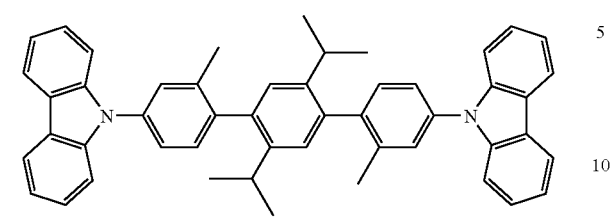
2-45
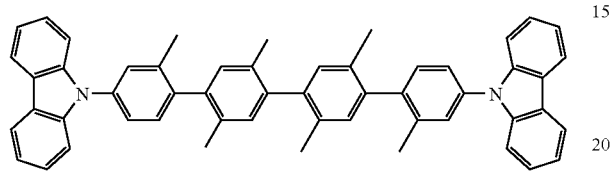
2-46
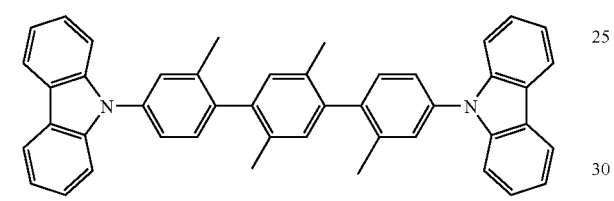
2-47
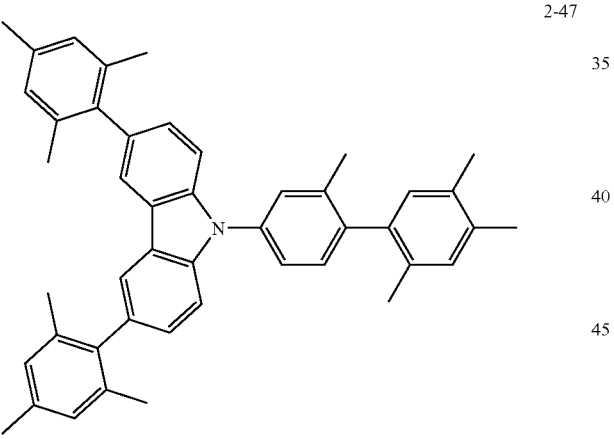
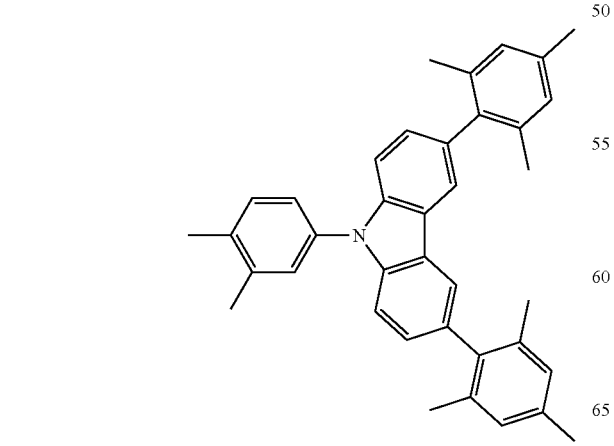
-continued
2-48
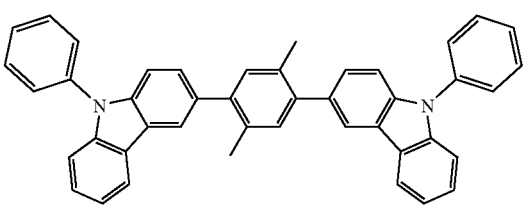
2-49
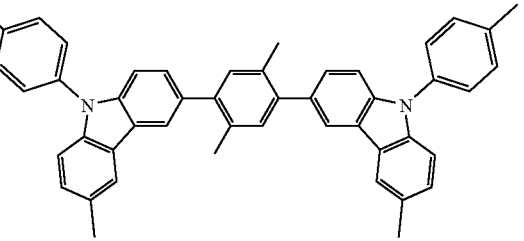
2-50
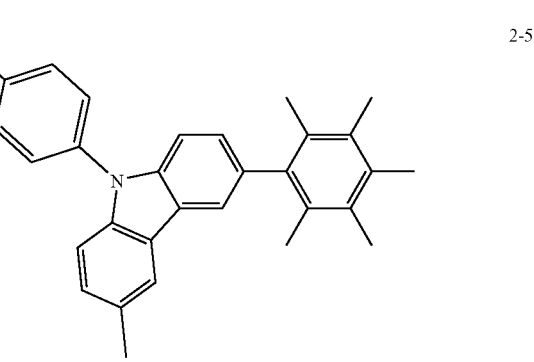
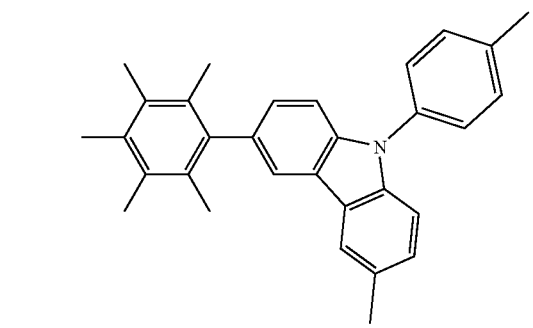
2-51
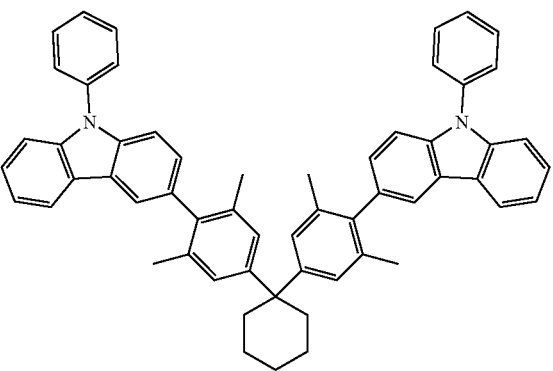

-continued

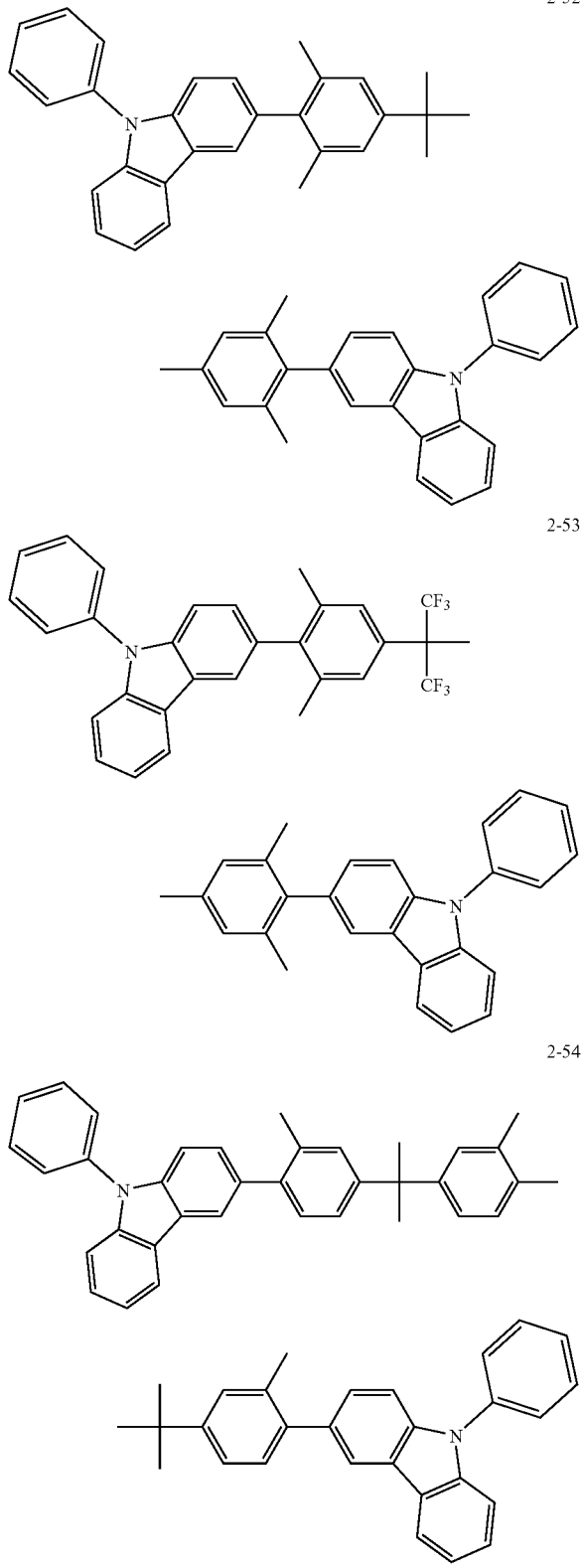

2-52

2-53

2-54

In the invention, a combination of the hole transporting material in the invention and the host compound can provide high emission efficiency.

The light emission layer may comprise a host compound having a wavelength providing a fluorescence maximum as a host compound. In this case, the electroluminescence of the EL element is emitted from the fluorescent compound to which energy is transferred from another host compound and the phosphorescent compound. The host compound having a wavelength providing a fluorescence maximum preferably has a high fluorescence quantum yield in the form of solution. Herein, the fluorescence quantum yield is preferably not less than 10%, and more preferably not less than 30%. Examples of the a host compound having a wavelength providing a fluorescence maximum include a coumarin dye, a cyanine dye, a chloconium dye, a squalenium dye, an oxobenzanthracene dye, a fluorescene dye, a rhodamine dye, a pyrylium dye, a perylene dye, a stilbene dye, and a polythiophene dye. The fluorescence quantum yield can be measured according to a method described in the fourth edition, Jikken Kagaku Koza 7, Bunko II, p. 362 (1992) (published by Maruzen).

Figure 4:
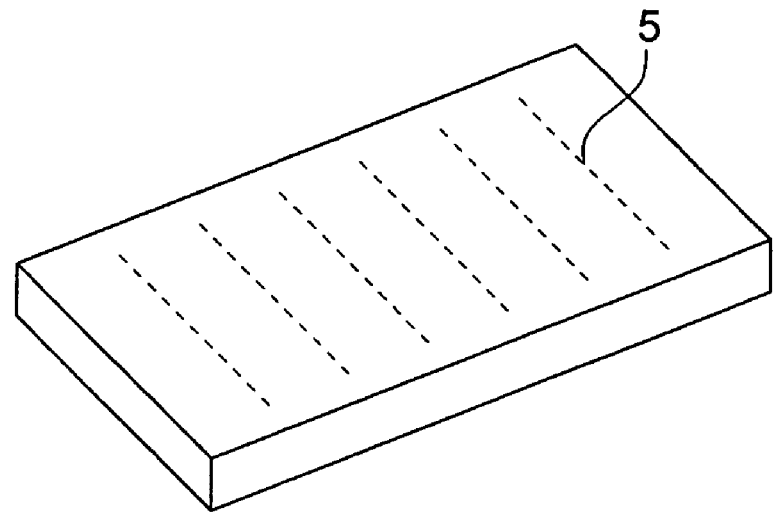
FIG. 4 is a schematic drawing of a display employing a passive matrix method.
Figure 4:
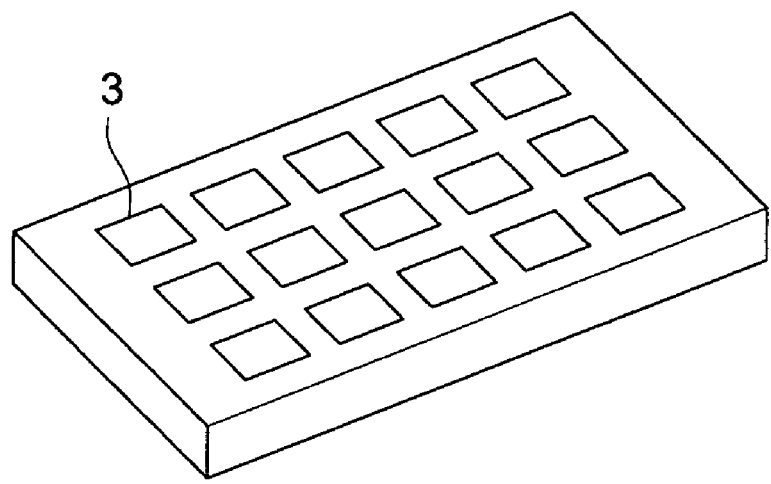
Figure 4:
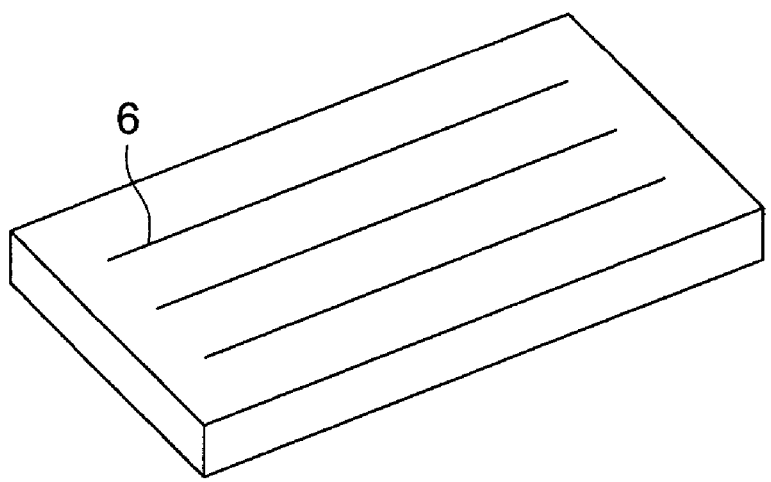

Color of light emitted from the fluorescent compound in the invention is measured by a spectral light meter CS-1000, manufactured by Minolta Co., Ltd., and expressed according to CIE chromaticity diagram described in FIG. 4.16 on page 108 of "Shinpen Shikisai Kagaku Handbook" (Coloring Science Handbook, New Edition), edited by Nihon Shikisai Gakkai, published by Todai Shuppan Kai, 1985.

The light emission layer can be formed employing the above-described compounds and a known method such as a vacuum deposition method, a spin coat method, a casting method, an LB method or an ink jet method. The thickness of the light emission layer is not specifically limited, but is ordinarily from 5 nm to 5 μm, and preferably from 5 to 200 nm. The light emission layer may be composed of a single layer comprising one or two or more of the phosphorescent compound or the host compound, or of plural layers comprising the same composition or different composition.

<<Hole Transporting Layer>>

The hole transporting layer is comprised of a hole transporting material having an ability of transporting holes, and a hole injecting layer and an electron blocking layer are included in the hole transporting layer in a broad sense. The hole transporting layer may be a single layer or plural layers. In the invention, the hole transporting layer adjacent to the light emission layer can contain one or more kinds of the hole transporting material described above.

In the invention, the hole transporting material in the hole transporting layer adjacent to the light emission layer has an ionization potential of preferably from 5.00 to 5.70 eV, and more preferably from 5.00 to 5.45 eV, which can increase higher emission efficiency and reduce a drive voltage contain one or more kinds of described above.

In the invention, the ionization potential is defined by energy necessary to release electrons of a compound existing in a HOMO (highest occupied molecular orbital) level to a vacuum level, and typically is energy necessary to release electrons from a film (or layer) of a compound. The ionization energy can be directly measured by means of photoelectron spectroscopy. The ionization energy in the invention ink absorption layer measured by means of ESCA 5600 UPS (ultraviolet photoemission spectroscopy) produced by ULVAC-PHI, Inc. Co., Ltd.

It is preferred that the ionization potential Ip1 (eV) of the hole transporting material in the hole transporting layer adjacent to the light emission layer and the ionization potential Ip3 (eV) of the phosphorescent compound in the light emission layer satisfy the formula $-0.1\ (eV) \leq Ip3 - Ip1\ (eV) \leq 0.5,$ whereby energy efficiency can be increased and higher emission efficiency can be obtained.

It is preferred in the invention that the ionization potential Ip1 (eV) of the hole transporting material in the hole transporting layer adjacent to the light emission layer and ionization potential Ip2 (eV) of the host compound in the light emission layer satisfy the formula $$0.3 \text{ (eV)} < Ip2 - Ip1 < 1.0 \text{ (eV)},$$

whereby energy efficiency can be increased and higher emission efficiency can be obtained.

It is preferred in the invention that the electron affinity Ea1 (eV) of the hole transporting material in the hole transporting layer adjacent to the light emission layer and exited triplet state level T3 (eV) of the phosphorescent compound in the light emission layer satisfy the formula $$0.5 \text{ (eV)} \leq T3 - Ea1 \leq 1.3 \text{ (eV)},$$

whereby energy efficiency can be increased and higher emission efficiency can be obtained.

T3 can be obtained by subtracting the exited triplet state level from the Ip3 in the phosphorescent compound.

The phosphorescent compound in the exited triplet state is more activated than that in the ground state, and is susceptible to oxidation. Accordingly, the phosphorescent compound may be inactivated by providing electrons to or accepting electrons from the ambient hole transporting material. However, when the electron affinity Ea1 of the hole transporting material and the exited triplet state level T3 of the phosphorescent compound satisfy the above formula, the electron providing or accepting and the inactivation are restrained, resulting in increase of emission efficiency.

In the invention, the electron affinity is defined by energy released when electrons of a compound existing in a vacuum level fall to a LUMO (lowest unoccupied molecular orbital) level and are stabilized. The electron affinity is determined according to the following:

Ionization potential (eV) = Electron affinity $Ip$ (eV) + Band gap (eV)

In the invention, the band gap represents energy between HOMO and LUMO in a molecule, and is obtained for example by forming a film of a compound on a quarts plate, measuring absorption spectra of the film, and determining the absorption edge in the spectra.

In the invention, the electron affinity Ea1 (eV) of the hole transporting material in the hole transporting layer adjacent to the light emission layer and the electron affinity Ea2 (eV) of the host compound in the light emission layer preferably satisfy the formula $$0.1 \text{ (eV)} < Ea2 - Ea1 < 0.8 \text{ (eV)},$$

and more preferably satisfy the formula $$0.3 \text{ (eV)} < Ea2 - Ea1 < 0.5 \text{ (eV)}$$

When electron affinity Ea1 (eV) of the hole transporting material and electron affinity Ea2 (eV) of the host compound satisfy the above formula, transfer of electron from the hole transporting material to the host compound is restrained to promote a recombination of holes and electrons, resulting in increase of emission efficiency.

In the invention, it is preferred that the ionization potential Ip1 (eV) of the hole transporting material in the hole transporting layer adjacent to the light emission layer and the ionization potential Ip4 (eV) of the second hole transporting material of the second hole transporting layer provided on the surface of the hole transporting layer opposite the light emission layer preferably satisfy the formula $$0.1 \text{ (eV)} \leq Ip1 - Ip4 \leq 0.7 \text{ (eV)}$$

Injection of holes to a hole transporting layer, which is not smoothly carried out due to the energy gap between an anode and the hole transporting layer, is efficiently carried out employing this layer, whereby energy efficiency can be increased and drive voltage can be reduced. It is preferred that the thickness of the hole transporting layer adjacent to the light emission layer is preferably from 5 to 20 nm, which can efficiently inject holes to the hole transporting layer, resulting in increase of higher emission efficiency and in reduction of drive voltage.

The second transporting material contained in the second hole transporting layer, which is further arranged on the surface of the hole transporting layer adjacent to the light emission layer opposite the light emission layer, may be either an organic substance or an inorganic substance as long as it has a hole injecting ability, a hole transporting ability or an ability to form a barrier to electrons. Examples of thereof include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and an electroconductive oligomer, particularly a thiophene oligomer. As the second hole transporting material, those described above are used, but a porphyrin compound, an aromatic tertiary amine compound or a styrylamine compound is preferably used, and an aromatic tertiary amine compound is more preferably used.

Typical examples of the aromatic tertiary amine compound and styrylamine compound include N,N,N',N'-tetraphenyl-4, 4'-diaminophenyl, N,N'-diphenyl-N,N'-bis(3-methylphenyl)-[1,1'-biphenyl]-4,4'-diamine (TPD), 2,2'-bis(4-di-p-tolylaminophenyl)propane, 1,1'-bis(4-di-p-tolylaminophenyl)cyclohexane, N,N,N',N'-tetra-p-tolyl-4,4, '-diaminobiphenyl, 1,1'-bis(4-di-p-tolylaminophenyl)-4-phenylcyclohexane, bis(4-dimethylamino-2-methylphenyl)-phenylmethane, bis(4-di-p-tolylaminophenyl)-phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N, N-diphenylaminostylbene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in Japanese Patent O.P.I. Publication No. 4-308688 such as 4,4',4"-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the material as the polymer main chain can be also used. As the hole injecting material or the hole transporting material, inorganic compounds such as p-Si and p-SiC are usable.

The hole transporting layer can be formed by layering the hole transporting material by a known method such as a vacuum deposition method, a spin coat method, a casting method, an ink jet method, and an LB method. The thickness of the hole transporting layer is not specifically limited, but is ordinarily from 5 to 5000 nm. The hole transporting layer may be composed of a single layer structure comprising one or two or more of the materials mentioned above.

<<Electron Transporting Layer>>

The electron transporting layer comprises a material (an electron transporting material) having an electron transporting ability, and in a broad sense refers to an electron injecting layer or a hole blocking layer. The electron transporting layer can be provided as a single layer or plural layers.

As an electron transporting material (which serves also as a hole blocking material) used in a single electron transporting layer or in the electron transporting layer closest to the cathode of plural electron transporting layers, compounds to be described below are known.

The electron transporting layer may be any layer, as long as it has a function of incorporating electrons injected from a cathode to a light emission layer, and a material used in the electron transporting layer can be optionally selected from known compounds used as electron transporting materials.

Examples of the material used in the electron transporting layer (hereinafter also referred to as electron transporting material) include a nitro-substituted fluorene derivative, a diphenylquinone derivative, a thiopyran dioxide derivative, a carbodiimide, a fluolenylidenemethane derivative, an anthraquinodimethane, an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transporting material.

A polymer in which the material mentioned above is introduced in the polymer side chain or a polymer having the material as the polymer main chain can be also used.

A metal complex of an 8-quinolynol derivative such as aluminum tris-(8-quinolynol) ($Alq_3$), aluminum tris-(5,7-dichloro-8-quinolynol), aluminum tris-(5,7-dibromo-8-quinolynol), aluminum tris-(2-methyl-8-quinolynol), aluminum tris-(5-methyl-8-quinolynol), or zinc bis-(8-quinolynol) ($Znq_2$), and a metal complex formed by replacing the central metal of the foregoing complexes with another metal atom such as In, Mg, Cu, Ca, Sn, Ga or Pb, can be used as the electron transporting material. Furthermore, a metal free or metal-containing phthalocyanine, and a derivative thereof, in which the molecular terminal is replaced by a substituent such as an alkyl group or a sulfonic acid group, are also preferably used as the electron transporting material. The distyrylpyrazine derivative exemplified as a material for the light emission layer may preferably be employed as the electron transporting material. An inorganic semiconductor such as n-Si and n-SiC may also be used as the electron transporting material in a similar way as in the hole transporting layer.

The electron transporting layer can be formed employing the above-described electron transporting materials and a known method such as a vacuum deposition method, a spin coat method, a casting method, a printing method including an ink jet method or an LB method. The thickness of electron transporting layer is not specifically limited, but is ordinarily from 5 nm to 5 μm, and preferably from 5 to 200 nm. The electron transporting layer may be composed of a single layer comprising one or two or more of the electron transporting material.

<<Substrate (Referred to as Also Base Plate, Base or Support)>>

The organic EL element of the invention is preferably provided on a substrate.

The substrate employed for the organic electroluminescent element of the invention is not restricted to specific kinds of materials such as glass and plastic, as far as it is transparent. Examples of the substrate preferably used include glass, quartz and light transmissible plastic film. Especially preferred one is a resin film capable of providing flexibility to the organic EL element.

Examples of the resin film include films of polyethylene terephthalate (PET), polyethylene naphthalate (PEN), polyethersulfone (PES), polyetherimide, polyetheretherketone, polyphenylene sulfide, polyarylate, polyimide, polycarbonate (PC), cellulose triacetate (TAC), cellulose acetate propionate (CAP) and so on. The surface of the resin film may have a layer of an inorganic or organic compound or a hybrid layer of both compounds.

The external light emission efficiency of the organic electroluminescent element of the invention is preferably not less than 1%, and more preferably not less than 5% at room temperature. Herein, external quantum yield (%) is represented by the following formula:

External quantum yield (%) = (the number of photons emitted to the exterior of the organic electroluminescent element×100)/(the number of electrons supplied to the organic electroluminescent element)

A hue improving filter such as a color filter may be used in combination or a color conversion filter which can convert from emission light color from an organic EL element to multi-color employing a fluorescent compound may be used in combination. In the case where the color conversion filter, the λmax of the light emitted from the organic EL element is preferably not more than 480 nm.

<<Preparation of Organic EL Element>>

For one example, the preparation of the organic EL element, which has the constitution, Anode/Hole injecting layer/Hole transporting layer/Light emission layer/Electron transporting layer/Electron injecting layer/Cathode, will be described. A thin layer of a desired material for an electrode such as a material of the anode is formed on a suitable substrate by a deposition or sputtering method to prepare the anode, so that the thickness of the layer is not more than 1 μm, and preferably within the range of from 10 to 200 nm. Then the hole injecting layer, the hole transporting layer, the light emission layer, the electron transporting layer and the electron injecting layer, which constitute the organic EL element, are formed on the resulting anode in that order as organic compound thin layers.

As methods for formation of the thin layers, there are a spin coating method, a casting method, an ink jet method, a vacuum deposition method, and a printing method, however, a spin coating method and a vacuum deposition method are preferably used, since a uniform layer can be formed and a pinhole is formed with difficulty. Different methods may be used for formation of different layers. When the vacuum deposition method is used for the thin layer formation method, although conditions of the vacuum deposition differs due to kinds of materials used, vacuum deposition is preferably carried out at a boat temperature of from 50° C. to 450° C., at a degree of vacuum of from $10^{-6}$ to $10^{-2}$ Pa, at a deposition speed of from 0.01 to 50 nm/second, and at a substrate temperature of from −50 to 300° C. to form a layer with a thickness of from 0.1 nm to 5 μm.

After these layers has been formed, a thin layer comprised of a material for a cathode is formed thereon to prepare a cathode, employing, for example, a deposition method or sputtering method to give a thickness of not more than 1 μm, and preferably from 50 to 200 nm. Thus, a desired organic EL element is obtained. It is preferred that the layers from the hole injecting layer to the cathode are continuously formed under one time of vacuuming to obtain an organic EL element. However, on the way of the layer formation under vacuum a different layer formation method may be inserted. When the different method is used, its process is required to be carried out under a dry inert gas atmosphere.

In the multicolor display of the invention, the light emission layer only is formed using a shadow mask, and other layers than the light emission layer are common, and can be formed employing a vacuum method, a casting method, a spin coat method or a printing method in which patterning employing the shadow mask is not required.

When the light emission layer only is formed by patterning, the layer formation method, although not specifically limited, is carried out preferably according to a deposition method, an ink jet method or a printing method. When a deposition method is used as the layer formation method, patterning of the layer is preferably carried out employing a shadow mask.

Further, the organic EL element can be prepared in the reverse order, in which the cathode, the electron injecting layer, the electron transporting layer, the light emission layer, the hole transporting layer, the hole injecting layer, and the anode are formed in that order. When a direct current voltage, a voltage of 2 to 40 V is applied to the thus obtained multicolor display, setting the anode as a +polarity and the cathode as a−polarity, light emission occurs. When voltage is applied with the reverse polarity, no current flows, and light is not emitted at all. When an alternating voltage is applied, light emission occurs only at the time when the polarity of the anode is "+" and that of the cathode is "−". The wave shape of the alternating current may be any one.

The multicolor display of the invention can be used as a display device, a display, or various light emission sources. The display device or the display, which employs three kinds of organic EL elements, an element emitting a blue light, an element emitting a red light and an element emitting a green light, can present a full color image.

Examples of the display device or the display include a television, a personal computer, a mobile device or an AV device, a display for text broadcasting, and an information display used in a car. The multicolor emission apparatus may be used as particularly a display for reproducing a still image or a moving image. When the apparatus is used as a display for reproducing a moving image, the driving method may be either a simple matrix (passive matrix) method or an active matrix method.

Examples of the light emission sources include a home lamp, a room lamp in a car, a backlight for a watch or a liquid crystal, a light source for boarding advertisement, a signal device, a light source for a photo memory medium, a light source for an electrophotographic copier, a light source for an optical communication instrument, and a light source for an optical sensor, but are not limited thereto.

The organic EL element of the invention may be an organic EL element having a resonator structure.

The organic EL element having a resonator structure is applied to a light source for a photo-memory medium, a light source for an electrophotographic copier, a light source for an optical communication instrument, or a light source for a photo-sensor, but its application is not limited thereto. In the above application, a laser oscillation may be carried out.

<<Display>>

The organic EL element of the invention can be used as a lamp such as an illuminating lamp or a light source for exposure, as a projection device for projecting an image, or as a display for directly viewing a still image or a moving image. When the element is used in a display for reproducing a moving image, the driving method may be either a simple matrix (passive matrix) method or an active matrix method. The display can present a full color image, employing two or more kinds of organic EL elements each emitting light with a different color. A monochromatic color, for example, a white color can be converted to a full color of BGR, employing a color filter. Further, employing a color conversion filter, light color emitted from the organic EL element can be converted to another color or full color, where the λmax of the light emitted from the organic EL element is preferably not more than 480 nm.

One example of the display comprising the organic EL element of the invention will be explained below employing Figures.

FIG. 1 is a schematic drawing of one example of a display comprising an organic EL element. FIG. 1 is a display such as that of a cellular phone, displaying image information due to light emission from the organic EL.

A display 1 comprises a display section A having plural pixels and a control section B carrying out image scanning based on image information to display an image in the display section A. The control section B is electrically connected to the display section A, transmits a scanning signal and an image data signal to each of the plural pixels based on image information from the exterior, and conducts image scanning which emits light from each pixel due to the scanning signal according to the image data signal, whereby an image is displayed on the display section A.

Figure 2:
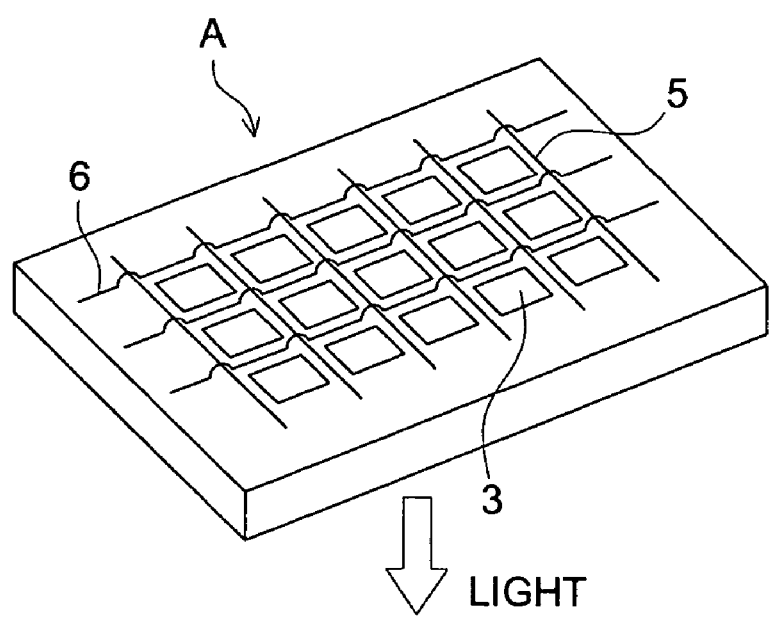
FIG. 2 is a schematic drawing of a display section.

FIG. 2 is a schematic drawing of a display section A. The display section A comprises a glass substrate, plural pixels 3, and a wiring section comprising plural scanning lines 5 and plural data lines 6. The main members of the display section A will be explained below. In FIG. 2, light from pixels 3 is emitted in the direction of an arrow.

The plural scanning lines 5 and plural data lines 6 of the wiring section 2 each are composed of an electroconductive material, the lines 5 and the lines 6 being crossed with each other at a right angle, and connected with the pixels 3 at the crossed points (not illustrated).

The plural pixels 3, when the scanning signal is applied from the scanning lines 5, receive the data signal from the data lines 6, and emit light corresponding to the image data received. Provision of red light emission pixels, green light emission pixels, and blue light emission pixels side by side on the same substrate can display a full color image.

Next, an emission process of pixels will be explained.

Figure 3:
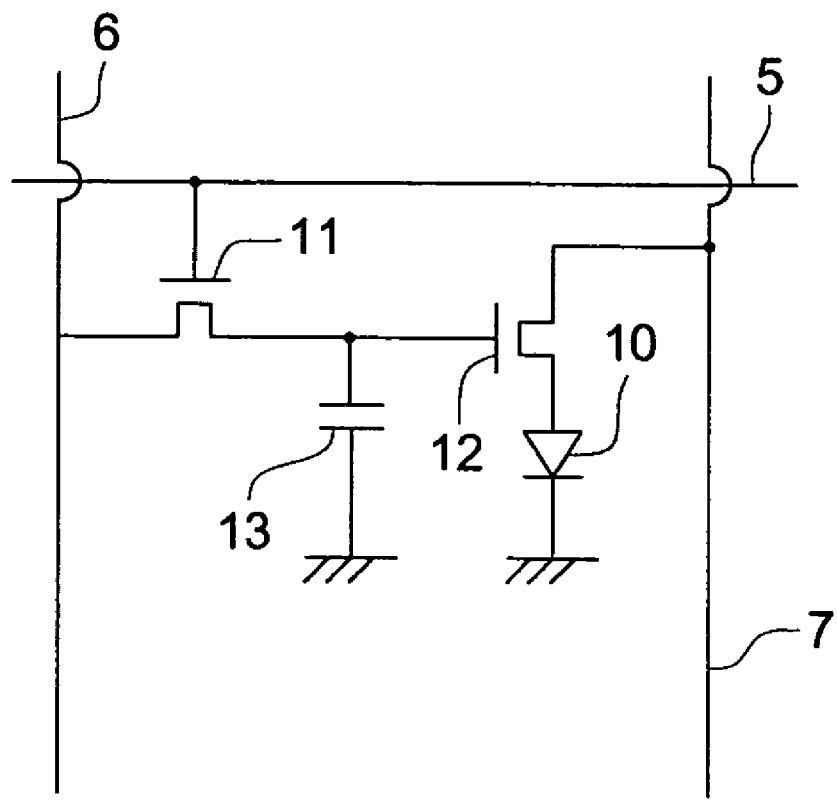
FIG. 3 is a schematic drawing of a pixel

FIG. 3 is a schematic drawing of a pixel. The pixel comprises an organic EL element 10, a switching transistor 11, a driving transistor 12, and a capacitor 13. When a pixel with a red light emission organic EL element, a pixel with a green light emission organic EL element, and a pixel with a blue light emission organic EL element are provided side by side on the same substrate, a full color image can be displayed.

In FIG. 3, an image data signal is applied through the data lines 6 from the control section B to a drain of the switching transistor 11, and when a scanning signal is applied to a gate of the switching transistor 11 through the scanning lines 5 from the control section B, the switching transistor 11 is switched on, and the image signal data applied to the drain is transmitted to the capacitor 13 and the gate of the driving transistor 12.

The capacitor 13 is charged according to the electric potential of the image data signal transmitted, and the driving transistor 12 is switched on. In the driving transistor 12, the drain is connected to an electric source line 7, and the source to an organic EL element 10. Current is supplied from the electric source line 7 to the organic EL element 10 according to the electric potential of the image data signal applied to the gate.

The scanning signal is transmitted to the next scanning line 5 according to the successive scanning of the control section B, the switching transistor 11 is switched off. Even if the switching transistor 11 is switched off, the driving transistor 12 is turned on since the capacitor 13 maintains a charged potential of image data signal, and light emission from the organic EL element 10 continues until the next scanning signal is applied. When the next scanning signal is applied according the successive scanning, the driving transistor 12 works according to an electric potential of the next image data signal synchronized with the scanning signal, and light is emitted from the organic EL element 10.

That is, light is emitted from the organic EL element 10 in each of the plural pixels 3 due to the switching transistor 11 as an active element and the driving transistor 12 each being provided in the organic EL element 10 of each of the plural pixels 3. This emission process is called an active matrix process.

Herein, light emission from the organic EL element 10 may be emission with plural gradations according to image signal data of multiple value having plural gradation potentials, and emission due to on-off according to a binary value of the image data signals.

The electric potential of the capacitor 13 may maintain till the next application of the scanning signal, or may be discharged immediately before the next scanning signal is applied.

In the invention, light emission may be carried out employing a passive matrix method as well as the active matrix method as described above. The passive matrix method is one in which light is emitted from the organic EL element according to the data signal only when the scanning signals are scanned.

FIG. 4 is a schematic drawing of a display employing a passive matrix method.

In FIG. 4, pixels 3 are provided between the scanning lines 5 and the data lines 6, crossing with each other. When scanning signal is applied to scanning line 5 according to successive scanning, pixel 3 connecting the scanning line 5 emits according to the image data signal. The passive matrix method has no active element in the pixel 3, which reduces manufacturing cost of a display.

EXAMPLES

The present invention will be explained in the following examples, but is not limited thereto.

Example 1

<Preparation of Organic EL Element Samples 1-1 through 1-19>

A pattern was formed on a substrate (manufactured by NH Technoglass Co., Ltd.) composed of a glass plate (100 mm×100 mm×1.1 mm) and a 100 nm ITO (indium tin oxide) layer as an anode. Then the resulting transparent substrate having the ITO transparent electrode was subjected to ultrasonic washing in i-propyl alcohol and dried by a dry nitrogen gas and subjected to UV-ozone cleaning for 5 minutes. The thus obtained transparent substrate was fixed on a substrate holder of a vacuum deposition apparatus available on the market. Further, 200 mg of α-NPD were put in a first resistive heating molybdenum boat, 200 mg of CBP were put in a second resistive heating molybdenum boat, 200 mg of bathocuproine (BCP) were put in a third resistive heating molybdenum boat, 100 mg of Ir-1 were put in a fourth resistive heating molybdenum boat, and 200 mg of Alq$_3$ were put in a fifth resistive heating molybdenum boat.

The resulting boats were set in the vacuum deposition apparatus, and pressure in the vacuum tank was reduced to $4\times10^{-4}$ Pa. Then, the boat carrying α-NPD being heated by supplying an electric current to the boat, α-NPD was deposited onto the transparent substrate at a depositing speed of 0.1 nm/sec to form a first hole transporting layer. After that, the boat carrying CBP and the boat carrying Ir-1 being heated by supplying an electric current to both boats, CBP at a depositing speed of 0.2 nm/sec and Ir-1 at a depositing speed of 0.012 nm/sec were co-deposited onto the resulting hole transporting layer to form a light emission layer. The temperature of the substrate at the time of the deposition was room temperature. Subsequently, the boat carrying BCP being heated by supplying an electric current to the boat, BCP was deposited onto the resulting light emission layer at a depositing speed of 0.1 nm/sec to form an electron transporting layer with a thickness of 10 nm which could function as a hole blocking layer. Further, the boat carrying Alq$_3$ being heated by supplying an electric current to the boat, Alq$_3$ was deposited onto the resulting electron transporting layer at a depositing speed of 0.1 nm/sec to form an electron injecting layer with a thickness of 40 nm. The temperature of the substrate at the time of the deposition was room temperature.

After that, a 0.5 nm thick lithium fluoride layer and a 110 nm thick aluminum layer were deposited on the resulting material to form a cathode. Thus, organic EL element sample 1-1 was prepared. Organic EL element samples 1-2 through 1-19 were prepared in the same manner as organic EL element sample 1-1 above, except that compounds and materials as shown in Table 1 were used in the light emission layer and in the hole transporting layer. The compounds and materials are shown in Table 1.

TABLE 1

| | | Light emission layer | | | | | | | | First hole transporting layer Hole transporting material | | | | | | | | | |
|---|---|---|---|---|---|---|---|---|---|---|---|---|---|---|---|---|---|---|---|
| | | Phosphorescent compound | | | Host compound | | | | | | | | | | | | | | |
| *1 | *2 | *3 (Ip2) (eV) | T3 (eV) | *4 (nm) | *2 | *3 (Ip3) (eV) | *5 (Ea2) (eV) | *6 (nm) | D (nm) | *2 | MW | *6 (nm) | *3 (Ip1) (eV) | *5 (Ea1) (eV) | D (nm) | *7 | *8 | *9 | *10 | Remarks |
| 1-1 | Ir-1 | 5.6 | 3.1 | 495 | CBP | 6.0 | 2.5 | 465 | 35 | α-NPD | 588.3 | 524 | 5.4 | 2.3 | 25 | 0.6 | 0.2 | 0.2 | 0.8 | Comp. |
| 1-2 | Ir-1 | 5.6 | 3.1 | 495 | CBP | 6.0 | 2.5 | 465 | 35 | HTM-1 | 502.7 | 423 | 5.6 | 2.0 | 25 | 0.4 | 0 | 0.5 | 1.1 | Comp. |
| 1-3 | Ir-1 | 5.6 | 3.1 | 495 | CBP | 6.0 | 2.5 | 465 | 35 | 1-56 | 872.5 | 440 | 5.4 | 2.0 | 25 | 0.6 | 0.2 | 0.5 | 1.1 | Inv. |

TABLE 1-continued

| | | Light emission layer | | | | | | | First hole transporting layer Hole transporting material | | | | | | | | | |
|---|---|---|---|---|---|---|---|---|---|---|---|---|---|---|---|---|---|---|
| | | Phosphorescent compound | | | Host compound | | | | | | | | | | | | | |
| *1 | *2 | *3 (Ip2) (eV) | T3 (eV) | *4 (nm) | *2 | *3 (Ip3) (eV) | *5 (Ea2) (eV) | *6 (nm) | D (nm) | *2 | MW | *6 (nm) | *3 (Ip1) (eV) | *5 (Ea1) (eV) | D (nm) | *7 | *8 | *9 | *10 | Remarks |
| 1-4 | Ir-1 | 5.6 | 3.1 | 495 | CBP | 6.0 | 2.5 | 465 | 35 | 1-35 | 600.8 | 415 | 5.6 | 2.1 | 25 | 0.4 | 0 | 0.4 | 1 | Inv. |
| 1-5 | Ir-1 | 5.6 | 3.1 | 495 | CBP | 6.0 | 2.5 | 465 | 35 | 1-1 | 626.9 | 423 | 5.6 | 2.0 | 25 | 0.4 | 0 | 0.5 | 1.1 | Inv. |
| 1-6 | Ir-1 | 5.6 | 3.1 | 495 | CBP | 6.0 | 2.5 | 465 | 35 | 1-10 | 599.9 | 425 | 5.7 | 2.1 | 25 | 0.3 | −0.1 | 0.4 | 1 | Inv. |
| 1-7 | Ir-1 | 5.6 | 3.1 | 495 | CBP | 6.0 | 2.5 | 465 | 35 | 1-12 | 870.2 | 430 | 5.6 | 2.1 | 25 | 0.4 | 0 | 0.4 | 1 | Inv. |
| 1-8 | Ir-1 | 5.6 | 3.1 | 495 | 2-37 | 6.0 | 2.4 | 410 | 35 | 1-56 | 872.5 | 440 | 5.4 | 2.0 | 25 | 0.6 | 0.2 | 0.4 | 1.1 | Inv. |
| 1-9 | Ir-1 | 5.6 | 3.1 | 495 | 2-37 | 6.0 | 2.4 | 410 | 35 | 1-35 | 600.8 | 415 | 5.6 | 2.0 | 25 | 0.4 | 0 | 0.4 | 1.1 | Inv. |
| 1-1- | Ir-1 | 5.6 | 3.1 | 495 | 2-37 | 6.0 | 2.4 | 410 | 35 | 1-1 | 626.9 | 423 | 5.6 | 2.0 | 25 | 0.4 | 0 | 0.4 | 1.1 | Inv. |
| 1-11 | Ir-1 | 5.6 | 3.1 | 495 | 2-37 | 6.0 | 2.4 | 410 | 35 | 1-49 | 1101.5 | 420 | 5.6 | 2.1 | 25 | 0.4 | 0 | 0.3 | 1 | Inv. |
| 1-12 | Ir-1 | 5.6 | 3.1 | 495 | 2-2 | 6.0 | 2.4 | 415 | 35 | 1-49 | 1101.5 | 420 | 5.6 | 2.1 | 25 | 0.4 | 0 | 0.3 | 1 | Inv. |
| 1-13 | Ir-12 | 5.8 | 2.7 | 458 | CBP | 6.0 | 2.5 | 465 | 45 | α-NPD | 588.3 | 524 | 5.4 | 2.3 | 25 | 0.6 | 0.4 | 0.2 | 0.4 | Comp. |
| 1-14 | Ir-12 | 5.8 | 2.7 | 458 | CBP | 6.0 | 2.5 | 465 | 45 | HTM-1 | 502.7 | 423 | 5.6 | 2.0 | 25 | 0.4 | 0.2 | 0.5 | 0.7 | Comp. |
| 1-15 | Ir-12 | 5.8 | 2.7 | 458 | CBP | 6.0 | 2.5 | 465 | 45 | 1-35 | 600.8 | 415 | 5.6 | 2.1 | 25 | 0.4 | 0.2 | 0.4 | 0.6 | Inv. |
| 1-16 | Ir-12 | 5.8 | 2.7 | 458 | 2-37 | 6.0 | 2.4 | 410 | 45 | 1-35 | 600.8 | 415 | 5.6 | 2.1 | 25 | 0.4 | 0.2 | 0.3 | 0.6 | Inv. |
| 1-17 | Ir-12 | 5.8 | 2.7 | 458 | 2-37 | 6.0 | 2.4 | 410 | 45 | 1-56 | 872.5 | 440 | 5.4 | 2.0 | 25 | 0.6 | 0.4 | 0.4 | 0.7 | Inv. |
| 1-18 | Ir-12 | 5.8 | 2.7 | 458 | 2-27 | 6.1 | 2.5 | 415 | 45 | 1-1 | 626.9 | 423 | 5.6 | 2.0 | 25 | 0.5 | 0.2 | 0.5 | 0.7 | Inv. |
| 1-19 | Ir-12 | 5.8 | 2.7 | 458 | 2-46 | 6.0 | 2.4 | 412 | 45 | 1-23 | 641.9 | 425 | 5.6 | 2.0 | 25 | 0.4 | 0.2 | 0.4 | 0.7 | Inv. |

Comp.: Comparative,
Inv.: Inventive
*1: Organic EL element sample No.,
*2: Kinds,
*3: Ionization potential,
*4: Wavelength providing phosphorescence emission maximum,
*5: Electron affinity,
*6: 0-0 band of phosphorescence spectra,
*7: Ip2 − Ip1,
*8: Ip3 − Ip1,
*9: Ea2 − Ea1,
*10: T3 − Ea1, D:
Thickness, MW: Molecular weight

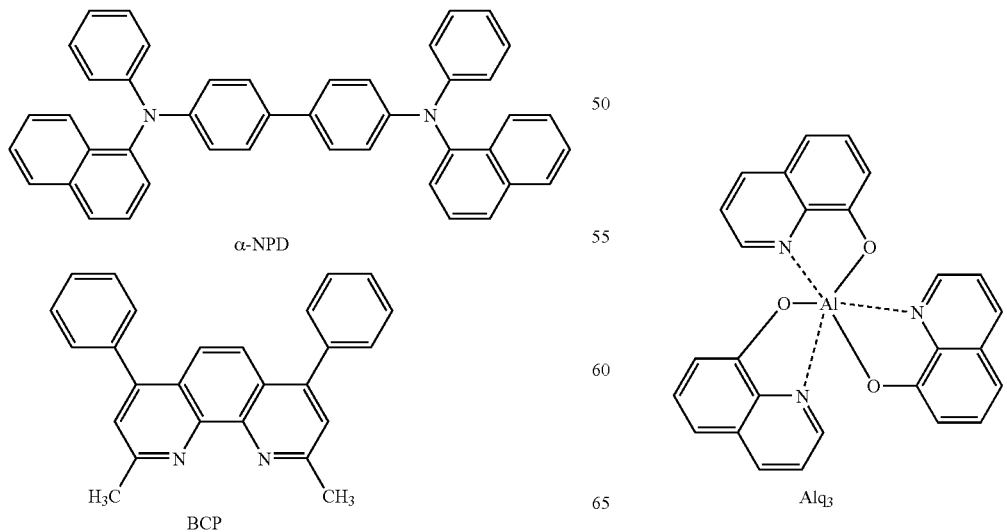

-continued

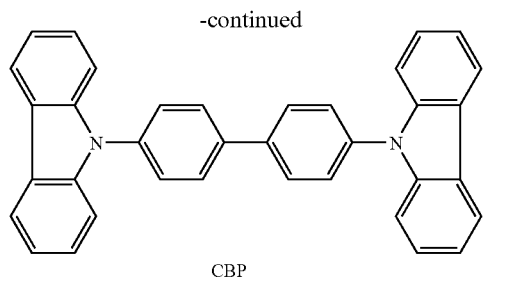

CBP

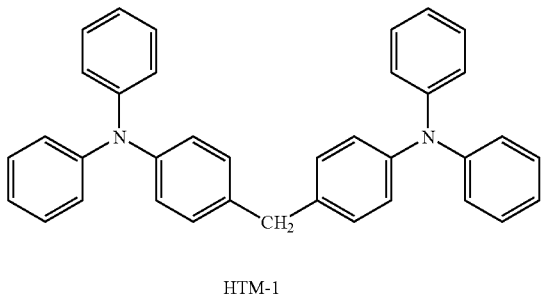

HTM-1

<Evaluation of Organic EL Element Samples 1-1 through 1-19>

The organic EL element samples 1-1 through 1-19 obtained above were evaluated according to the following criteria, and the results are shown in Table 2.

(External Quantum Efficiency)

Electric current of 2.5 mA/cm² was supplied to each sample at 23° C. in an atmosphere of a dry nitrogen gas, external quantum efficiency (%) of each sample was measured. The external quantum efficiency (%) was calculated from the data obtained by being measured through a spectral radiance meter CS-1000 produced by Minolta Co., Ltd.

(lm/W)

Employing luminance measured through a spectral radiance meter CS-1000 produced by Minolta Co., Ltd., lm/W was obtained from the following formula:

lm/W={Luminance (cd/m²)×π}/{Current density (A/m²)×Voltage (V)}

(Deterioration With Time)

After each sample was stored at 50° C. for 7 days, external quantum efficiency (%) of the sample was measured in the same manner as above.

External quantum efficiency, lm/W, and deterioration with time of organic EL element samples 1-2 through 1-12 were expressed by a relative value when external quantum efficiency, lm/W, and deterioration with time of organic EL element sample 1-1 were set at 100, respectively. External quantum efficiency, lm/W, and deterioration with time of organic EL element samples 1-14 through 1-19 were expressed by a relative value when external quantum efficiency, lm/W, and deterioration with time of organic EL element sample 1-13 were set at 100, respectively.

TABLE 2

| Organic EL element sample No. | External quantum efficiency | lm/W | Deterioration with time | Remarks |
|---|---|---|---|---|
| 1-1 | 100 (Control) | 100 (Control) | 100 (Control) | Comp. |
| 1-2 | 105 | 108 | 40 | Comp. |
| 1-3 | 108 | 110 | 160 | Inv. |
| 1-4 | 116 | 115 | 120 | Inv. |
| 1-5 | 117 | 117 | 112 | Inv. |
| 1-6 | 117 | 116 | 68 | Inv. |
| 1-7 | 119 | 118 | 152 | Inv. |
| 1-8 | 123 | 130 | 164 | Inv. |
| 1-9 | 141 | 140 | 124 | Inv. |
| 1-10 | 140 | 138 | 96 | Inv. |
| 1-11 | 138 | 138 | 168 | Inv. |
| 1-12 | 137 | 136 | 140 | Inv. |
| 1-13 | 100 (Control) | 100 (Control) | 100 (Control) | Comp. |
| 1-14 | 104 | 105 | 40 | Comp. |
| 1-15 | 108 | 105 | 112 | Inv. |
| 1-16 | 197 | 132 | 120 | Inv. |
| 1-17 | 351 | 150 | 168 | Inv. |
| 1-18 | 250 | 147 | 72 | Inv. |
| 1-19 | 240 | 140 | 100 | Inv. |

Comp.: Comparative,
Inv.: Inventive

As is apparent from Table 2, inventive organic EL element samples provide excellent external quantum efficiency and excellent lm/W, and restrain deterioration with time. As compared to comparative organic EL element sample 1-1, although less restrained in deterioration with time, inventive organic EL element samples 1-6, 1-10 and 1-18 provide greatly improved external quantum efficiency and lm/W.

Example 2

<Preparation of Organic EL Element Samples 2-1 through 2-4>

A pattern was formed on a substrate (manufactured by NH Technoglass Co., Ltd.) composed of a glass plate (100 mm×100 mm×1.1 mm) and a 100 nm ITO (indium tin oxide) layer as an anode. Then the resulting transparent substrate having the ITO transparent electrode was subjected to ultrasonic washing in i-propyl alcohol and dried by a dry nitrogen gas and subjected to UV-ozone cleaning for 5 minutes. The thus obtained transparent substrate was fixed on a substrate holder of a vacuum deposition apparatus available on the market. Further, 200 mg of CuPc were put in a first resistive heating molybdenum boat, 200 mg of 1-56 were put in a second resistive heating molybdenum boat, 200 mg of CBP were put in a second resistive heating molybdenum boat, 200 mg of bathocuproine (BCP) were put in a third resistive heating molybdenum boat, 200 mg of bathocuproine (BCP) were put in a fourth resistive heating molybdenum boat, 100 mg of Ir-1 were put in a fifth resistive heating molybdenum boat, and 200 mg of Alq₃ were put in a sixth resistive heating molybdenum boat.

The resulting boats were set in the vacuum deposition apparatus, and pressure in the vacuum tank was reduced to 4×10⁻⁴ Pa. Then, the boat carrying CuPc being heated by supplying an electric current to the boat, CuPc was deposited onto the transparent substrate at a depositing speed of 0.1 nm/sec to form a second hole transporting layer. After that, the boat carrying 1-56 being heated by supplying an electric current, 1-56 was deposited onto the resulting hole transporting layer at a depositing speed of 0.1 nm/sec to form a first hole transporting layer. After that, the boat carrying CBP and the boat carrying Ir-1 being heated by supplying an electric current to both boats, CBP at a depositing speed of 0.2 nm/sec and Ir-1 at a depositing speed of 0.012 nm/sec were co-deposited onto the first hole transporting layer to form a light emission layer. The temperature of the substrate at the time of the deposition was room temperature. Subsequently, the boat carrying BCP being heated by supplying an electric current to the boat, BCP was deposited onto the resulting light emission layer at a depositing speed of 0.1 nm/sec to form an electron transporting layer with a thickness of 10 nm which could function as a hole blocking layer. Further, the boat carrying $Alq_3$ being heated by supplying an electric current to the boat, $Alq_3$ was deposited onto the resulting electron transporting layer at a depositing speed of 0.1 nm/sec to form an electron injecting layer with a thickness of 40 nm. The temperature of the substrate at the time of the desposition was room temperature.

After that, a 0.5 nm thick lithium fluoride layer and a 110 nm thick aluminum layer were deposited on the resulting material to form a cathode. Thus, organic EL element sample 2-1 was prepared. Organic EL element samples 2-2 through 2-4 were prepared in the same manner as organic EL element sample 2-1 above, except that compounds and materials as shown in Table 3 were used in the light emission layer and in the hole transporting layer. The compounds and materials used are shown in Table 3.

TABLE 3

| | | Light emission layer | | | | | | | | First hole transporting layer | | | |
|---|---|---|---|---|---|---|---|---|---|---|---|---|---|
| | | Phosphorescent compound | | | | Host compound | | | | | Hole transporting material | | |
| *1 | *2 | *3 (Ip3) (eV) | T3 (eV) | *4 (nm) | *2 | *3 (Ip2) (eV) | *5 (Ea2) (eV) | *6 (nm) | D (nm) | *2 | MW | *6 (nm) | *3 (Ip1) (eV) | *5 (Ea1) (eV) |
| 2-1 | Ir-1 | 5.6 | 3.1 | 495 | CBP | 6.0 | 2.5 | 465 | 35 | 1-56 | 872.5 | 440 | 5.4 | 2.0 |
| 2-2 | Ir-1 | 5.6 | 3.1 | 495 | 2-37 | 6.0 | 2.4 | 410 | 35 | 1-35 | 600.8 | 415 | 5.6 | 2.1 |
| 2-3 | Ir-12 | 5.8 | 2.7 | 458 | 2-37 | 6.0 | 2.4 | 410 | 35 | 1-56 | 872.5 | 440 | 5.4 | 2.0 |
| 2-4 | Ir-12 | 5.8 | 2.7 | 458 | 2-37 | 6.0 | 2.4 | 410 | 35 | 1-49 | 1101.5 | 420 | 5.6 | 2.1 |

| | | Second hole transporting layer Hole transporting material | | | | | | |
|---|---|---|---|---|---|---|---|---|
| D (nm) | *2 | *3 (ip4) (eV) | D (nm) | *7 | *8 | *9 | *10 | *11 | Remarks |
| 10 | CuPc | 5.1 | 25 | 0.6 | 0.2 | 0.3 | 0.5 | 1.1 | Inv. |
| 10 | NPD | 5.4 | 25 | 0.4 | 0 | 0.2 | 0.3 | 1 | Inv. |
| 10 | *12 | 5.1 | 40 | 0.6 | 0.4 | 0.3 | 0.4 | 0.7 | Inv. |
| 10 | NPD | 5.4 | 25 | 0.4 | 0.2 | 0.2 | 0.3 | 0.6 | Inv. |

Comp.: Comparative,
Inv.: Inventive
*1: Organic EL element sample No.,
*2: Kinds,
*3: Ionization potential
*4: Wavelength providing phosphorescence emission maximum,
*5: Electron affinity,
*6: 0-0 band of phosphorescence spectra,
*7: Ip2 − Ip1,
*8: Ip3 − Ip1,
*9: Ip1 − Ip4,
*10: Ea2 − Ea1,
*11: T3 − Ea1,
*12: PEPOT/PSS,
D: Thickness,
MW: Molecular weight

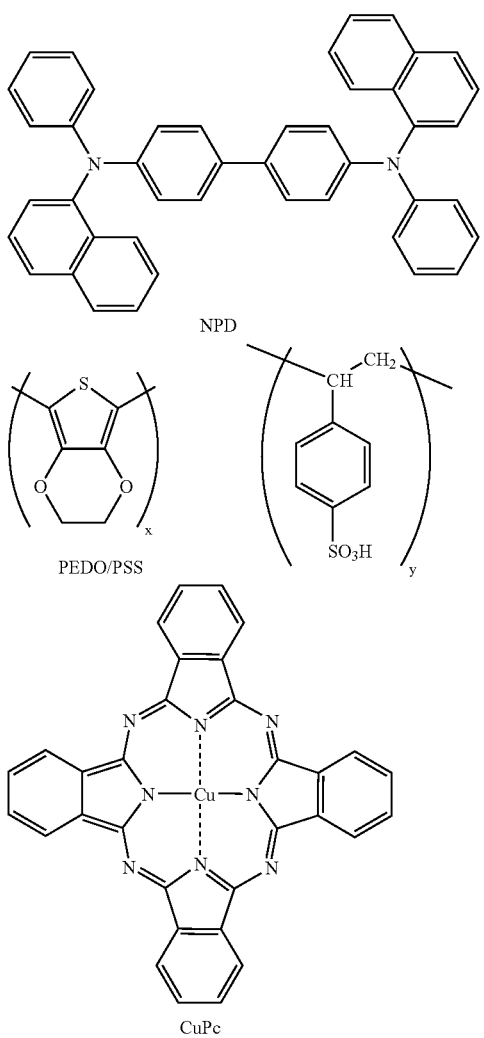

NPD

PEDO/PSS

CuPc

<Evaluation of Organic EL Element Samples 2-1 through 2-4>

The organic EL element samples 2-1 through 2-4 obtained above were evaluated in the same manner as in Example.

External quantum efficiency, lm/W, and deterioration with time of organic EL element samples 2-1 were expressed by a relative value when external quantum efficiency, lm/W, and deterioration with time of organic EL element sample 1-2 were set at 100, respectively. External quantum efficiency, lm/W, and deterioration with time of organic EL element samples 2-2 were expressed by a relative value when external quantum efficiency, lm/W, and deterioration with time of organic EL element sample 1-8 were set at 100, respectively. External quantum efficiency, lm/W, and deterioration with time of organic EL element samples 2-3 were expressed by a relative value when external quantum efficiency, lm/W, and deterioration with time of organic EL element sample 1-15 were set at 100, respectively. External quantum efficiency, lm/W, and deterioration with time of organic EL element samples 2-4 were expressed by a relative value when external quantum efficiency, lm/W, and deterioration with time of organic EL element sample 1-10 were set at 100, respectively. The results are shown in Table 4.

TABLE 4

| Organic EL element sample No. | External quantum efficiency | lm/W | Deterioration with time | Remarks |
|---|---|---|---|---|
| 2-1 | 102 | 130 | 108 | Inv. |
| 2-2 | 105 | 120 | 110 | Inv. |
| 2-3 | 103 | 130 | 109 | Inv. |
| 2-4 | 105 | 125 | 108 | Inv. |

Inv.: Inventive

As is apparent from Table 4, inventive organic EL element samples comprising a second hole transporting layer satisfying the formula 0.1 (eV)<Ip1–Ip4<0.7 (eV) provide more excellent external quantum efficiency and more excellent lm/W, and further restrain deterioration with time.

Example 3

A red light emission organic EL element was prepared in the same manner as the green light emission organic EL element obtained in the above Example, except that the phosphorescent compound was changed to Btp2Ir(acac), and the red, green and blue light emission organic EL elements were provided side by side on the same substrate. Thus, a full color image display according to an active matrix system was obtained which had a structure as shown in FIG. 1. FIG. 2 is a schematic drawing of a display section A of the full color image display prepared above. The displaying section comprises a base plate, and provided thereon, plural pixels 3 (including blue light emission pixels, green light emission pixels, and red light emission pixels) and a wiring section including plural scanning lines 5 and plural data lines 6. The plural scanning lines 5 and plural data lines 6 each are composed of electroconductive material. The plural scanning lines 5 and plural data lines 6 were crossed with each other at a right angle, and connected with the pixels 3 at the crossed points (not illustrated in detail). Each of the plural pixels 3, which comprise an organic EL element corresponding to the respective color, a switching transistor as an active element, and a driving transistor, is driven according to an active matrix system. The plural pixels 3, when scanning signal is applied from the scanning lines 5, receives the image data signal from the data lines 6, and emits light corresponding to the image data received. A full color image can be displayed by a red light emission pixel, a green light emission pixel, and a blue light emission pixel, each suitably arranged on the base plate.

A full color clear moving image with high luminance and high durability was obtained by driving the full color image display prepared above.

EFFECT OF THE INVENTION

The present invention can provide an organic EL element with high luminance, and an illuminator and a display employing the organic EL element.

What is claimed is:

1. An organic electroluminescent element comprising a light emission layer containing a phosphorescent compound and a hole transporting layer adjacent thereto containing a hole transporting material, wherein the hole transporting material has a 0-0 band of the phosphorescence spectra of from 300 to 450 nm and has a molecular weight of not less than 550, and is a triarylamine compound represented by the following Formula 4-1 or 4-2:

Formula 4-1

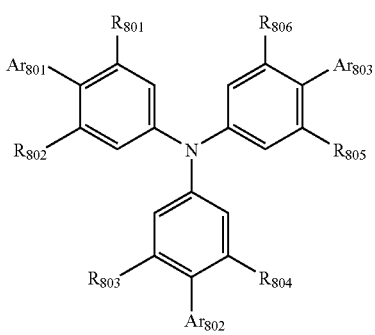

Formula 4-2

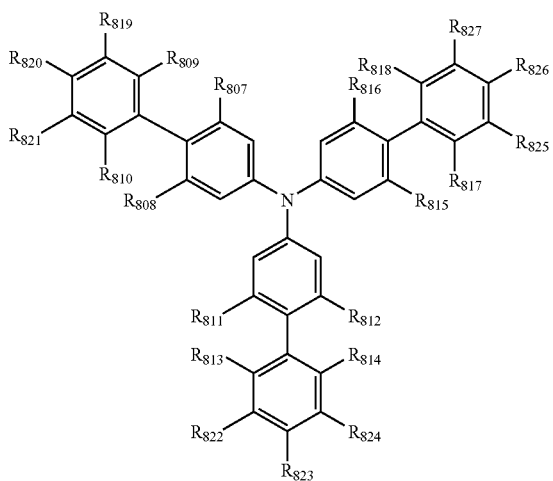

wherein $Ar_{801}$ through $Ar_{803}$ independently represent a substituted or unsubstituted aryl group or a substituted or unsubstituted heteroaryl group; and $R_{801}$ through $R_{827}$ independently represent a hydrogen atom or a substituent, provided that at least one of $R_{801}$ and $R_{802}$ is a substituent, at least one of $R_{803}$ and $R_{804}$ is a substituent, at least one of $R_{805}$ and $R_{806}$ is a substituent, at least one of $R_{807}$ through $R_{810}$ is a substituent, at least one of $R_{811}$ through $R_{814}$ is a substituent, and at least one of $R_{815}$ through $R_{818}$ is a substituent.

2. The organic electroluminescent element of claim 1, wherein the hole transporting material has an ionization potential Ip1 of from 5.00 to 5.70 eV.

3. The organic electroluminescent element of claim 1, wherein $$-0.1\ (eV) \leq Ip3 - Ip1 \leq 0.5\ (eV)$$

where Ip1 (eV) represents the ionization potential of the hole transporting material, and Ip3 (eV) represents the ionization potential of the phosphorescent compound.

4. The organic electroluminescent element of claim 1, wherein $$0.5\ (eV) < T3 - Ea1 < 1.3\ (eV)$$

where T3 (eV) represents the excited triplet energy level of the phosphorescent compound and Ea1 (eV) represents the electron affinity of the hole transporting material.

5. The organic electroluminescent element of claim 1, wherein the phosphorescent compound has a phosphorescence maximum in the wavelength regions of from 380 to 480 nm.

6. The organic electroluminescent element of claim 1, further comprising a second hole transporting layer containing a second hole transporting material, the second hole transporting layer being provided on the surface of the hole transporting layer opposite the light emission layer, wherein $$0.1\ (eV) < Ip1 - Ip4 < 0.7\ (eV)$$

where Ip1 (eV) represents the ionization potential of the hole transporting material, and Ip4 (eV) represents the ionization potential of the second hole transporting material.

7. The organic electroluminescent element of claim 6, wherein the thickness of the hole transporting layer adjacent to the light emission layer is from 5 to 20 nm.

8. The organic electroluminescent element of claim 1, wherein the light emission layer further contains a host compound.

9. The organic electroluminescent element of claim 8, wherein $$0.3\ (eV) < Ip2 - Ip1 < 1.0\ (eV)$$

where Ip1 (eV) represents the ionization potential of the hole transporting material and Ip2 (eV) represents the ionization potential of the host compound.

10. The organic electroluminescent element of claim 8, wherein $$0.1\ (eV) < Ea2 - Ea1 < 0.8\ (eV)$$

where Ea1 (eV) represents the electron affinity of the hole transporting material and Ea2 (eV) represents the electron affinity of the host compound.

11. The organic electroluminescent element of claim 8, wherein the host compound has a 0-0 band of the phosphorescence spectra of from 300 to 450 nm.

12. The organic electroluminescent element of claim 8, wherein the host compound is a carbazole derivative.

13. The organic electroluminescent element of claim 12, wherein the carbazole derivative is a compound represented by the following formula 11, Formula 11

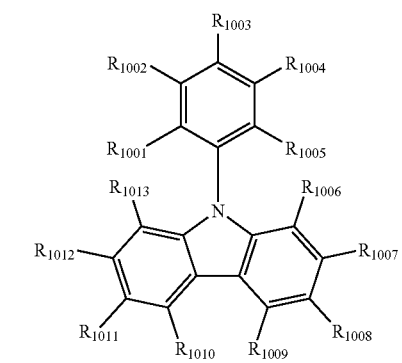

wherein $R_{1001}$ through $R_{1013}$ independently represent a hydrogen atom or a substituent, provided that at least one of $R_{1001}$ through $R_{1013}$ is a substituent.

14. The organic electroluminescent element of claim 12, wherein the carbazole derivative is a compound represented by the following formula 12, Formula 12

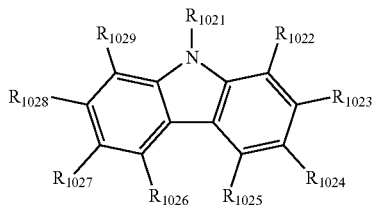

wherein $R_{1021}$ represents an alkyl group, a cycloalkyl group or a fluoroalkyl group; and $R_{1022}$ through $R_{1029}$ independently represent a hydrogen atom or a substituent, provided that at least one of $R_{1022}$ through $R_{1029}$ is a substituent.

15. The organic electroluminescent element of claim 12, wherein the carbazole derivative is a compound represented by the following formula 13, Formula 13

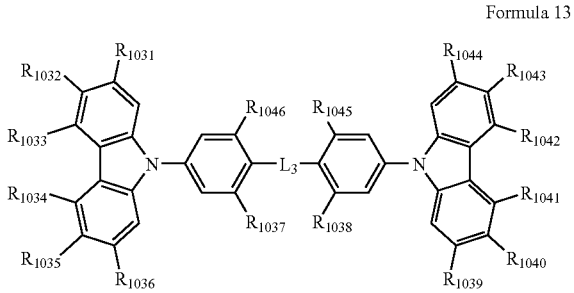

wherein $R_{1031}$ through $R_{1046}$ independently represent a hydrogen atom or a substituent; and $L_3$ represents a chemical bond or a divalent linkage group, provided that when $L_3$ represents a chemical bond, at least one of $R_{1037}$, $R_{1038}$, $R_{1045}$, and $R_{1046}$ is a substituent.

16. The organic electroluminescent element of claim 12, wherein the carbazole derivative is a compound represented by the following formula 14, Formula 14

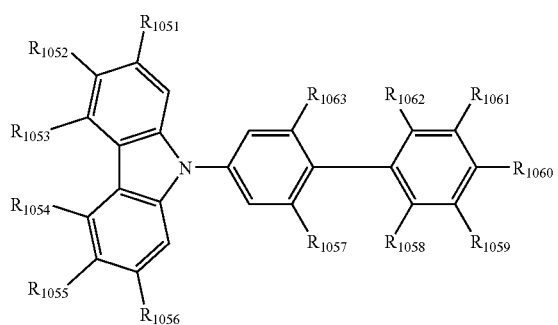

wherein $R_{1051}$ through $R_{1063}$ independently represent a hydrogen atom or a substituent, provided that at least one of $R_{1057}$, $R_{1058}$, $R_{1062}$, and $R_{1063}$ is a substituent.

17. The organic electroluminescent element of claim 12, wherein the carbazole derivative is a compound represented by the following formula 15, Formula 15

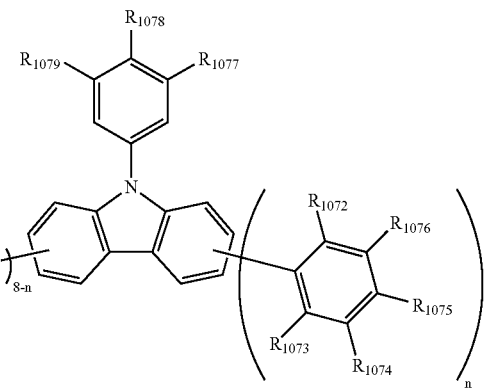

wherein $R_{1071}$ through $R_{1079}$ independently represent a hydrogen atom or a substituent, provided that at least one of $R_{1072}$ and $R_{1073}$ is a substituent; and n is an integer of from 1 to 8.

18. The organic electroluminescent element of claim 1, wherein the triarylamine compound is a compound represented by the following formula 5, Formula 5

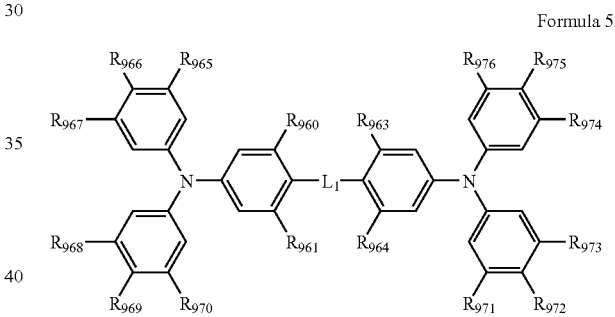

wherein $R_{960}$ through $R_{976}$ independently represent a hydrogen atom or a substituent, provided that at least one of $R_{960}$ and $R_{961}$ is a substituent and at least one of $R_{963}$ and $R_{964}$ is a substituent; and $L_1$ represents a chemical bond or a divalent linkage group.

19. The organic electroluminescent element of claim 1, wherein the triarylamine compound is a compound represented by the following formula 6, Formula 6

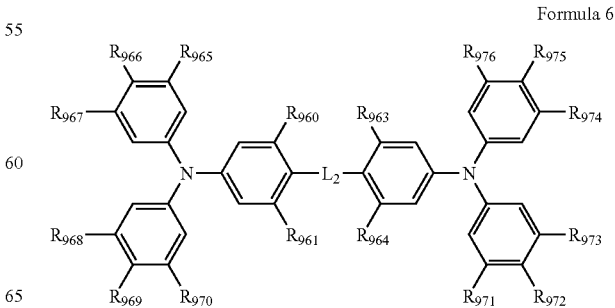

wherein $R_{960}$ through $R_{976}$ independently represent a hydrogen atom or a substituent; and $L_2$ represents an alkylene group, a cycloalkylene group or a fluoroalkylene group.

20. The organic electroluminescent element of claim 1, wherein the triarylamine compound comprises a terminal group represented by the following formula 10-1, 10-2, 10-3 or 10-4, Formula 10-1

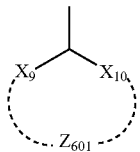

Formula 10-2

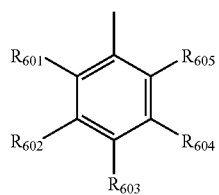

Formula 10-3

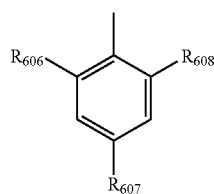

Formula 10-4

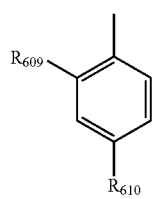

wherein $X_9$ and $X_{10}$ independently represent N, O, S or $CR_{611}$ in which $R_{611}$ represents a hydrogen atom or a substituent, provided that at least one of $X_9$ and $X_{10}$ represents $CR_{611}$ in which $R_{611}$ represents a substituent; $Z_{601}$ represents an atomic group necessary to form an aromatic hydrocarbon ring or an aromatic heterocyclic ring; $R_{601}$ through $R_{605}$ independently represent a hydrogen atom or a substituent, provided that at least one of $R_{601}$ and $R_{605}$ is a substituent; and $R_{606}$ through $R_{610}$ independently represent a substituent.

21. An organic electroluminescent element comprising a light emission layer containing a phosphorescent compound and a hole transporting layer adjacent thereto containing a hole transporting material, wherein the hole transporting material is a triarylamine compound represented by the following Formula 4-1 or 4-2:

Formula 4-1

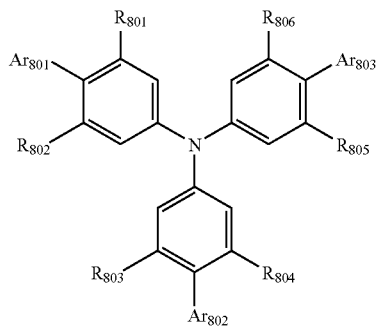

Formula 4-2

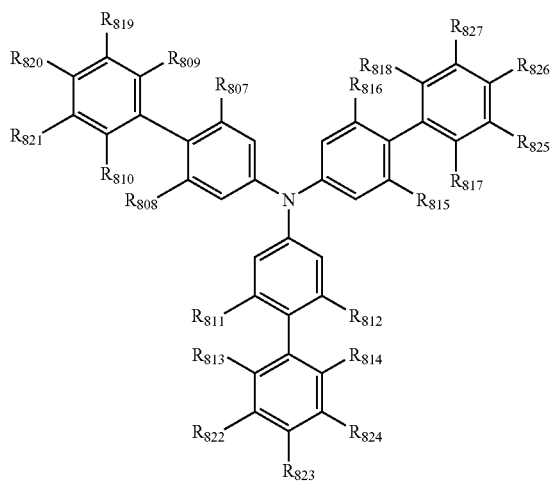

wherein $Ar_{801}$ through $Ar_{803}$ independently represent a substituted or unsubstituted aryl group or a substituted or unsubstituted heteroaryl group; and $R_{801}$ through $R_{827}$ independently represent a hydrogen atom or a substituent, provided that at least one of $R_{801}$ and $R_{802}$ is a substituent, at least one of $R_{803}$ and $R_{804}$ is a substituent, at least one of $R_{805}$ and $R_{806}$ is a substituent, at least one of $R_{807}$ through $R_{810}$ is a substituent, at least one of $R_{811}$ through $R_{814}$ is a substituent, and at least one of $R_{815}$ through $R_{818}$ is a substituent.

22. The organic electroluminescent element of claim 21, wherein the triarylamine compound is a compound represented by the following formula 5, Formula 5

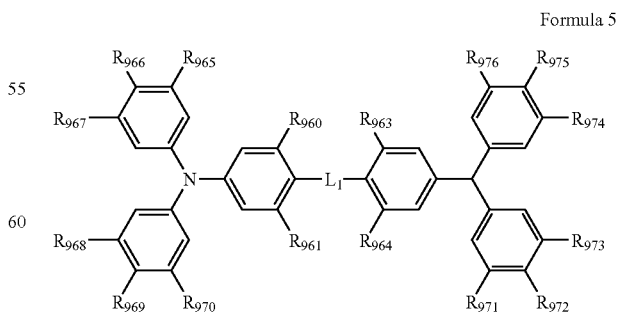

wherein $R_{960}$ through $R_{976}$ independently represent a hydrogen atom or a substituent, provided that at least one of $R_{960}$ and $R_{961}$ is a substituent, and at least one of $R_{963}$ and $R_{964}$ is a substituent; and $L_1$ represents a chemical bond or a divalent linkage group.

23. The organic electroluminescent element of claim 21, wherein the triarylamine compound is a compound represented by the following formula 6,

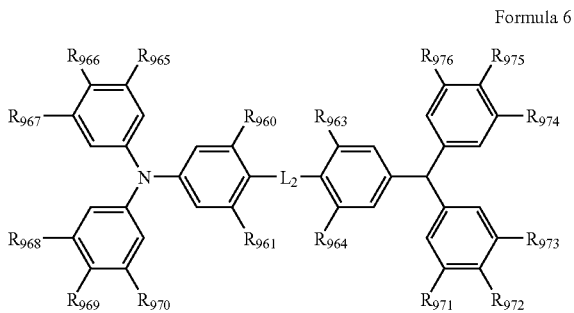

Formula 6 wherein $R_{960}$ through $R_{976}$ independently represent a hydrogen atom or a substituent; and $L_2$ represents an alkylene group, a cycloalkylene group or a fluoroalkylene group.

24. The organic electroluminescent element of claim 21, wherein the triarylamine compound is a compound having a terminal group represented by the following formula 10-1, 10-2, 10-3 or 10-4,

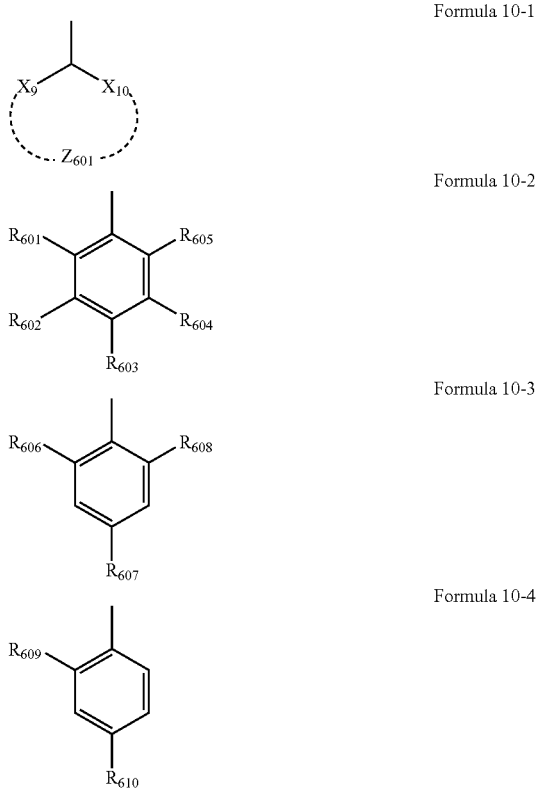

Formula 10-1

Formula 10-2

Formula 10-3

Formula 10-4 wherein $X_9$ and $X_{10}$ independently represent N, O, S or $CR_{611}$ in which $R_{611}$ represents a hydrogen atom or a substituent, provided that at least one of $X_9$ and $X_{10}$ represents $CR_{611}$ in which $R_{611}$ represents a substituent; $Z_{601}$ represents an atomic group necessary to form an aromatic hydrocarbon ring or an aromatic heterocyclic ring; $R_{601}$ through $R_{605}$ independently represent a hydrogen atom or a substituent, provided that at least one of $R_{601}$ and $R_{605}$ is a substituent; and $R_{606}$ through $R_{610}$ independently represent a substituent.

25. The organic electroluminescent element of claim 21, wherein the hole transporting material has a molecular weight of not less than 550.

26. The organic electroluminescent element of claim 21, wherein the hole transporting material has an ionization potential Ip1 of from 5.00 to 5.70 eV.

27. The organic electroluminescent element of claim 21, wherein $$-0.1\ (eV) \leq Ip3-Ip1 \leq 0.5\ (eV)$$

where Ip1 (eV) represents the ionization potential of the hole transporting material, and Ip3 (eV) represents the ionization potential of the phosphorescent compound.

28. The organic electroluminescent element of claim 21, wherein $$0.5\ (eV) < T3-Ea1 < 1.3\ (eV)$$

where T3 (eV) represents the excited triplet energy level of the phosphorescent compound and Ea1 (eV) represents the electron affinity of the hole transporting material.

29. The organic electroluminescent element of claim 21, wherein the phosphorescent compound has a phosphorescence maximum in the wavelength regions of from 380 to 480 nm.

30. The organic electroluminescent element of claim 21, further comprising a second hole transporting layer containing a second hole transporting material, the second hole transporting layer being provided on the surface of the hole transporting layer opposite the light emission layer, wherein $$0.1\ (eV) < Ip1-Ip4 < 0.7\ (eV)$$

where Ip1 (eV) represents the ionization potential of the hole transporting material, and Ip4 (eV) represents the ionization potential of the second hole transporting material.

31. The organic electroluminescent element of claim 30, wherein the thickness of the hole transporting layer adjacent to the light emission layer is from 5 to 20 nm.

32. The organic electroluminescent element of claim 21, wherein the light emission layer further contains a host compound.

33. The organic electroluminescent element of claim 21, wherein $$0.3\ (eV) < Ip2-Ip1 < 1.0\ (eV)$$

where Ip1 (eV) represents the ionization potential of the hole transporting material and Ip2 (eV) represents the ionization potential of the host compound.

34. The organic electroluminescent element of claim 21, wherein $$0.1\ (eV) < Ea2-Ea1 < 0.8\ (eV)$$

where Ea1 (eV) represents the electron affinity of the hole transporting material and Ea2 (eV) represents the electron affinity of the host compound.

35. The organic electroluminescent element of claim 21, wherein the host compound has a 0-0 band of the phosphorescence spectra of from 300 to 450 nm.

36. The organic electroluminescent element of claim 21, wherein the host compound is a carbazole derivative.

37. The organic electroluminescent element of claim 36, wherein the carbazole derivative is a compound represented by the following formula 11, Formula 11

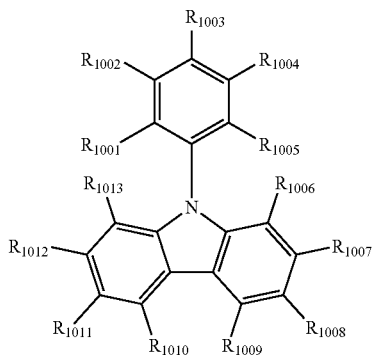

wherein $R_{1001}$ through $R_{1013}$ independently represent a hydrogen atom or a substituent, provided that at least one of $R_{1001}$ through $R_{1013}$ is a substituent.

38. The organic electroluminescent element of claim 36, wherein the carbazole derivative is a compound represented by the following formula 12, Formula 12

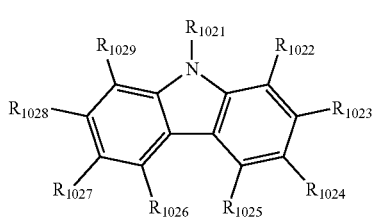

wherein $R_{1021}$ represents an alkyl group, a cycloalkyl group or a fluoroalkyl group; and $R_{1022}$ through $R_{1029}$ independently represent a hydrogen atom or a substituent, provided that at least one of $R_{1022}$ through $R_{1029}$ is a substituent.

39. The organic electroluminescent element of claim 36, wherein the carbazole derivative is a compound represented by the following formula 13, Formula 13

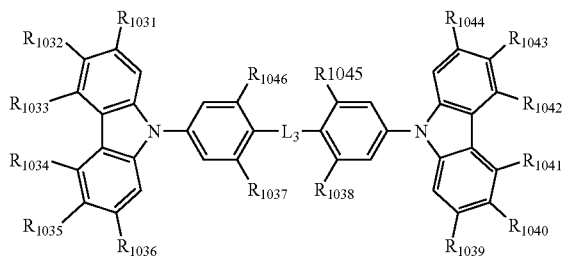

wherein $R_{1031}$ through $R_{1046}$ independently represent a hydrogen atom or a substituent; and $L_3$ represents a chemical bond or a divalent linkage group, provided that when $L_3$ represents a chemical bond, at least one of $R_{1037}, R_{1038}, R_{1045}$, and $R_{1046}$ is a substituent.

40. The organic electroluminescent element of claim 36, wherein the carbazole derivative is a compound represented by the following formula 14, Formula 14

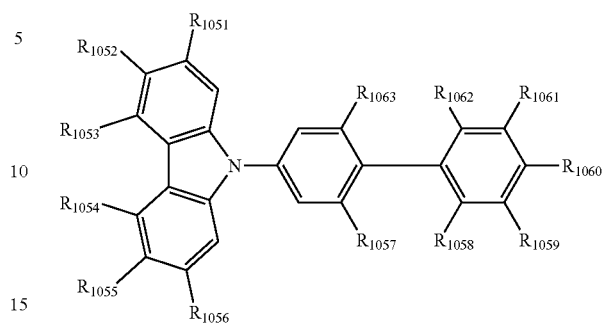

wherein $R_{1051}$ through $R_{1063}$ independently represent a hydrogen atom or a substituent, provided that at least one of $R_{1057}, R_{1058}, R_{1062}$, and $R_{1063}$ is a substituent.

41. The organic electroluminescent element of claim 36, wherein the carbazole derivative is a compound represented by the following formula 15, Formula 15

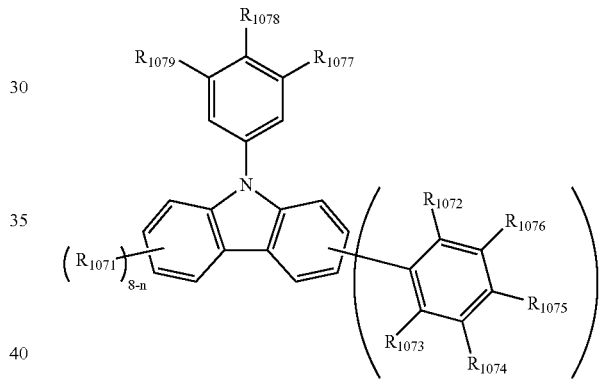

wherein $R_{1071}$ through $R_{1079}$ independently represent a hydrogen atom or a substituent, provided that at least one of $R_{1072}$ and $R_{1073}$ is a substituent; and n is an integer of from 1 to 8.

42. The organic electroluminescent element of claim 1, wherein the hole transporting layer is formed according to a vacuum deposition process.

43. The organic electroluminescent element of claim 1, wherein the hole transporting layer is formed according to a wet process.

44. A display comprising the organic electroluminescent element of claim 1.

45. An illuminator comprising the organic electroluminescent element of claim 1.

46. A display comprising the illuminator of claim 45, and a liquid crystal element as a displaying means.

47. The organic electroluminescent element of claim 1, wherein in Formula 4-1 or 4-2, the substituent of $R_{801}$ through $R_{827}$ represents an alkyl group, a cycloalkyl group, an alkenyl group, an alkinyl group, a substituted or unsubstituted aryl group, a substituted or unsubstituted heteroaryl group, a substituted or unsubstituted saturated heterocyclic group, an alkoxy group, a cycloalkoxy group, an aryloxy group, an alkylthio group, a cycloalkylthio group, an arylthio group, an alkoxycarbonyl group, an aryloxycarbonyl group, a sulfamoyl group, an acyl group, an acyloxy group, an amido group, a carbamoyl group, a ureido group, a sulfonyl group, an alkylsulfonyl group or an arylsulfonyl group, an amino group, a halogen atom, a fluorinated hydrocarbon group, a cyano group, a nitro group, a hydroxyl group, a mercapto group, or a silyl group.

48. The organic electroluminescent element of claim 13, wherein the substituent represented by $R_{1001}$ through $R_{1013}$ of formula 11 independently represents an alkyl group, a cycloalkyl group, an alkenyl group, an alkinyl group, a substituted or unsubstituted aryl group, a substituted or unsubstituted heteroaryl group, a substituted or unsubstituted saturated heterocyclic group, an alkoxy group, a cycloalkoxy group, an aryloxy group, an alkylthio group, a cycloalkylthio group, an arylthio group, an alkoxycarbonyl group, an aryloxycarbonyl group, a sulfamoyl group, an acyl group, an acyloxy group, an amido group, a carbamoyl group, a ureido group, a sulfonyl group, an alkylsulfonyl group or an arylsulfonyl group, a halogen atom, a fluorinated hydrocarbon group, a cyano group, a nitro group, a hydroxyl group, a mercapto group, or a silyl group.

\* \* \* \* \*